(12) United States Patent
Takahashi et al.

(10) Patent No.: US 11,128,791 B2
(45) Date of Patent: Sep. 21, 2021

(54) PHOTOELECTRIC CONVERSION ELEMENT

(71) Applicant: CANON KABUSHIKI KAISHA, Tokyo (JP)

(72) Inventors: Tetsuo Takahashi, Kawasaki (JP); Satoru Shiobara, Hiratsuka (JP); Jun Kamatani, Tokyo (JP); Naoki Yamada, Inagi (JP); Tomona Yamaguchi, Tokyo (JP); Hiroki Ohrui, Kawasaki (JP); Hironobu Iwawaki, Yokohama (JP); Masumi Itabashi, Yamato (JP); Yosuke Nishide, Kawasaki (JP); Hirokazu Miyashita, Ebina (JP); Norifumi Kajimoto, Zama (JP); Moe Takahira, Kyotanabe (JP); Isao Kawata, Kawasaki (JP); Yuto Ito, Koganei (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 137 days.

(21) Appl. No.: 16/523,115

(22) Filed: Jul. 26, 2019

(65) Prior Publication Data

US 2019/0364191 A1 Nov. 28, 2019

Related U.S. Application Data

(63) Continuation of application No. PCT/JP2018/003691, filed on Feb. 2, 2018.

(30) Foreign Application Priority Data

Feb. 7, 2017 (JP) .............................. JP2017-020239
Nov. 17, 2017 (JP) .............................. JP2017-221684
Dec. 27, 2017 (JP) .............................. JP2017-250929

(51) Int. Cl.
*H01L 27/30* (2006.01)
*H04N 5/232* (2006.01)
(Continued)

(52) U.S. Cl.
CPC ....... *H04N 5/23203* (2013.01); *H01L 27/307* (2013.01); *H01L 51/006* (2013.01);
(Continued)

(58) Field of Classification Search
None
See application file for complete search history.

(56) References Cited

U.S. PATENT DOCUMENTS 6,733,905 B2 5/2004 Takiguchi et al.
6,780,528 B2 8/2004 Tsuboyama et al.
(Continued)

FOREIGN PATENT DOCUMENTS

EP 3 306 689 A1 4/2018
JP 2005-32793 A 2/2005
(Continued)

OTHER PUBLICATIONS

Xin Xiao et al., "Small-Molecule Photovoltaics Based on Functionalized Squaraine Donor Blends," 24 Adv. Mater. 1956-1960 (Mar. 2012).
(Continued)

*Primary Examiner* — Dung A. Le
(74) *Attorney, Agent, or Firm* — Venable LLP

(57) ABSTRACT

Provided is a photoelectric conversion element including an anode, a photoelectric conversion layer that contains a first organic semiconductor, a second organic semiconductor, and a third organic semiconductor, and a cathode. As each of the first organic semiconductor, the second organic semiconductor, and the third organic semiconductor, a low-molecular weight organic semiconductor is used. The first organic semiconductor, the second organic semiconductor, and the third organic semiconductor have mass ratios that satisfy the following relationship: the first organic semiconductor≥the second organic semiconductor≥the third organic
(Continued)

semiconductor. Further, when a total amount of the first organic semiconductor, the second organic semiconductor, and the third organic semiconductor is 100 mass %, a content of the second organic semiconductor is 6 mass % or more, and a content of the third organic semiconductor is 3 mass % or more.

15 Claims, 12 Drawing Sheets

(51) Int. Cl.
  H01L 51/00 (2006.01)
  H01L 51/42 (2006.01)
  H04N 5/225 (2006.01)
  H04N 5/38 (2006.01)
(52) U.S. Cl.
  CPC ...... *H01L 51/0046* (2013.01); *H01L 51/0061* (2013.01); *H01L 51/424* (2013.01); *H04N 5/2254* (2013.01); *H04N 5/38* (2013.01); *H01L 51/0074* (2013.01)

(56) References Cited

U.S. PATENT DOCUMENTS

| | | | |
|---|---|---|---|
| 6,783,873 B2 | 8/2004 | Tsuboyama et al. | |
| 6,797,980 B2 | 9/2004 | Takiguchi et al. | |
| 6,815,091 B2 | 11/2004 | Takiguchi et al. | |
| 6,821,646 B2 | 11/2004 | Tsuboyama et al. | |
| 6,835,471 B2 | 12/2004 | Tsuboyama et al. | |
| 6,953,628 B2 | 10/2005 | Kamatani et al. | |
| 6,991,857 B2 | 1/2006 | Tsuboyama et al. | |
| 7,026,062 B2 | 4/2006 | Takiguchi et al. | |
| 7,094,477 B2 | 8/2006 | Kamatani et al. | |
| 7,147,935 B2 | 12/2006 | Kamatani et al. | |
| 7,180,110 B2 | 2/2007 | Komatsu et al. | |
| 7,205,054 B2 | 4/2007 | Tsuboyama et al. | |
| 7,220,495 B2 | 5/2007 | Tsuboyama et al. | |
| 7,527,879 B2 | 5/2009 | Kamatani et al. | |
| 7,534,506 B2 | 5/2009 | Takiguchi et al. | |
| 7,544,426 B2 | 6/2009 | Kamatani et al. | |
| 7,687,155 B2 | 3/2010 | Kamatani et al. | |
| 8,822,808 B2 | 9/2014 | Hamano | |
| 8,920,943 B2 | 12/2014 | Kamatani et al. | |
| 9,882,144 B2 | 1/2018 | Kawamura et al. | |
| 10,186,665 B2 | 1/2019 | Kawamura et al. | |
| 2002/0064683 A1 | 5/2002 | Okada et al. | |
| 2006/0228583 A1 | 10/2006 | Kamatani et al. | |
| 2012/0204960 A1 | 8/2012 | Kato et al. | |
| 2013/0015547 A1 | 1/2013 | Hamano | |
| 2015/0076478 A1 | 3/2015 | Kamatani et al. | |
| 2015/0270501 A1 | 9/2015 | Thompson et al. | |
| 2018/0151624 A1 | 5/2018 | Hasegawa et al. | |
| 2018/0211792 A1* | 7/2018 | Mori | H01G 9/2031 |
| 2018/0342559 A1 | 11/2018 | Kamatani et al. | |
| 2019/0043926 A1 | 2/2019 | Yamada et al. | |
| 2019/0067590 A1 | 2/2019 | Nishide et al. | |
| 2019/0088885 A1 | 3/2019 | Yamada et al. | |
| 2019/0109285 A1 | 4/2019 | Kawamura et al. | |
| 2019/0119258 A1 | 4/2019 | Nishide et al. | |
| 2019/0148644 A1 | 5/2019 | Yamada et al. | |
| 2020/0119281 A1* | 4/2020 | Miyashita | H04N 5/378 |
| 2021/0114988 A1* | 4/2021 | Kobayashi | C07D 221/18 |

FOREIGN PATENT DOCUMENTS

| | | |
|---|---|---|
| JP | 2011-119694 A | 6/2011 |
| JP | 2011-228630 A | 11/2011 |
| JP | 2015-92546 A | 5/2015 |
| JP | 2015-530761 A | 10/2015 |
| JP | 2017-143133 A | 8/2017 |
| WO | 2014/104315 A1 | 7/2014 |
| WO | 2015/045806 A1 | 4/2015 |
| WO | 2015/061771 A1 | 4/2015 |
| WO | 2016/194630 A1 | 12/2016 |
| WO | 2018/147202 A2 | 8/2018 |

OTHER PUBLICATIONS

International Search Report in International Application No. PCT/JP2018/003691 (dated May 2018).
James E. Mark (Ed.), Physical Properties of Polymers Handbook, vol. 1076, 2nd ed., pp. 290-299 (2007).
R.S. Ruoff et al., "Solubility of C60 in a Variety of Solvents," 97 J. Phys. Chem. 3379-3383 (1993).
Robert F. Fedors, "A Method for Estimating Both the Solubility Parameters and Molar Volumes of Liquids," 14(2)Eng. Sci. 147-154 (Feb. 1974).
Chang-Gua Zhen et al., "Achieving Highly Efficient Fluorescent Blue Organic Light-Emitting Diodes Through Optimizing Molecular Structures and Device Configuration," 21 Adv. Funct. Mater. 699-707 (Jan. 2011).
Alan F.M. Barton, "Solubility parameters" 75(6) Chem. Rev. 731-753 (1975).
Extended European Search Report in European Application No. 18751875.8 (dated Oct. 2020).
International Preliminary Report on Patentability in International Application No. PCT/JP2018/003691 (dated Aug. 13, 2019).

* cited by examiner

PHOTOELECTRIC CONVERSION ELEMENT

CROSS-REFERENCE TO RELATED APPLICATIONS

This application is a Continuation of International Patent Application No. PCT/JP2018/003691, filed Feb. 2, 2018, which claims the benefit of Japanese Patent Application No. 2017-020239, filed Feb. 7, 2017, Japanese Patent Application No. 2017-221684, filed Nov. 17, 2017, and Japanese Patent Application No. 2017-250929, filed Dec. 27, 2017, all of which are hereby incorporated by reference herein in their entirety.

BACKGROUND OF THE INVENTION

Field of the Invention

The present invention relates to a photoelectric conversion element including a photoelectric conversion layer made of organic semiconductors.

Description of the Related Art

In recent years, a solid-state image pickup element, which has a structure including a photoelectric conversion layer made of organic compounds and formed on a signal reading substrate, has been developed.

As a general structure of the organic photoelectric conversion layer, there is given a bulk hetero-structure that is formed by mixing two organic compounds, that is, a p-type organic semiconductor and an n-type organic semiconductor. A photoelectric conversion element, which exhibits higher performance through addition of a third organic semiconductor to the above-mentioned two organic compounds, has been developed.

In Japanese Patent Application Laid-Open No. 2015-92546, as a photoelectric conversion layer excellent in heat resistance in which an increase in dark current in association with an increase in temperature is suppressed, there is a disclosure of a structure containing a small amount of a low-molecular weight organic compound in addition to the bulk hetero-structure of the p-type organic semiconductor and the n-type organic semiconductor. In addition, in Japanese Patent Application Laid-Open No. 2005-32793, there is a disclosure of a photoelectric conversion layer in which absorption efficiency of incident light is improved by forming a structure containing two or more kinds of electron-donating high-molecular weight organic materials in addition to an electron-accepting material.

In each of Japanese Patent Application Laid-Open No. 2015-92546 and Japanese Patent Application Laid-Open No. 2005-32793, there is a disclosure of the photoelectric conversion layer made of organic compounds in which, through addition of a third compound in addition to the p-type organic semiconductor and the n-type organic semiconductor, an increase in dark current in association with an increase in temperature is suppressed, or absorption efficiency of incident light is improved. However, there is no disclosure of a configuration in which a dark current at normal temperature of the photoelectric conversion element is reduced.

In view of the foregoing, the present invention has an object to provide a photoelectric conversion element including a photoelectric conversion layer having a bulk hetero-structure of a p-type organic semiconductor and an n-type organic semiconductor, in which a dark current is reduced, and provide an optical area sensor, an image pickup element, and an image pickup apparatus, which have low noise, through use of the photoelectric conversion element.

SUMMARY OF THE INVENTION

According to one embodiment of the present invention, there is provided a photoelectric conversion element including in this order: an anode; a photoelectric conversion layer; and a cathode, the photoelectric conversion layer containing a first organic semiconductor, a second organic semiconductor, and a third organic semiconductor, wherein the first organic semiconductor, the second organic semiconductor, and the third organic semiconductor each include a low-molecular weight organic semiconductor, wherein one of the first organic semiconductor and the second organic semiconductor is a p-type semiconductor, and another is an n-type semiconductor, wherein the first organic semiconductor, the second organic semiconductor, and the third organic semiconductor have mass ratios that satisfy the following relationship: the first organic semiconductor≥the second organic semiconductor≥the third organic semiconductor, and wherein, when a total amount of the first organic semiconductor, the second organic semiconductor, and the third organic semiconductor is 100 mass %, a content of the second organic semiconductor is 6 mass % or more, and a content of the third organic semiconductor is 3 mass % or more.

Further features of the present invention will become apparent from the following description of exemplary embodiments with reference to the attached drawings.

DESCRIPTION OF THE EMBODIMENTS

Figure 1:
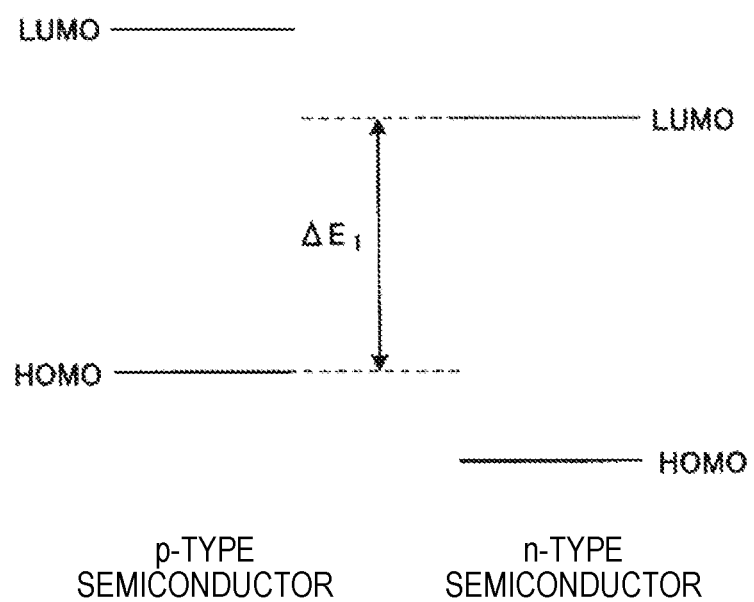
FIG. 1 is a schematic diagram for illustrating a generation mechanism of a dark current in a photoelectric conversion layer.

Embodiments of the present invention are described in detail with reference to the drawings as appropriate. However, the present invention is not limited to the embodiments described below. Well-known or known technologies in the technical field of the present invention can be applied to parts that have no particular description in the following description and parts that have no particular illustration in the drawings.

A photoelectric conversion element of the present invention is a photoelectric conversion element which includes a photoelectric conversion layer made of organic compounds between an anode and a cathode and in which a dark current is reduced. The photoelectric conversion layer in the present invention contains a p-type organic semiconductor and an n-type organic semiconductor, and further contains a third organic semiconductor. With this, the photoelectric conversion layer in the present invention has a feature of reducing a dark current. In the present invention, the p-type organic semiconductor, the n-type organic semiconductor, and the third organic semiconductor forming the photoelectric conversion layer are each a low-molecular weight organic semiconductor.

(Photoelectric Conversion Layer)

First, the photoelectric conversion layer that is a feature of the present invention is described.

The photoelectric conversion layer is configured to absorb light to generate charge in accordance with the amount of the light. The photoelectric conversion layer according to the present invention contains at least a first organic semiconductor, a second organic semiconductor, and a third organic semiconductor, and those organic semiconductors are each a low-molecular weight organic semiconductor. In addition, one of the first organic semiconductor and the second organic semiconductor is a p-type organic semiconductor (hereinafter referred to as "p-type semiconductor"), and the other is an n-type organic semiconductor (hereinafter referred to as "n-type semiconductor"). Specifically, of the first organic semiconductor and the second organic semiconductor, the organic semiconductor having the smaller oxidation potential is the p-type semiconductor, and the organic semiconductor having the larger oxidation potential is the n-type semiconductor. When the p-type semiconductor and the n-type semiconductor are mixed into the photoelectric conversion layer, the photoelectric conversion efficiency (sensitivity) can be improved.

In the present invention, the first organic semiconductor, the second organic semiconductor, and the third organic semiconductor have mass ratios that satisfy the following relationship: the first organic semiconductor≥the second organic semiconductor≥the third organic semiconductor.

When the contents (mass %) of the first organic semiconductor, the second organic semiconductor, and the third organic semiconductor are equal to each other in the photoelectric conversion layer, the organic semiconductors are defined as first, second, and third organic semiconductors in decreasing order of molecular weight. Specifically, when the three kinds of organic semiconductors are equally contained, the organic semiconductor having the largest molecular weight among the three kinds of organic semiconductors is the first organic semiconductor, and the organic semiconductor having the smallest molecular weight among the three kinds of organic semiconductors is the third organic semiconductor. In addition, when, among the three kinds of organic semiconductors, the contents of two kinds are equal to each other, and the content of the remaining one kind is larger than those of the previous two kinds, the organic semiconductor having the larger molecular weight of the two kinds of organic semiconductors is the second organic semiconductor, and the organic semiconductor having the smaller molecular weight of the two kinds of organic semiconductors is the third organic semiconductor. In addition, when, among the three kinds of organic semiconductors, the contents of two kinds are equal to each other, and the content of the remaining one kind is smaller than those of the previous two kinds, the organic semiconductor having the larger molecular weight of the two kinds of organic semiconductors is the first organic semiconductor, and the organic semiconductor having the smaller molecular weight of the two kinds of organic semiconductors is the second organic semiconductor.

In addition, it is only required that the photoelectric conversion layer according to the present invention contain at least the first organic semiconductor, the second organic semiconductor, and the third organic semiconductor. However, the photoelectric conversion layer may contain a material other than the above-mentioned organic semiconductors, that is, another material within such a range as not to impair the photoelectric conversion function and the dark current reduction effect that is the effect of the present invention. It is appropriate that the mass ratio of the other material be equal to or smaller than the content of the third organic semiconductor. The other material may be an organic semiconductor different from the first to third organic semiconductors. In this case, the mass ratio of the other material that is the organic semiconductor is equal to or smaller than the content of the third organic semiconductor. When the other material is the organic semiconductor, and the content thereof is equal to that of the third organic semiconductor, the organic semiconductor having the larger molecular weight is defined as the third organic semiconductor.

The third organic semiconductor of the present invention is added in order to suppress a dark current generated at a time when the photoelectric conversion layer is made only of the first organic semiconductor and the second organic semiconductor. When the second organic semiconductor is a p-type semiconductor, it is preferred that the third organic semiconductor be also a p-type semiconductor. Similarly, when the second organic semiconductor is an n-type semiconductor, it is preferred that the third organic semiconductor be also an n-type semiconductor. It can be estimated whether the third organic semiconductor is a p-type semiconductor or an n-type semiconductor based on the oxidation potential thereof. When the oxidation potential of the third organic semiconductor is close to that of a compound that is a p-type semiconductor out of the first organic semiconductor and the second organic semiconductor, the third organic semiconductor is a p-type semiconductor. Similarly, when the oxidation potential of the third organic semiconductor is close to that of a compound that is an n-type semiconductor out of the first organic semiconductor and the second organic semiconductor, the third organic semiconductor is an n-type semiconductor. With this, the photoelectric conversion function (electron donor function when the second organic semiconductor is a p-type semiconductor or an electron acceptor function when the second organic semiconductor is an n-type semiconductor) of the second organic semiconductor contained in the photoelectric conversion layer at a content smaller than that of the first organic semiconductor may be compensated by the third organic semiconductor.

It is preferred that a wavelength at which an absorptance in a visible light region (wavelength: 400 nm to 730 nm) of a thin film of the third organic semiconductor becomes maximum be a wavelength between two wavelengths at which absorptances in the visible light region of the first organic semiconductor and the second organic semiconductor become maximum. With this, the absorption in a wavelength region between absorption bands of the first organic semiconductor and the second organic semiconductor can be efficiently compensated by the third organic semiconductor.

In addition, when a total amount of the first organic semiconductor, the second organic semiconductor, and the third organic semiconductor is 100 mass %, the content of the second organic semiconductor is 6 mass % or more, and the content of the third organic semiconductor is 3 mass % or more. The inventors of the present invention have found that, when the composition of the organic semiconductors in the photoelectric conversion layer satisfies the above-mentioned relationship, a photoelectric conversion element that exhibits satisfactory photoelectric conversion characteristics can be manufactured. The details thereof are described below.

A related-art photoelectric conversion layer has a bulk hetero-structure in which a p-type semiconductor and an n-type semiconductor are mixed. Specifically, the photoelectric conversion layer has a binary configuration in which two kinds of organic semiconductors, that is, the first organic semiconductor and the second organic semiconductor are used together. The mass ratio of the first organic semiconductor in the photoelectric conversion layer is larger than that of the second organic semiconductor. In such photoelectric conversion layer, the first organic semiconductor and the second organic semiconductor compensate for absorption wavelength regions with each other, thereby being capable of obtaining panchromatic absorption. In such configuration, when the mass ratio of the second organic semiconductor in the photoelectric conversion layer is larger, sufficient panchromatic absorption can be realized.

However, the inventors of the present invention have found that, as the mass ratio of the second organic semiconductor is increased, a dark current at a time of application of a voltage to the photoelectric conversion element is increased. The reason for this is described below with reference to the drawings.

FIG. 1 is a schematic diagram for illustrating a basic generation mechanism of a dark current in the photoelectric conversion layer. There is illustrated a relationship between a highest occupied molecular orbital (HOMO) level and a lowest unoccupied molecular orbital (LUMO) level in single molecules of a p-type semiconductor and an n-type semiconductor. It is considered that a dark current is generated when electrons present at the HOMO level of the p-type semiconductor are transferred to the LUMO level of the n-type semiconductor due to thermal energy. An energy barrier of electron transfer in this case is $\Delta E_1$.

However, in a mixed film of the first organic semiconductor and the second organic semiconductor, for example, each of the first organic semiconductor and the second organic semiconductor forms a dimer, and thus the same compounds are associated with each other. As a result, each state density of the HOMO level and the LUMO level forms an energy spread.

Figure 2:
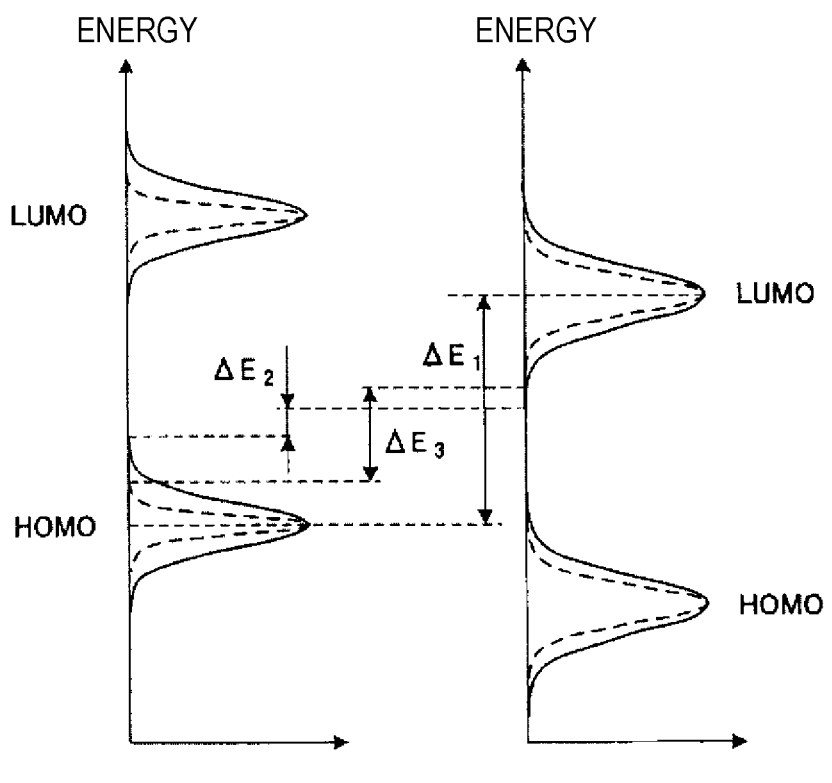
FIG. 2 is a schematic diagram for illustrating an effect of a third organic semiconductor according to the present invention.

FIG. 2 is a schematic diagram for illustrating an effect of the third organic semiconductor in the photoelectric conversion element of the present invention. The solid line of FIG. 2 schematically represents an energy distribution of each state density of the HOMO level and the LUMO level in a mixed film having a binary configuration of the first organic semiconductor and the second organic semiconductor. Meanwhile, the broken line schematically represents an energy distribution of each state density in a mixed film having a ternary configuration of the first organic semiconductor, the second organic semiconductor, and the third organic semiconductor. The broken line is described later. In FIG. 2, the first organic semiconductor is an n-type semiconductor, and the second organic semiconductor is a p-type semiconductor.

An energy barrier $\Delta E_2$ of electron transfer in consideration of the energy spread of the state density of the binary configuration is smaller than $\Delta E_1$ at a time of consideration based on the energy level of single molecules. As the energy barrier $\Delta E_2$ of electron transfer is smaller, a dark current is larger. Specifically, as the energy spread of the state density is enlarged, $\Delta E_2$ becomes smaller, and a dark current is liable to be generated. Thus, the following is considered. As the mass ratio of the second organic semiconductor in the photoelectric conversion layer is increased, the compounds in the second organic semiconductor are liable to be associated with each other, and the energy spread of each state density of the HOMO level and the LUMO level is also liable to be enlarged. Therefore, as the mass ratio of the second organic semiconductor is increased, a dark current is increased.

It has been known that the phenomenon, in which the energy spread of each state density of the HOMO level and the LUMO level is formed through association of the compounds in the second organic semiconductor, occurs in the case where the mass ratio of the second organic semiconductor is 6 mass % or more when the total amount of the first and second organic semiconductors is 100 mass %. In CHANG-Gua Zhen, et al., "Achieving Highly Efficient Fluorescent Blue Organic Light-Emitting Diodes Through Optimizing Molecular Structures and Device Configuration", Advanced Functional Materials, 2011, Volume 21, 4, p. 699-707, there is a description that, when an organic compound having a low concentration is 6 mass % or more in a mixed film of two kinds of organic compounds, molecules are associated with each other. Specifically, there is a description that, in the mass ratio of 6 mass % or more, the tendency, in which light emitted from the organic compound is increased in wavelength, and concentration quenching occurs, starts being recognized. As the reason for an increase in wavelength of the emitted light, the following is considered. The energy spread of each state density of the HOMO level and the LUMO level is enlarged, and an effective bandgap is reduced.

Regarding countermeasures against an increase in dark current in association with an increase in mass ratio of the second organic semiconductor, the inventors of the present invention have made extensive investigations, and as a result, have found the following. Specifically, the inventors of the present invention have found that, even when the mass ratio of the second organic semiconductor is 6 mass % or more, a dark current can be reduced by mixing the third organic semiconductor so as to have a mass ratio of 3 mass % or more as compared to a case in which only the first organic semiconductor and the second organic semiconductor are mixed. In the present invention, the mass ratio of the second organic semiconductor of 6 mass % or more and the mass ratio of the third organic semiconductor of 3 mass % or more each refer to a mass ratio at a time when a total amount of the first organic semiconductor, the second organic semiconductor, and the third organic semiconductor is 100 mass %.

Now, the mechanism of the dark current reduction effect obtained by mixing the third organic semiconductor, which has been discussed by the inventors of the present invention, is described with reference to FIG. 2.

The state density energy represented by the broken line of FIG. 2 schematically represents an energy distribution of each state density of the HOMO level and the LUMO level in the mixed film having the binary configuration of the first organic semiconductor and the second organic semiconductor of the photoelectric conversion element of the present invention containing the third organic semiconductor. In the state density energy represented by the broken line, the energy spread is suppressed as compared to the state density energy represented by the solid line. It is considered that the association of the compounds in the second organic semiconductor is suppressed by further containing the third organic semiconductor. As a result, the energy spread of the state density of each level can be suppressed. The interaction caused by association of organic compounds, formation of a dimer, stacking, or the like is liable to occur, in particular, between the same compounds. Therefore, the interaction is inhibited when a different compound is mixed. In addition, the effect of suppressing the energy spread of the state density by the third organic semiconductor is given also to the first organic semiconductor. However, in the second organic semiconductor having a mass ratio smaller than that of the first organic semiconductor, a state having high dispersibility is more easily realized without association of molecules through mixing of the third organic semiconductor. As a result, it is considered that the energy spread of the state density of each level is more easily suppressed in the second organic semiconductor.

In addition, in FIG. 2, there is illustrated, as an example, the case in which the first organic semiconductor is an n-type semiconductor, and the second organic semiconductor is a p-type semiconductor. However, it is considered that, even when the first organic semiconductor is a p-type semiconductor, and the second organic semiconductor is an n-type semiconductor, the effect of mixing the third organic semiconductor is similarly exhibited. The effect of adding the third organic semiconductor is obtained even when the mass ratio of the first organic semiconductor is equal to that of the second organic semiconductor.

In the present invention, when the total amount of the first, second, and third organic semiconductors is 100 mass %, in the case where the mass ratio of the third organic semiconductor is 3 mass % or more, preferably 6 mass % or more, particularly preferably 10 mass % or more, the effect of reducing a dark current is exhibited. In addition, it is preferred that a ratio of the mass ratio of the third organic semiconductor with respect to the mass ratio of the second organic semiconductor be 0.12 or more. This is because the association of the second organic semiconductors can be effectively suppressed by the third organic semiconductor. Such ratio is more preferably 0.24 or more, particularly preferably 0.4 or more.

In the photoelectric conversion element according to the present invention, when the total amount of the first, second, and third organic semiconductors is 100 mass %, it is more preferred that the mass ratio of the second organic semiconductor be 10 mass % or more. In International Publication No. WO2014/104315, there is a description that, when two compounds are mixed, concentration quenching of emitted light occurs significantly in the case where the mass ratio of the compound having the lower mixing concentration is 10 mass % or more. Specifically, when the mass ratio of the compound having the lower mixing concentration is 10 mass % or more, more significant association occurs. Thus, also in the present invention, when the total amount of the first, second, and third organic semiconductors is 100 mass %, it is considered that the second organic semiconductors are significantly associated with each other, and the effect of adding the third organic semiconductor becomes more significant, in the case where the mass ratio of the second organic semiconductor is 10 mass % or more. In addition, when the mass ratio of the second organic semiconductor is 10 mass % or more, the absorptance of light in an absorption band of the second organic semiconductor can be enhanced.

Specifically, as long as the mass ratio of the second organic semiconductor in the photoelectric conversion element of the present invention is 10 mass % or more, the absorptance of light can be enhanced while a dark current is suppressed.

Further, in the present invention, when the total amount of the first, second, and third organic semiconductors is 100 mass %, it is preferred that the mass ratio of the second organic semiconductor be 17 mass % or more. When the mass ratio of the second organic semiconductor is 17 mass % or more, the probability that the second organic semiconductors are brought into surface contact with each other is particularly increased. Therefore, the interaction caused by more significant stacking is liable to occur, and accordingly, the dark current reduction effect at a time of mixing the third organic semiconductor becomes significant. The reason for this is described with reference to FIG. 3.

Figure 3:
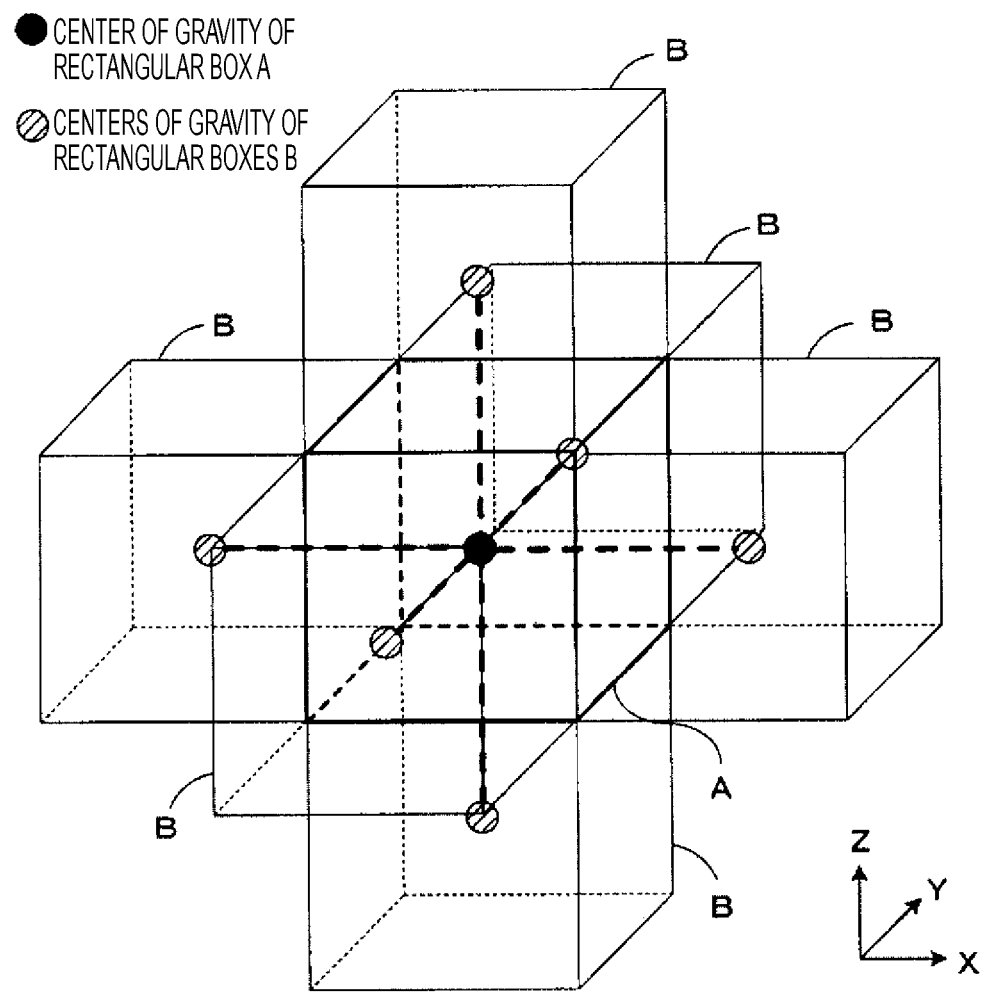
FIG. 3 is a schematic view of a mixed film of a first organic semiconductor and a second organic semiconductor approximated to rectangular boxes.

FIG. 3 is a schematic view of the mixed film having the binary configuration of the first organic semiconductor and the second organic semiconductor approximated to rectangular boxes.

The three-dimensional shape of a low-molecular weight organic compound can be approximated to a rectangular box in which one side has a length of a difference between a maximum value and a minimum value of each coordinate axis of X, Y, and Z when a position of each atom forming the organic compound is plotted onto three-dimensional coordinates. As illustrated in FIG. 3, when rectangular boxes having the same size are filled into a three-dimensional space, surfaces of six rectangular boxes B in total (two in an X-axis direction, two in a Y-axis direction, and two in a Z-axis direction) are adjacent to each surface of a certain rectangular box A. In FIG. 3, there are illustrated the six rectangular boxes B having surfaces adjacent to the rectangular box A and centers of gravity thereof in addition to the rectangular box A and a center of gravity thereof. In this case, it is assumed that the second organic semiconductor having the smaller mass ratio in the mixed film is the rectangular box A. When all the six rectangular boxes B are the first organic semiconductors, the second organic semiconductors are not brought into surface contact with each other. Meanwhile, when the rectangular box A is the second organic semiconductor, and at least one of the six rectangular boxes B is the second organic semiconductor, the second organic semiconductors are brought into surface contact with each other. Specifically, it is understood that, when the mass ratio of the second organic semiconductor is ⅙, that is, about 17 mass % or more in the mixed film of the first organic semiconductor and the second organic semiconductor, the second organic semiconductors are brought into surface contact with each other in the mixed film, and the interaction caused by strong stacking may occur.

When the low-molecular weight organic compounds are approximated to rectangular boxes, the following is considered. The interaction caused by significant stacking is liable to occur when the low-molecular weight organic compounds are brought into surface contact with each other. However, also when the low-molecular weight organic compounds are brought into side contact with each other, the interaction caused by stacking may occur although the degree thereof is small. Here, in addition to the six rectangular boxes that are brought into surface contact with the rectangular box A, there are 12 rectangular boxes that are brought into side contact with the rectangular box A. Thus, there are a total of 18 rectangular boxes that are brought into contact with the rectangular box A. Specifically, as the condition under which the second organic semiconductors are brought into surface or side contact with each other, the content of the second organic semiconductors in the mixed film is estimated to be ⅟₁₈, that is, about 6 mass % or more. Specifically, when the content of the second organic semiconductors is less than 6 mass %, the interaction between the second organic semiconductors is small, and hence the dark current reduction effect obtained by mixing the third organic semiconductor is unlikely to be exhibited.

As described above, the phenomenon in which the energy spread of each state density of the HOMO level and the LUMO level is formed through association of the second organic semiconductors occurs when the content of the second organic semiconductors is 6 mass % or more. The foregoing has been supported by the geometric discussion as well as the description in CHANG-Gua Zhen, et al., "Achieving Highly Efficient Fluorescent Blue Organic Light-Emitting Diodes Through Optimizing Molecular Structures and Device Configuration", Advanced Functional Materials, 2011, Volume 21, 4, p. 699-707.

From the foregoing, in the present invention, when the total amount of the first, second, and third organic semiconductors is 100 mass %, in the case where the content of the second organic semiconductor is 6 mass % or more, preferably 17 mass % or more, the dark current reduction effect obtained by mixing the third organic semiconductor has been supported by the geometric discussion.

As described above, in the present invention, the dark current reduction effect obtained by adding the third organic semiconductor to the mixed film of the first organic semiconductor and the second organic semiconductor is exhibited in the case where the content of the second organic semiconductor is 6 mass % or more when the total amount of the first, second, and third organic semiconductors is 100 mass %. In addition, although the dark current reduction effect is exhibited when the content of the third organic semiconductor is 3 mass % or more, such effect is obtained until the amount of the second organic semiconductor reaches the same amount as that of the first organic semiconductor. Further, the third organic semiconductor can be added until the amount thereof reaches the same amount as that of the second organic semiconductor. Thus, in the present invention, the first organic semiconductor, the second organic semiconductor, and the third organic semiconductor have mass ratios that satisfy the following relationship: the first organic semiconductor≥the second organic semiconductor≥the third organic semiconductor.

In the photoelectric conversion element according to the present invention, a dark current is reduced through introduction of 3 mass % or more of the third organic semiconductor. In order to further enhance this effect, it is preferred that the third organic semiconductor having a high effect be selected. The third organic semiconductor having a high effect can be selected through use of a solubility parameter.

A solubility parameter (hereinafter sometimes simply referred to as "SP value") can be determined based on a value obtained by an experiment or by calculation. Experimentally, a solubility parameter can be experimentally determined by investigating solubility in various solvents as in R. S. Ruoff, Doris S. Tse, Ripudaman Malhotra, and Donald C. Lorents, J. Phys. Chem. 1993, 97, p. 3379-3383. When an experimental value cannot be used, a method proposed by Fedors (R. F. Fedors, Eng. Sci., 1974, 14(2), p. 147-154) as a theoretic estimation method for an SP value can be used.

In the method proposed by Fedors, an SP value is determined as described below. First, a molecular structure is divided into atoms or atomic groups forming the molecular structure. A divided unit is hereinafter referred to as "division unit". An evaporation energy ($\Delta E_k$) (J/mol) and a molar volume ($\Delta V_k$) (cm$^3$/mol) are determined with respect to each division unit from a table described in R. F. Fedors, Eng. Sci., 1974, 14(2), p. 147-154.

A value defined by the following mathematical expression 1 through use of the above-mentioned values is referred to as "SP value". This procedure is called an atomic group contribution method. The SP value is a square root of aggregation energy density, and in the present invention, the unit thereof is defined as (J/cm$^3$)$^{1/2}$.

$$\text{Solubility parameter } (SP \text{ value}) = \left( \sum_k E_k \Big/ \sum_k V_k \right)^{1/2} \quad (1)$$

However, the above-mentioned calculation method cannot be used for a compound having an excluded volume in a molecular structure. As the compound having an excluded volume in a molecular structure, there is given a fullerene derivative, for example, C60. The reason for the above is that it is difficult to determine a molecular volume of the fullerene derivative having a spherical molecular structure due to the excluded volume in the molecular structure. Similarly, it is also difficult to calculate an SP value of a calixarene derivative, a cyclodextrin derivative, or the like due to the excluded volume in the molecular structure.

As an SP value of the fullerene derivative or the like, which cannot be calculated by the above-mentioned calculation method, an experimental value can be used. The experimental value of the SP value can be determined in accordance with R. S. Ruoff, Doris S. Tse, Ripudaman Malhotra, and Donald C. Lorents, J. Phys. Chem. 1993, 97, p. 3379-3383. For C60, an SP value (σT) of 20.0 obtained in R. S. Ruoff, Doris S. Tse, Ripudaman Malhotra, and Donald C. Lorents, J. Phys. Chem. 1993, 97, p. 3379-3383 can be used.

Calculation values and experimental values based on R. F. Fedors, Eng. Sci., 1974, 14(2), p. 147-154 are shown in Table 1. In Table 1, [4] represents a cited value from Mark, J. E. (Ed.). (2007). Physical Properties of Polymers Handbook (Vol. 1076). New York: Springer, and [5] represents a cited value from Barton, A. F. (1975). Solubility parameters. Chemical Reviews, 75(6), 731-753.

TABLE 1

| Compound name | Experimental value | Calculation value |
| --- | --- | --- |
| Toluene [4] | 18.2 | 18.7 |
| Thiophene [4] | 20.1 | 19.9 |
| Pyridine [4] | 21.9 | 19.7 |
| Aniline [4] | 21.1 | 22.2 |
| Caprylonitrile [4] | 19.2 | 19.7 |
| Diisobutyl ketone [5] | 16 | 17.4 |
| Cyclohexane [4] | 16.8 | 16.5 |
| N-Octane [4] | 15.6 | 15.4 |
| PTFE [4] | 12.7 | 13.6 |
| Benzyl alcohol [4] | 24.8 | 26.1 |
| Ethanol [4] | 26 | 25.7 |
| Methanol [4] | 29.7 | 28.1 |

Figure 4:
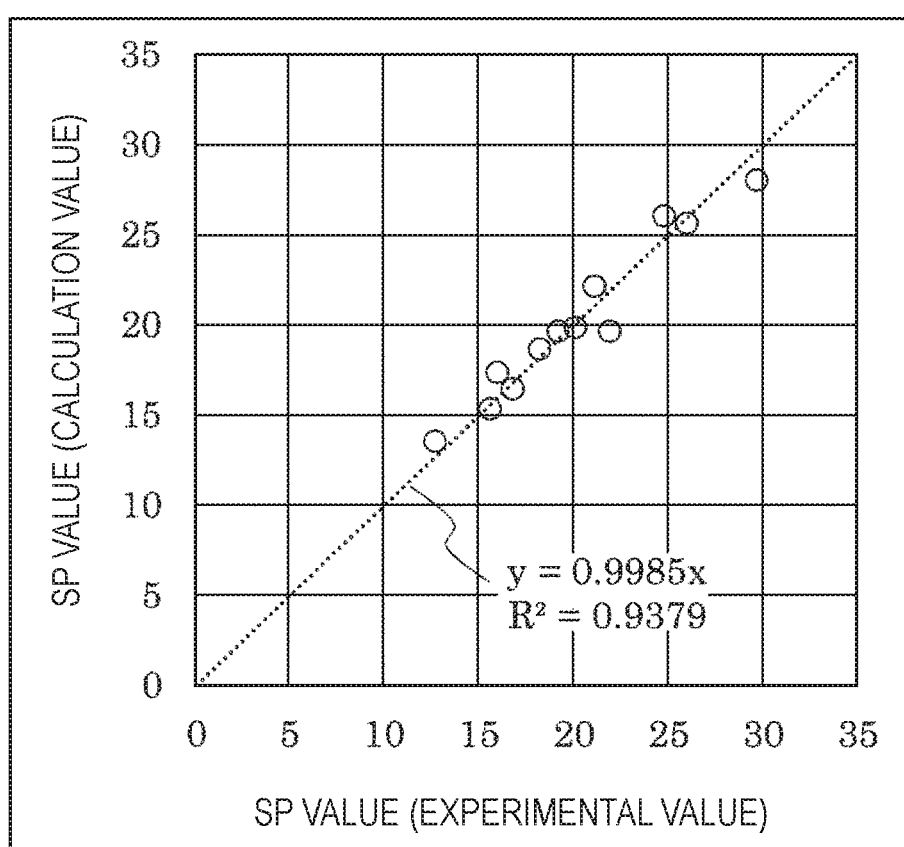
FIG. 4 is a graph for showing a correspondence relationship between experimental values and calculation values of SP values of the organic semiconductors.

FIG. 4 is a graph for showing a relationship between the experimental values and the calculation values in Table 1. The calculation values and the experimental values exhibit linearity, and there is no large discrepancy therebetween. Specifically, the SP value of the mathematical expression 1 described in this description may be utilized in the same manner as in an experimental value.

In Table 1, there are cases in which the order is reversed in the experimental value and the calculation value as in pyridine and aniline. However, as a whole, in FIG. 4 in which the experimental values and calculation values are plotted, the calculation values and the experimental values are close to each other, and there is no large change in the order relationship.

In this description, the SP value of the first organic semiconductor is represented by SP1, the SP value of the second organic semiconductor is represented by SP2, and the SP value of the third organic semiconductor is represented by SP3.

It is preferred that those three SP values satisfy relationships of the following expressions (2) and (3).

$$|SP1-SP2|>|SP2-SP3| \quad (2)$$

$$|SP1-SP3|>|SP2-SP3| \quad (3)$$

Figure 5:
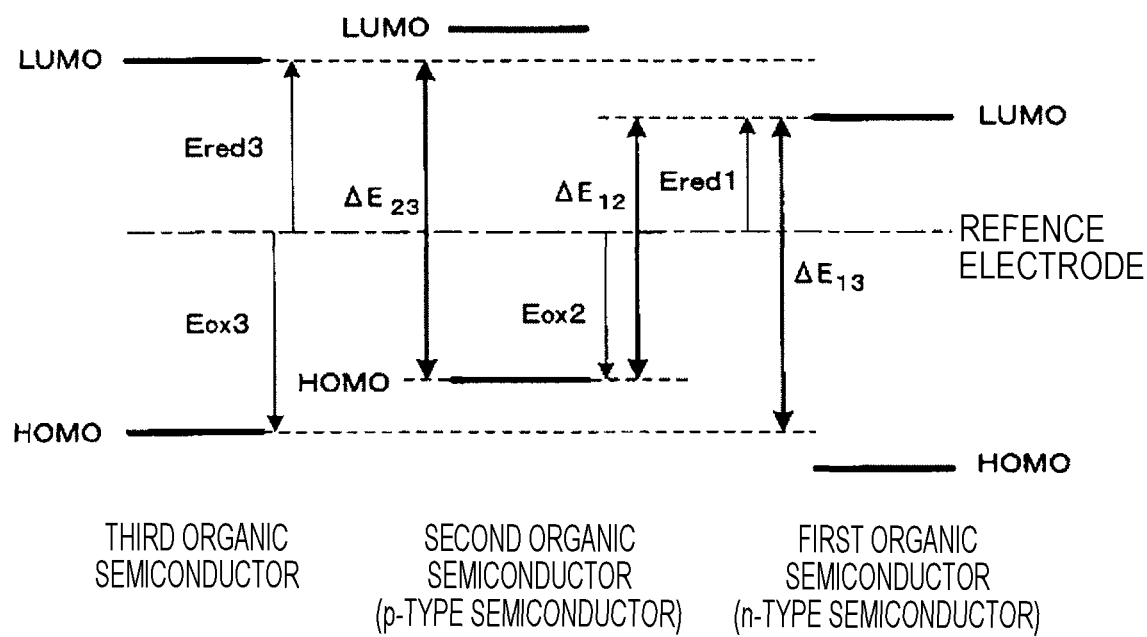
FIG. 5 is a schematic diagram for illustrating one example of preferred oxidation potential and reduction potential relationships of the organic semiconductors according to the present invention.

When the above-mentioned relationships are satisfied, the second organic semiconductor is likely to be mixed with the third organic semiconductor rather than the first organic semiconductor. Similarly, the third organic semiconductor is likely to be mixed with the second organic semiconductor. When the second and third organic semiconductors are mixed with each other, the energy spread of each state density of the HOMO level and the LUMO level through association of the second organic semiconductors is suppressed. With this, for example, the reduction in ΔE12 illustrated in FIG. 5 is suppressed, and a dark current is reduced.

It is more preferred that the SP values of the first to third organic semiconductors satisfy relationships of the following expressions (4) to (6).

$$|SP1-SP2| \geq 2.5 \quad (4)$$

$$|SP1-SP3| \geq 2.5 \quad (5)$$

$$|SP2-SP3| \leq 2.5 \quad (6)$$

When a combination of the materials is taken into consideration so as to satisfy the above-mentioned relationships, the second and third organic semiconductors are brought into a state of being preferentially mixed with each other rather than the first organic semiconductor.

It is more preferred that the solubility parameters of the second and third organic semiconductors satisfy a relationship of the following expression (7).

$$|SP2-SP3| \leq 1.0 \quad (7)$$

When the first organic semiconductor is an n-type organic semiconductor, it is preferred that the second and third organic semiconductors be p-type organic semiconductors. Meanwhile, when the first organic semiconductor is a p-type organic semiconductor, it is preferred that the second and third organic semiconductors be n-type organic semiconductors.

It is preferred that the above-mentioned relationships be satisfied because a phase of the first organic semiconductor that is a main component is likely to be formed, and a phase in which the second and third organic semiconductors are mixed with each other is likely to be formed. In this case, it is considered that the first organic semiconductor that is a main component serves as a main structure of a phase separation structure as an inner structure of the photoelectric conversion layer, and high charge separation efficiency and high charge transporting ability are likely to be realized. In this case, the generation of a dark current caused by thermal excitation is reduced by the mixed state of the second and third organic semiconductors. Thus, the photoelectric conversion element, in which a dark current is reduced and which has high photoelectric conversion characteristics, is obtained.

As described above, the reduction in dark current through decrease in N of an S/N ratio in the present invention has been described.

In order to improve resolution of the photoelectric conversion element, it is preferred that S of the S/N ratio be improved in addition to a decrease in N. For this purpose, when two kinds of photoelectric conversion elements are manufactured through use of the first, second, and third organic semiconductors, it is preferred that the element having an EQE peak on a long wavelength side have conversion efficiency (η) higher than that of the element having an EQE peak on a short wavelength side.

More specifically, when the first organic semiconductor is an n-type semiconductor, and the second and third organic semiconductors are p-type semiconductors, a photoelectric conversion element 1 made of the first organic semiconductor and the second organic semiconductor, and a photoelectric conversion element 2 made of the first organic semiconductor and the third organic semiconductor are assumed.

Then, a spectrum indicating a value of external quantum efficiency (EQE) of each of the photoelectric conversion elements with respect to a wavelength is obtained. When a peak of the spectrum in the photoelectric conversion element 1 appears on a short wavelength side as compared to the photoelectric conversion element 2, it is preferred that the conversion efficiency of the photoelectric conversion element 2 be higher than that of the photoelectric conversion element 1.

Meanwhile, the photoelectric conversion element 1 and the photoelectric conversion element 2 are assumed as described above. When a peak of the spectrum in the photoelectric conversion element 1 appears on a long wavelength side as compared to the photoelectric conversion element 2, it is preferred that the photoelectric conversion element 1 and the photoelectric conversion element 2 satisfy the following relational expressions (8) and (9).

$$\eta_1 > \eta_2 \quad (8)$$

$$|\Delta Eg| \leq 0.052 \text{ eV} \quad (9)$$

$\eta_1$ represents the conversion efficiency of the photoelectric conversion element 1, and $\eta_2$ represents the conversion efficiency of the photoelectric conversion element 2. The conversion efficiency of the photoelectric conversion element containing the first to third organic semiconductors is represented by $\eta_3$.

$\Delta Eg$ represents an energy difference determined based on an EQE peak wavelength difference between the photoelectric conversion element 1 and the photoelectric conversion element 2. When the above-mentioned relationships are satisfied, energy can be transferred between combinations of the p-type semiconductor and the n-type semiconductor having different conversion efficiencies. Specifically, when a part of energy can be transferred from the combination of the p-type semiconductor and the n-type semiconductor of the photoelectric conversion element 2 to the combination of the p-type semiconductor and the n-type semiconductor of the photoelectric conversion element 1, charge separation capacity of the photoelectric conversion element 1 having high conversion efficiency can be utilized. With this, certain improvement of conversion efficiency can be expected, and a relationship of $\eta_1 > \eta_3 > \eta_2$ can be created.

It is preferred that, in the sensitivity of the photoelectric conversion element, the light absorption characteristics and the conversion efficiency from light to an electron be high. This is because, when the charge separation capacity is low in spite of the fact that the absorption characteristics are excellent, an element having satisfactory sensitivity is not obtained. As a probability that an absorbed photon is converted into an electron, the conversion efficiency ($\eta$) is represented by a relationship of the following expression (10).

Conversion efficiency ($\eta$)=External quantum efficiency/Absorptance of photoelectric conversion layer (10)

The external quantum efficiency is also called quantum efficiency and refers to efficiency with which all the photons having entered the element are converted into electric signals. The EQE being high means that the sensitivity as the photoelectric conversion element is high. The external quantum efficiency or quantum efficiency is hereinafter also referred to as "EQE".

The EQE refers to efficiency obtained at a time when photons enter a photoelectric conversion element having a predetermined voltage applied thereto while being dispersed or without being dispersed, for example, from an A light source (standard light source) or an Xe light source, photons among the total number of the photons having entered the photoelectric conversion element are converted into electrons to be changed to electric signals, and current values thereof are measured with an ammeter. In this case, the incident light is dispersed, and EQE at each wavelength is measured, to thereby obtain a spectral sensitivity spectrum.

The absorptance of the photoelectric conversion layer refers to a ratio of photons absorbed optically by a film arranged between electrodes among the total number of photons that enter the photoelectric conversion element.

The conversion efficiency ($\eta$) can be determined, for example, as follows. An absorptance can be measured by forming a pixel portion through which light passes through use of a transparent electrode such as IZO both in a lower electrode and an upper electrode in an organic photoelectric conversion element on a transparent substrate. As a measurement apparatus, SolidSpec-3700 manufactured by Shimadzu Corporation or the like can be used. A dark current is subtracted from a photocurrent flowing through the element at a time of light irradiation to obtain a photoelectric conversion current. The photoelectric conversion current is converted into the number of electrons, and the number of electrons is divided by the number of irradiation photons, thereby being capable of determining an external quantum efficiency. The conversion efficiency ($\eta$) can be determined based on the external quantum efficiency and the absorptance of the photoelectric conversion layer as described above.

The photoelectric conversion layer in the present invention contains at least first, second, and third organic semiconductors, and there are at least two combinations containing each one of a p-type and an n-type. The photoelectric conversion elements including the photoelectric conversion layers that can be configured through use of the two combinations have spectral sensitivity characteristics including each absorption wavelength band and conversion efficiency.

As an indicator for indicating an absorption band of an organic semiconductor, an absorption peak wavelength and a bandgap of the organic semiconductor can be used. A thin film made of a single material of about 100 nm or less is formed by film formation of vacuum deposition or a spin coating method, and an absorption spectrum of the film is measured, thereby being capable of determining an absorption peak wavelength and an optical absorption edge. The absorption peak wavelength as used herein refers to a peak located on the longest wavelength side as an absorption band, and corresponds to a peak wavelength in a first absorption band. The absorption peak wavelength in that absorption band refers to, for example, a peak in the case of a single peak, and a peak having the longest wavelength in the case of a multiple peak (also called a vibration structure). Meanwhile, the optical absorption edge corresponds to a bandgap.

The absorption characteristics and the spectral characteristics of EQE correspond to each other. Therefore, in a photoelectric conversion element made of an organic semiconductor having a smaller bandgap, an absorption peak wavelength is also located on a longer wavelength side, and an EQE peak wavelength corresponding thereto is also located on a longer wavelength side. When the EQE peak wavelength is unclear, determination can be made when an element in which the concentration of the organic semiconductor is regulated so as to increase an absorptance is manufactured. When an EQE peak wavelength cannot be confirmed even at any concentration, a folding point, at which an EQE value is changed to increase when viewed on a short wavelength side from a long wavelength side, is set to an indicator as the spectral characteristics of EQE, and the folding point can be regarded as the same indicator as the EQE peak wavelength.

Among the first, second, and third organic semiconductors in the photoelectric conversion layer, an energy transfer process occurs by the time when charge separation occurs from the organic semiconductor that has absorbed light to be brought into an excited state. The excitation energy transfer is mainly a phenomenon called Forster (fluorescence resonance) energy transfer. This phenomenon occurs when there is overlapping between an emission spectrum of an organic semiconductor that has absorbed light and an absorption spectrum of another organic semiconductor that has accepted the energy thereof. As the overlapping is larger, energy is likely to be transferred. Energy is likely to be transferred from a high state to a low state. Specifically, excitation energy is transferred from the organic semiconductor that has absorbed light to the organic semiconductor having an absorption band on a longer wavelength side. In particular, it is preferred that the organic semiconductor serving as an energy acceptor have high absorption probability. Specifically, it is preferred that the organic semiconductor serving as an energy acceptor have a large molar absorption coefficient. The energy transfer process is a phenomenon in which a time constant is extremely small in the same manner as in an electron transfer process.

The excitation energy of the photoexcited organic semiconductor is transferred to the organic semiconductor having a small bandgap. Then, charge separation occurs between a pair of p-type and n-type organic semiconductors including a p-type or n-type organic semiconductor to which the excitation energy has been transferred. The present invention has a feature in that this combination is a combination of organic semiconductors having sensitivity on a long wavelength side. When the combination is contained in the photoelectric conversion element including the photoelectric conversion layer made of the first, second, and third organic semiconductors, the photoexcitation energy absorbed at various wavelengths can be collected to a p-type and n-type combination having high conversion efficiency to cause charge separation. Specifically, in the element including the photoelectric conversion layer that can be configured through use of each one of the p-type and n-type organic semiconductors among the first, second, and third organic semiconductors, when the conversion efficiency ($\eta$) of the photoelectric conversion element having an EQE peak on a long wavelength side is high as compared to that of the photoelectric conversion element having an EQE peak on a short wavelength side, the photoelectric conversion element having high sensitivity is obtained. With this, the sensitivity of the photoelectric conversion element is improved over the entire wavelength region having absorption, and the S/N ratio is improved.

The p-type and n-type organic semiconductors having high conversion efficiency are each required to function as an energy acceptor, and hence each content of any of the organic semiconductors is at least 3% or more, preferably 6% or more. As an acceptor in energy transfer, the molar absorption coefficient of the organic semiconductor is at least 1,000 mol $L^{-1}$ $cm^{-1}$, more preferably 10,000 mol $L^{-1}$ $cm^{-1}$ or more. For example, the first absorption band of the organic semiconductor group exemplified as the p-type organic semiconductor materials is located in a visible light region, and the molar absorption coefficient thereof is at least 1,000 mol $L^{-1}$ $cm^{-1}$ or more. Meanwhile, for example, C60 has an absorption band in a visible light region, but the molar absorption coefficient thereof is less than 1,000 mol $L^{-1}$ $cm^{-1}$. Thus, C60 does not effectively function as an energy acceptor.

The first, second, and third organic semiconductors in the present invention are each a low-molecular weight organic compound. Organic compounds are roughly classified into a low molecule, an oligomer molecule, and a macromolecule depending on the molecule. The macromolecule and the oligomer molecule are defined by International Union of Pure and Applied Chemistry (IUPAC) Committee of Polymer Nomenclature as follows.

Macromolecule or polymer molecule: a molecule with a large molecular mass having a structure formed of a large number of repetitions of a unit obtained substantially or conceptually from a molecule having a small relative molecular mass Oligomer molecule: a molecule with a medium relative molecular mass having a structure formed of a small number of repetitions of a unit obtained substantially or conceptually from a molecule having a small relative molecular mass.

The first, second, and third organic semiconductors in the present invention are molecules that do not belong to the above-mentioned definition of the macromolecule, polymer molecule, and oligomer molecule. Specifically, the first, second, and third organic semiconductors in the present invention are each a molecule in which the repetition number of a repeating unit is small, preferably 3 or less, more preferably 1.

For example, a fullerene described later is a compound having a hollow closed shell. When one closed-shell structure is regarded as one repeating unit, and the repetition number of, for example, C60 is 1. Therefore, C60 is a low molecule.

In addition, the macromolecule is mainly classified into a synthetic macromolecule obtained by chemical synthesis and a natural macromolecule that exists in the natural world. The natural macromolecule includes a macromolecule with monodisperse molecular weight, whereas the synthetic macromolecule generally has dispersiveness in molecular weight caused by a difference in repeating unit. Meanwhile, the organic semiconductors to be used in the present invention do not exist naturally. The organic semiconductors to be used in the present invention are each a molecule obtained by synthesis but do not have dispersiveness in molecular weight caused by a difference in repeating unit.

The presence or absence of such dispersiveness causes an important difference when the macromolecule is used in the photoelectric conversion layer of the photoelectric conversion element. When the macromolecule compound having dispersiveness is used in the photoelectric conversion layer, the energy spread of each state density of the HOMO level and the LUMO level of a compound contained in the photoelectric conversion layer is enlarged, and an energy barrier between the HOMO of the p-type semiconductor and the LUMO of the n-type semiconductor cannot be controlled. As a result, a level that generates a dark current at a time of application of an electric field is formed. Thus, in the present invention, in the photoelectric conversion layer, a low-molecular weight organic semiconductor which has a repeating unit of 3 or less, preferably 1 without having dispersiveness caused by a difference in repeating unit, more preferably a low-molecular weight organic semiconductor with a molecular weight of 1,500 or less having a sublimation property is used.

In the present invention, the energy spread of the HOMO level and the LUMO level of the second organic semiconductor is suppressed by mixing the third organic semiconductor irrespective of the oxidation potential and reduction potential relationships among the first organic semiconductor, the second organic semiconductor, and the third organic semiconductor. Thus, in the present invention, the dark current reduction effect is exhibited, and it is preferred that the oxidation potential and reduction potential relationships described below be satisfied because the dark current reduction effect is likely to be increased.

FIG. 5 is a diagram for illustrating preferred oxidation potential and reduction potential relationships with the third organic semiconductor in the case where the first organic semiconductor is an n-type semiconductor and the second organic semiconductor is a p-type semiconductor in the present invention. The oxidation potential corresponds to the HOMO level of each of the organic semiconductors. The reduction potential corresponds to the LUMO level of each of the organic semiconductors. The oxidation-reduction potential is a potential energy difference between the molecules in a solution and the electrodes and refers to a physical property value of a single molecule. In the configuration of FIG. 5, it is preferred that the relationship of each potential satisfy the following expressions (11) and (12).

$$Eox2 \leq Eox3 \tag{11}$$

$$Ered1 \geq Ered3 \tag{12}$$

Eox2: oxidation potential of the second organic semiconductor
Eox3: oxidation potential of the third organic semiconductor
Ered1: reduction potential of the first organic semiconductor
Ered3: reduction potential of the third organic semiconductor When the expressions (11) and (12) are satisfied, $\Delta E_{13}$ formed by the LUMO level of the first organic semiconductor and the HOMO level of the third organic semiconductor is equal to or larger than $\Delta E_{12}$ formed by the LUMO level of the first organic semiconductor and the HOMO level of the second organic semiconductor. Similarly, $\Delta E_{23}$ formed by the LUMO level of the third organic semiconductor and the HOMO level of the second organic semiconductor is equal to or larger than $\Delta E_{12}$. As a result, the contribution of a dark current generated between the first organic semiconductor and the second organic semiconductor to a dark current generated between the third organic semiconductor and another organic semiconductor can be reduced.

Figure 6:
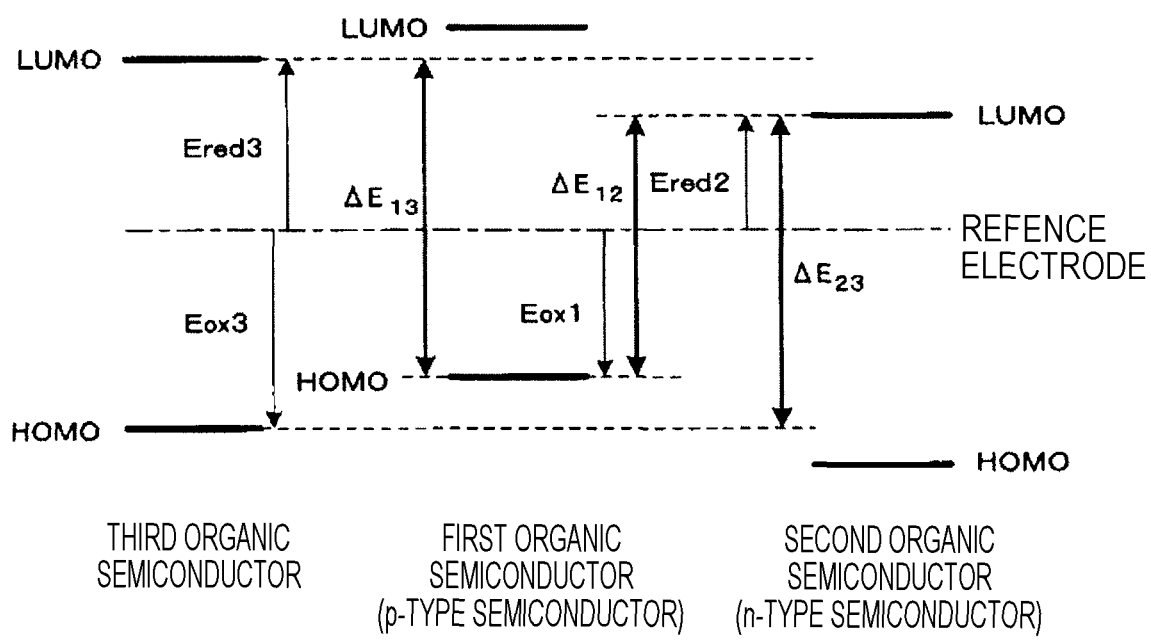
FIG. 6 is a schematic diagram for illustrating one example of preferred oxidation potential and reduction potential relationships of the organic semiconductors according to the present invention.

In addition, FIG. 6 is a diagram for illustrating preferred oxidation potential and reduction potential relationships with the third organic semiconductor in the case where the first organic semiconductor is a p-type semiconductor and the second organic semiconductor is an n-type semiconductor in the present invention. In the configuration of FIG. 6, it is preferred that the relationship of each potential satisfy the following expressions (13) and (14).

$$Eox1 \leq Eox3 \tag{13}$$

$$Ered2 \geq Ered3 \tag{14}$$

Eox1: oxidation potential of the first organic semiconductor
Eox3: oxidation potential of the third organic semiconductor
Ered2: reduction potential of the first organic semiconductor
Ered3: reduction potential of the third organic semiconductor The reason why the above-mentioned oxidation potential and reduction potential relationships are preferred is that $\Delta E_{12} \leq \Delta E_{13}$ and $\Delta E_{12} \leq \Delta E_{23}$ are preferred in the same manner as in the above-mentioned case in which the first organic semiconductor is an n-type semiconductor and the second organic semiconductor is a p-type semiconductor.

In the present invention, the first organic semiconductor may be an n-type semiconductor or a p-type semiconductor. However, it is preferred that a fullerene that is an n-type semiconductor or a derivative thereof be used as the first organic semiconductor because heat resistance is likely to be stable, and handling is easy.

(p-Type Semiconductor)

The p-type semiconductor to be used in the present invention is an electron-donating organic semiconductor, and is an organic compound which is mainly typified by a hole transporting organic compound having a property of being likely to donate an electron. In the p-type semiconductor, it is preferred that an absorption wavelength be located in a visible light region of from 450 nm to 700 nm in order to obtain a panchromatic absorption band. In particular, in order to obtain the panchromatic absorption band, it is preferred that the absorption wavelength be located in a region of from 500 nm to 650 nm. With this, the sensitivity of a blue region in the vicinity of from 450 nm to 470 nm and a red region in the vicinity of from 600 nm to 630 nm can be improved together with the green region, and the panchromatic property is improved.

It is preferred that the p-type semiconductor be any one of compounds represented by the following general formulae [1] to [5], a quinacridone derivative, and a 3H-phenoxazin-3-one derivative. The expression "form a ring" as used herein does not limit a ring structure to be formed unless otherwise stated. For example, a five-membered ring, a six-membered ring, or a seven-membered ring may be fused. A ring structure to be fused may be an aromatic ring or an alicyclic structure.

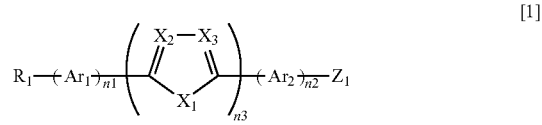

[1]

In the general formula [1], $R_1$ represents a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, or a cyano group.

"$n_1$", "$n_2$", and "$n_3$" each independently represent an integer of from 0 to 4.

$X_1$ to $X_3$ each represent any one of a nitrogen atom, a sulfur atom, an oxygen atom, and a carbon atom that may have a substituent.

$Ar_1$ and $Ar_2$ are each independently selected from a substituted or unsubstituted aryl group or a substituted or unsubstituted heterocyclic group. When $Ar_1$ and $Ar_2$ are present in a plural number, each of $Ar_1$ and $Ar_2$ may be identical or different, and when $X_2$ or $X_3$ represents a carbon atom, $Ar_1$ and $Ar_2$ may be bonded to each other to form a ring.

$Z_1$ represents any one of a halogen atom, a cyano group, a vinyl group substituted with a cyano group, a substituted or unsubstituted heteroaryl group, or substituents represented by the following general formulae [1-1] to [1-9].

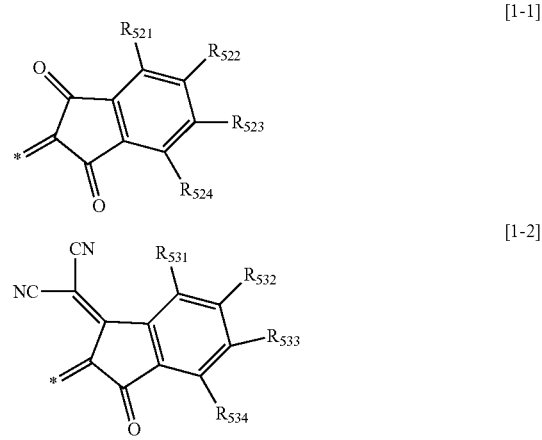

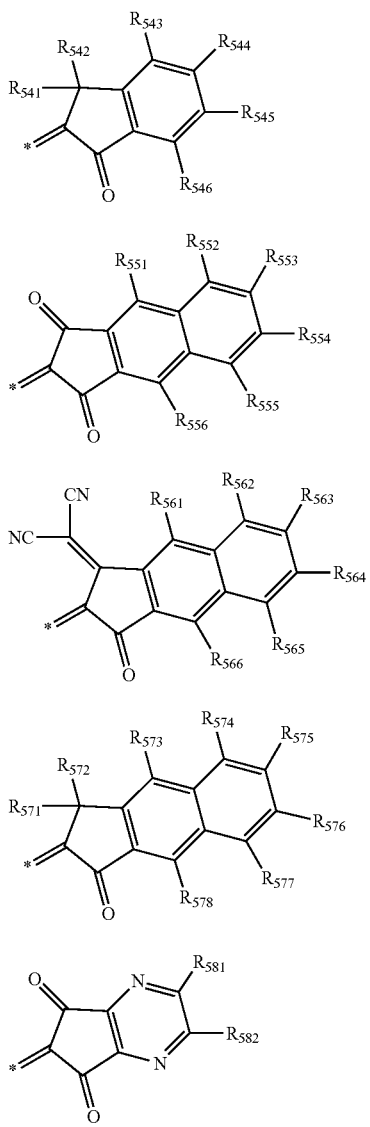

In the general formulae [1-1] to [1-9], $R_{521}$ to $R_{588}$ are each independently selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group. A symbol "*" represents a bonding position with respect to a carbon atom.

In the organic compound represented by the general formula [1], it is preferred that $Ar_1$ represent a substituted or unsubstituted aryl group or a substituted or unsubstituted heterocyclic group. It is preferred that a hetero atom contained in the heterocyclic group be nitrogen. It is preferred that $X_1$ represent a sulfur atom or an oxygen atom. It is preferred that "$n_1$" represent 1, and "$n_2$" represent 0. When "$n_2$" represents 0, $Ar_2$ represents a single bond.

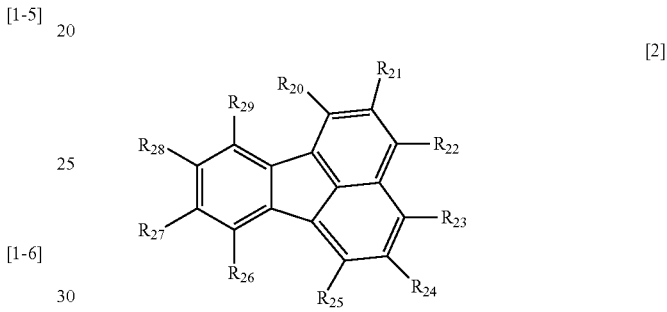

[2]

In the general formula [2], $R_{20}$ to $R_{29}$ are each independently selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group. Among $R_{20}$ to $R_{29}$, two adjacent groups may be bonded to each other to form a ring.

More specifically, the general formula [2] can be represented by any one of the following general formulae [11] to [27].

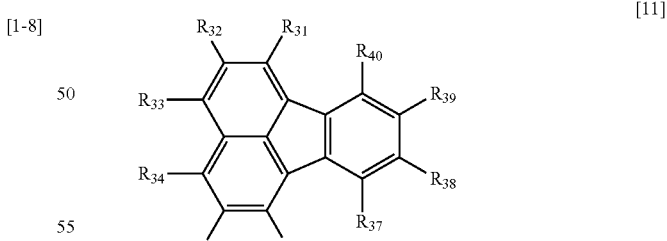

[11]

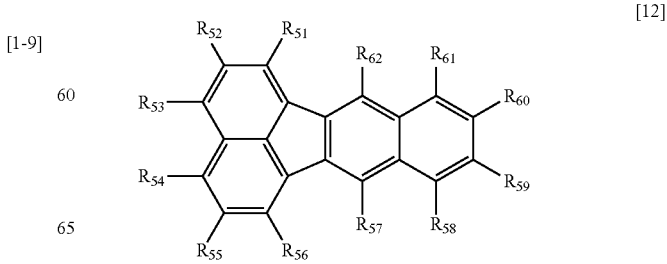

[12]

[13]
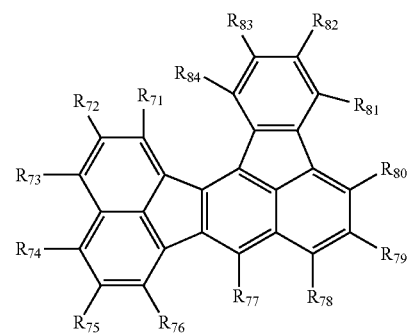
[14]
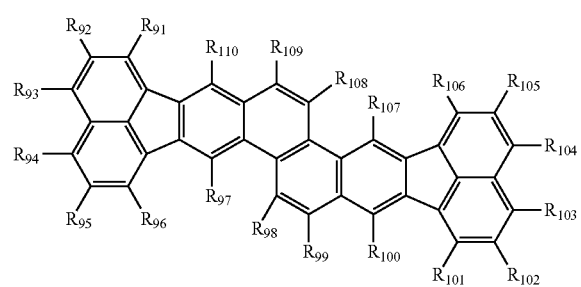
[15]
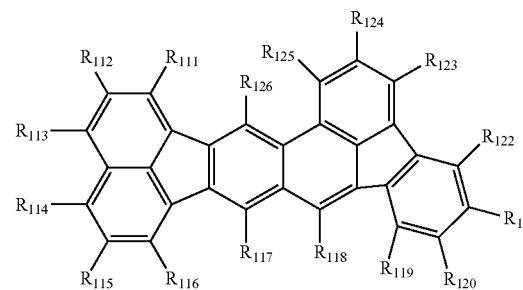
[16]
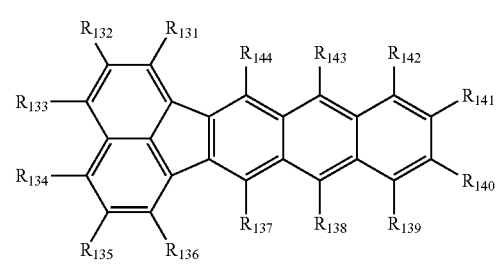
[17]
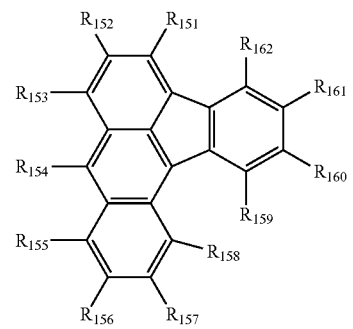
[18]
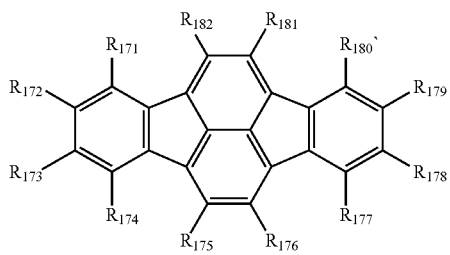
[19]
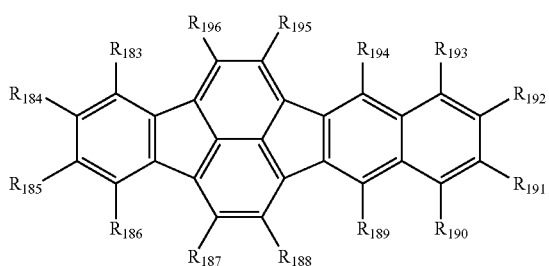
[20]
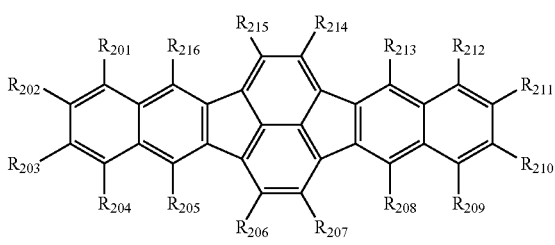
[21]
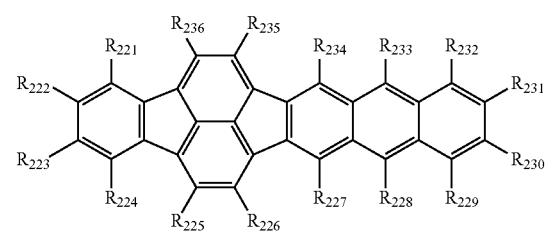
[22]
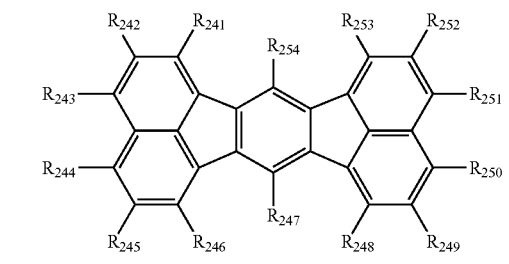
[23]
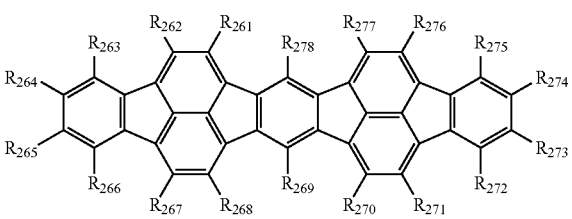

[24]

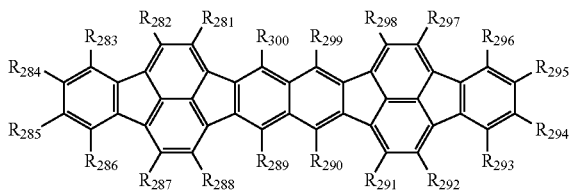

[25]

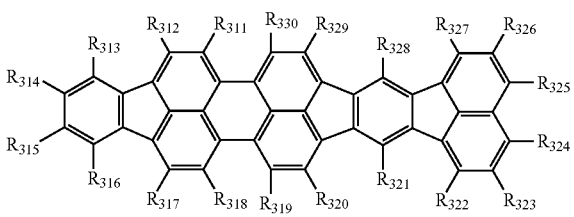

[26]

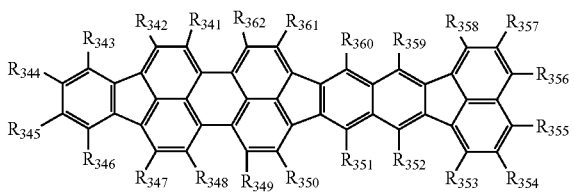

[27]

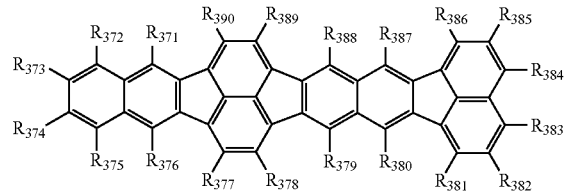

In the general formulae [11] to [27], $R_{31}$ to $R_{390}$ are each independently selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group.

Specific examples of the substituents in the general formulae [1] and [2], the general formulae [1-1] to [1-9], and the general formulae [11] to [27] are shown below.

Examples of the halogen atom include a chlorine atom, a bromine atom, and an iodine atom, and a fluorine atom is preferred.

The alkyl group is preferably an alkyl group having 1 to 10 carbon atoms. Examples thereof include a methyl group, an ethyl group, an n-propyl group, an isopropyl group, an n-butyl group, a tert-butyl group, a sec-butyl group, an octyl group, a 1-adamantyl group, and a 2-adamantyl group. The alkyl group may be an alkyl group having 1 to 4 carbon atoms.

The alkoxy group is preferably an alkoxy group having 1 to 10 carbon atoms. Examples thereof include a methoxy group, an ethoxy group, an n-propoxy group, an isopropoxy group, an n-butoxy group, a tert-butoxy group, a sec-butoxy group, and an octoxy group. The alkoxy group may be an alkoxy group having 1 to 4 carbon atoms.

The aryl group is preferably an aryl group having 6 to 20 carbon atoms. Examples thereof include a phenyl group, a naphthyl group, an indenyl group, a biphenyl group, a terphenyl group, a fluorenyl group, an anthracenyl group, a pyrenyl group, a fluoranthenyl group, and a perylenyl group. In particular, a phenyl group, a biphenyl group, a terphenyl group, a fluorenyl group, and a naphthyl group each having low molecular weight are preferred in consideration of sublimability of the compound.

The heterocyclic group is preferably a heterocyclic group having 3 to 15 carbon atoms. Examples thereof include a pyridyl group, a pyrazyl group, a triazyl group, a thienyl group, a furanyl group, a pyrrolyl group, an oxazolyl group, an oxadiazolyl group, a thiazolyl group, a thiadiazolyl group, a carbazolyl group, an acridinyl group, a phenanthrolyl group, a benzothiophenyl group, a dibenzothiophenyl group, a benzothiazolyl group, a benzoazolyl group, and a benzopyrrolyl group. The hetero atom contained in the heterocyclic group is preferably nitrogen.

The amino group is preferably an amino group having an alkyl group or an aryl group as a substituent. Examples thereof include an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisoylamino group, an N-mesityl-N-phenylamino group, an N,N-dimesitylamino group, an N-phenyl-N-(4-tert-butylphenyl)amino group, and an N-phenyl-N-(4-trifluoromethylphenyl)amino group. The alkyl group or the aryl group serving as a substituent in the amino group is as shown in the examples of the substituents described above.

Examples of the substituent in the alkyl group, the aryl group, the heterocyclic group, the amino group, the vinyl group, or the aryl group in the general formulae [1] and [2], the general formulae [1-1] to [1-9], and the general formulae [11] to [27] include the following substituents. Examples of the substituent include: alkyl groups each having 1 to 4 carbon atoms, such as a methyl group, an ethyl group, a propyl group, and a butyl group; aralkyl groups, such as a benzyl group; aryl groups, such as a phenyl group and a biphenyl group; heterocyclic groups each containing a nitrogen atom, such as a pyridyl group and a pyrrolyl group; amino groups, such as a dimethylamino group, a diethylamino group, a dibenzylamino group, a diphenylamino group, and a ditolylamino group; alkoxyl groups, such as a methoxyl group, an ethoxyl group, a propoxyl group, and a phenoxyl group; cyclic ketone groups, such as a 1,3-indanedionyl group, a 5-fluoro-1,3-indanedionyl group, a 5,6-difluoro-1,3-indanedionyl group, a 5,6-dicyano-1,3-indanedionyl group, a 5-cyano-1,3-indanedionyl group, a cyclopenta[b]naphthalene-1,3 (2H)-dionyl group, a phenalene-1,3 (2H)-dionyl group, and a 1,3-diphenyl-2,4,6(1H,3H,5H)-pyrimidinetrionyl group; a cyano group; and a halogen atom. Examples of the halogen atom include fluorine, chlorine, bromine, and iodine atoms, and a fluorine atom is preferred.

It is preferred that the general formula [1] have a structure represented by the following general formula [28].

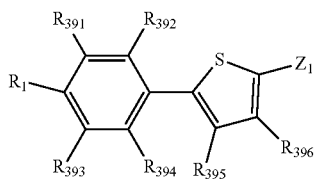

[28]

In the general formula [28], $R_{391}$ to $R_{396}$ are each independently selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group. Among $R_{391}$ to $R_{396}$, two adjacent groups may be bonded to each other to form a ring. It is particularly preferred that $R_{394}$ and $R_{395}$ be bonded to each other to form a ring.

In addition, the organic compound represented by the general formula [28] is a material having strong absorption at an absorption peak wavelength of 522 nm or more and 600 nm or less. It is preferred that the absorption peak be located in this wavelength region as described above because the photoelectric conversion layer has the panchromatic property.

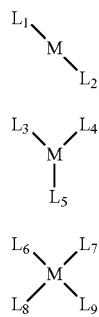

[3]

[4]

[5]

In the general formulae [3] to [5], M represents a metal atom, and the metal atom may have an oxygen atom or a halogen atom as a substituent.

$L_1$ to $L_9$ each represent a ligand that is coordinated with the metal M, and are each formed of a substituted or unsubstituted aryl group or a substituted or unsubstituted heterocyclic group. Among $L_1$ to $L_9$, two adjacent ligands may be bonded to each other to form a ring.

In the general formulae [3] to [5], when M represents iridium, a 6-coordinate complex is preferred. When M represents platinum, vanadium, cobalt, gallium, or titanium, a 4-coordinate complex is preferred. This is because a complex having the above-mentioned coordination number has high stability.

Specific examples of the ligands $L_1$ to $L_9$ in the general formulae [3] to [5] are described below.

The ligands $L_1$ to $L_9$ are each a ligand obtained by bonding a plurality of substituents selected from a substituted or unsubstituted aryl group and a substituted or unsubstituted heterocyclic group.

Examples of the aryl group for forming the ligand include, but not limited to, a phenyl group, a naphthyl group, an indenyl group, a biphenyl group, a terphenyl group, a fluorenyl group, an anthracenyl group, a pyrenyl group, a fluoranthenyl group, and a perylenyl group.

Examples of the heterocyclic group for forming the ligand include, but not limited to, a pyridyl group, a pyrazyl group, a triazyl group, a thienyl group, a furanyl group, a pyrrolyl group, an oxazolyl group, an oxadiazolyl group, a thiazolyl group, a thiadiazolyl group, a carbazolyl group, an acridinyl group, a phenanthrolyl group, a benzothiophenyl group, a dibenzothiophenyl group, a benzothiazolyl group, a benzoazolyl group, and a benzopyrrolyl group.

Examples of the substituent in each of the ligands in the general formulae [3] to [5], that is, the substituent in each of the aryl group and the heterocyclic group, include: alkyl groups each having 1 to 4 carbon atoms, such as a methyl group, an ethyl group, a propyl group, and a butyl group; aralkyl groups, such as a benzyl group; aryl groups, such as a phenyl group and a biphenyl group; heterocyclic groups each containing a nitrogen atom, such as a pyridyl group and a pyrrolyl group; amino groups, such as a dimethylamino group, a diethylamino group, a dibenzylamino group, a diphenylamino group, and a ditolylamino group; alkoxyl groups, such as a methoxyl group, an ethoxyl group, a propoxyl group, and a phenoxyl group; cyclic ketone groups, such as a 1,3-indanedionyl group, a 5-fluoro-1,3-indanedionyl group, a 5,6-difluoro-1,3-indanedionyl group, a 5,6-dicyano-1,3-indanedionyl group, a 5-cyano-1,3-indanedionyl group, a cyclopenta[b]naphthalene-1,3 (2H)-dionyl group, a phenalene-1,3(2H)-dionyl group, and a 1,3-diphenyl-2,4,6(1H,3H,5H)-pyrimidinetrionyl group; a cyano group; and a halogen atom. Examples of the halogen atom include fluorine, chlorine, bromine, and iodine atoms, and a fluorine atom is preferred.

The ligand has, for example, a hydroxy group or a carboxyl group as a substituent, and may be bonded to a metal atom via the hydroxy group or the carboxyl group.

Now, preferred compounds among the p-type semiconductors represented by the general formulae [1] to [5] are exemplified.

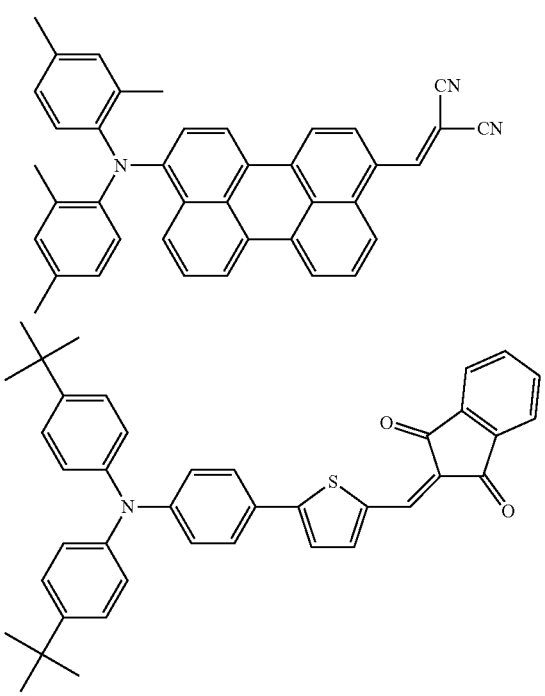

-continued
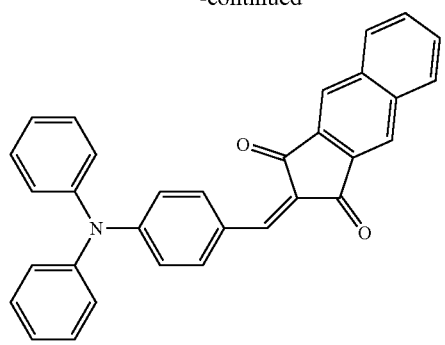
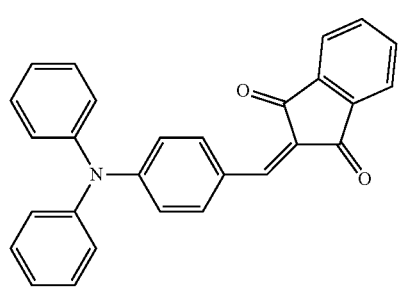
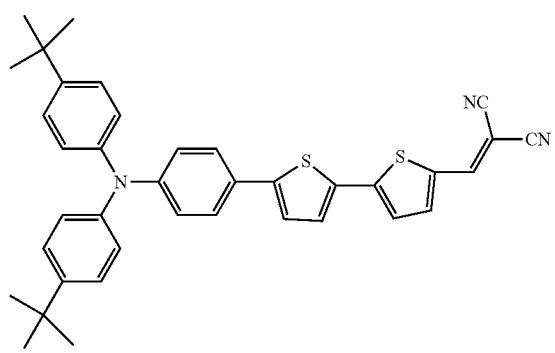
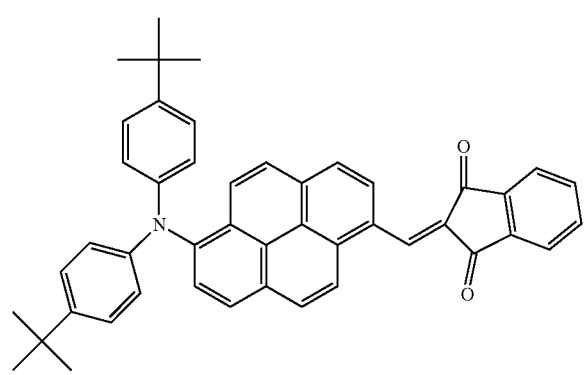
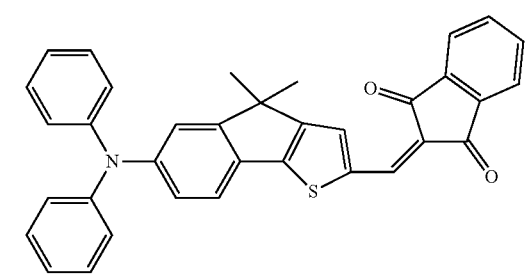
-continued
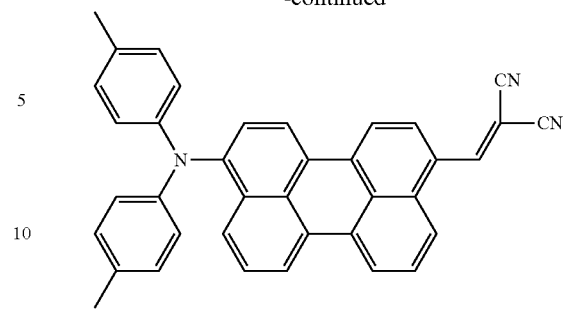
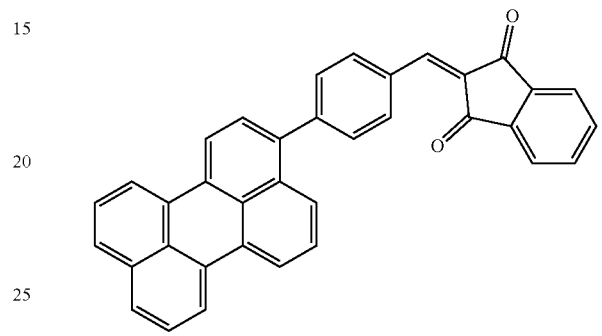
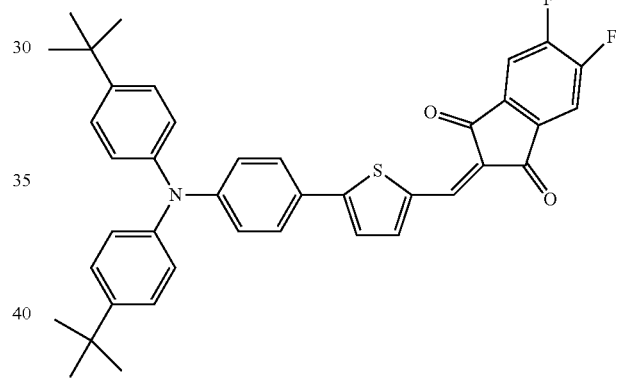
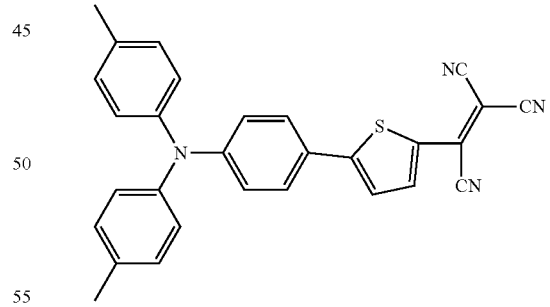
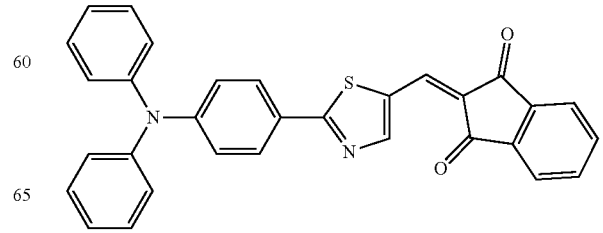

-continued
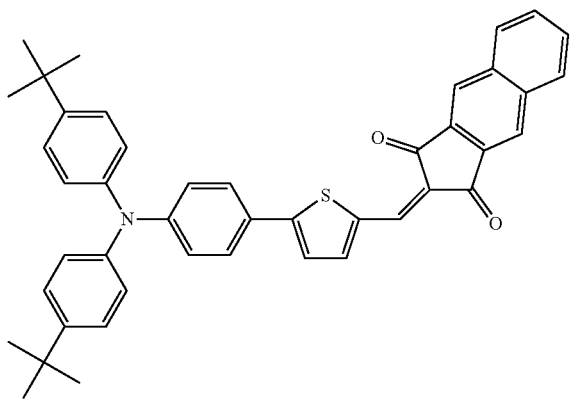
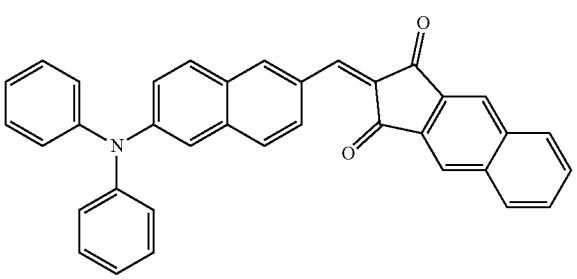
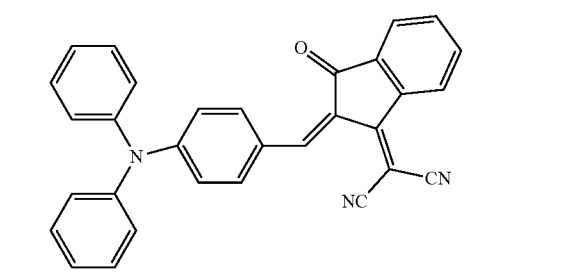
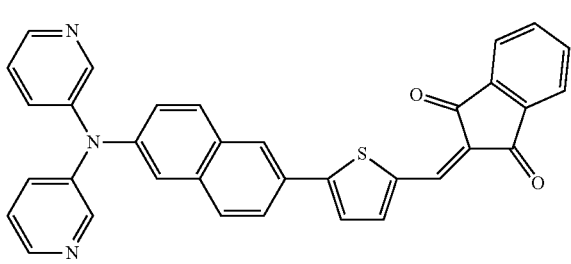
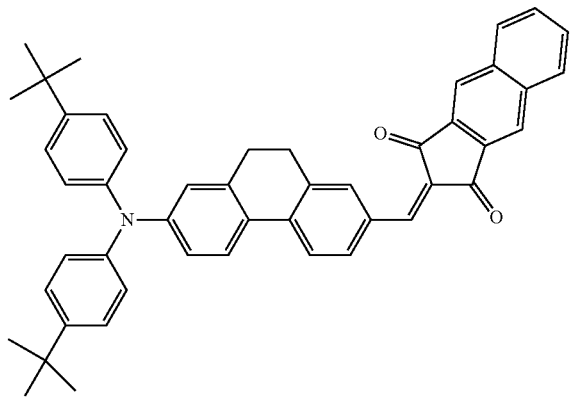
-continued
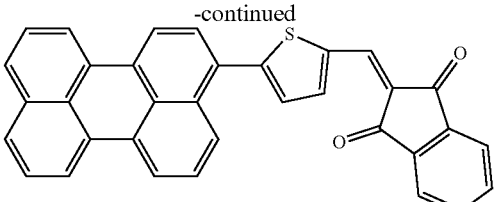
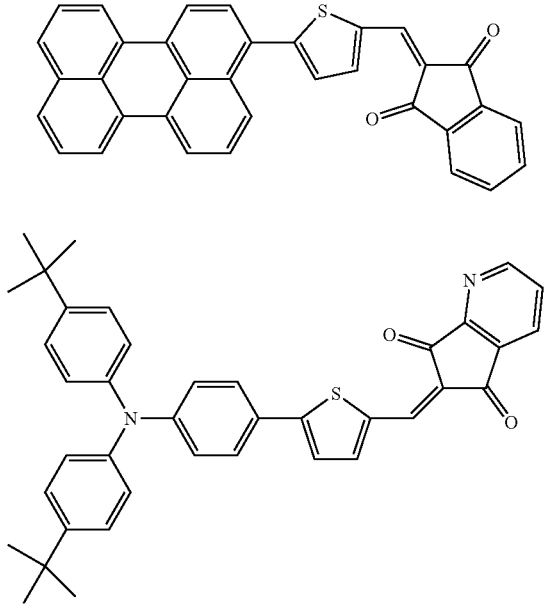
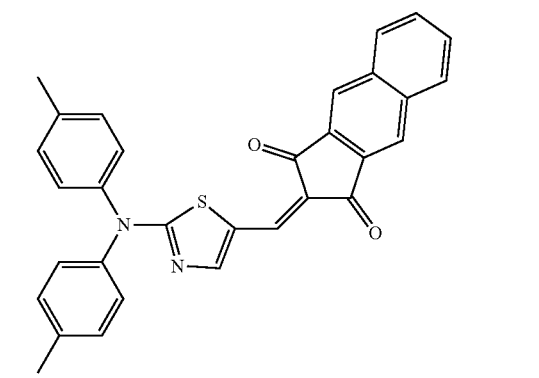
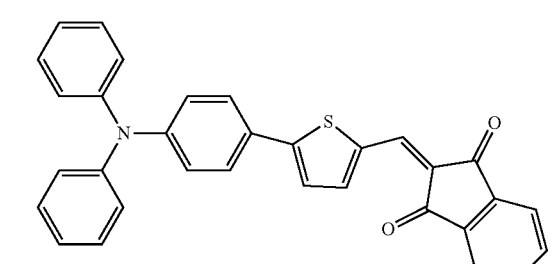
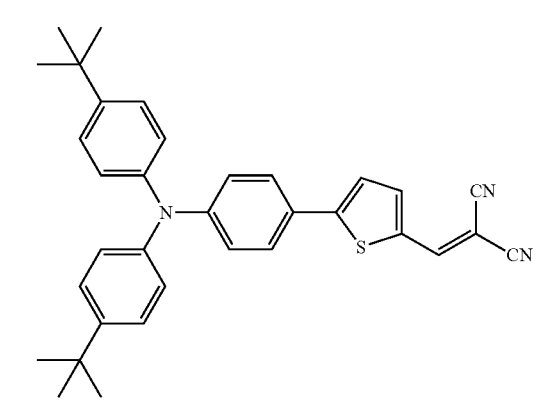

31
-continued
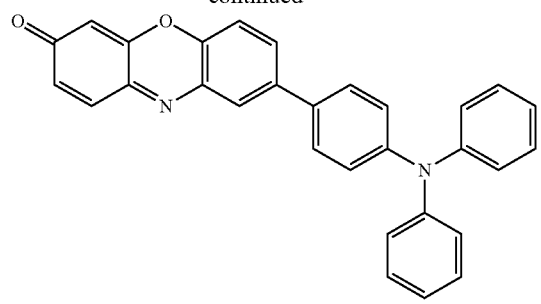
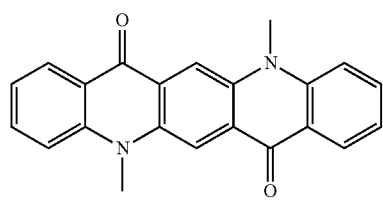
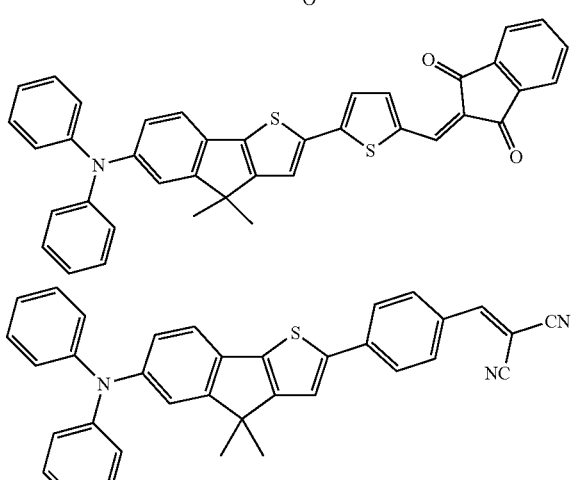
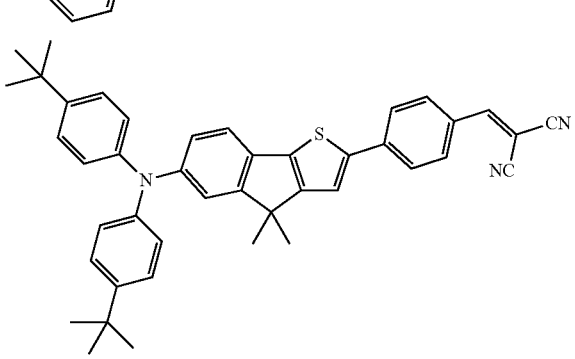
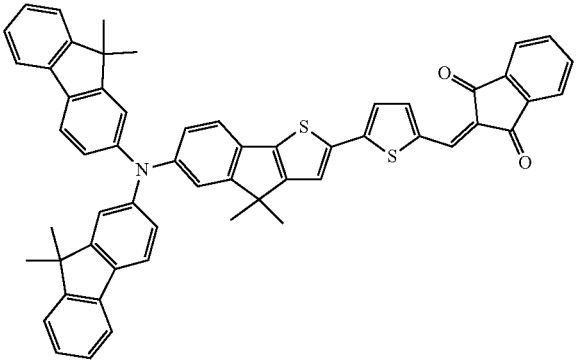
32
-continued
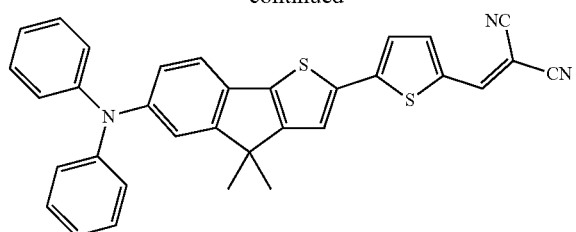
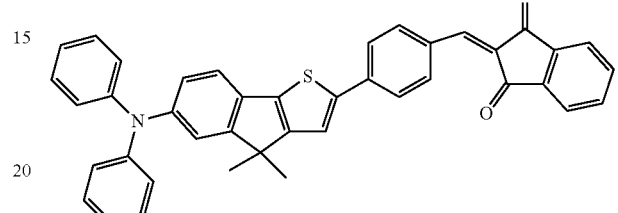
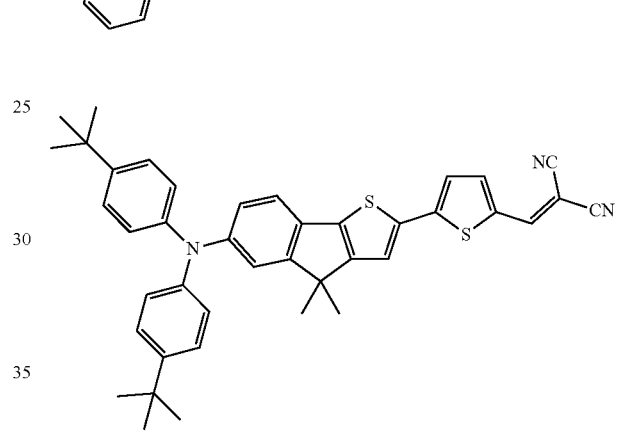
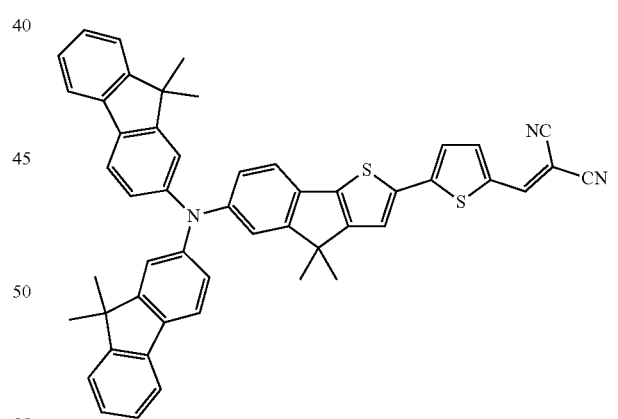
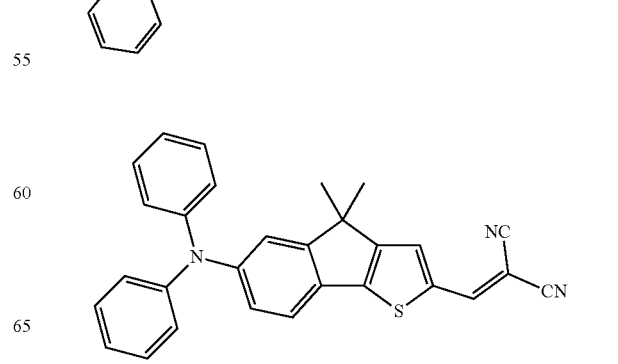

33
-continued
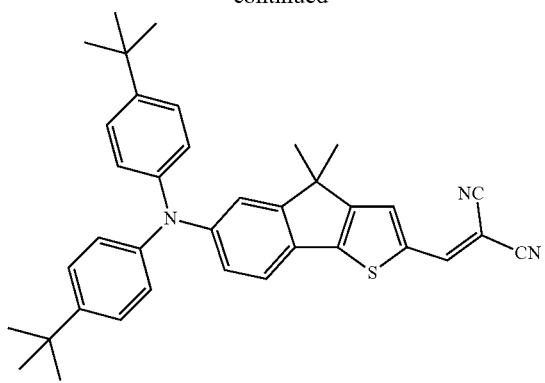
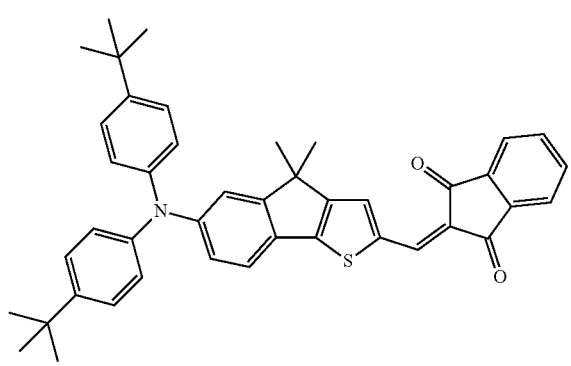
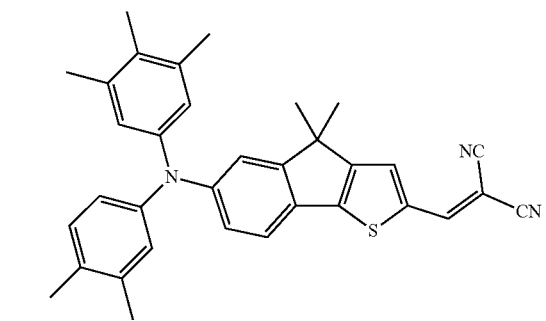
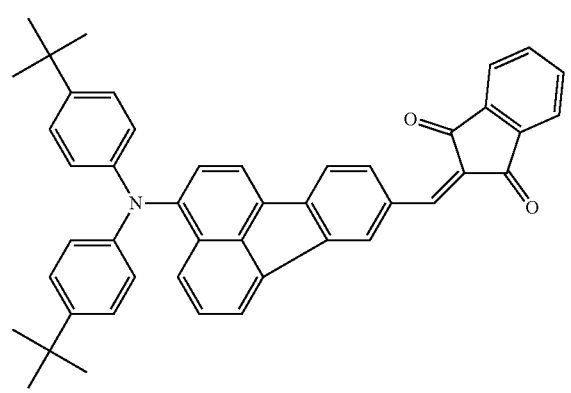
34
-continued
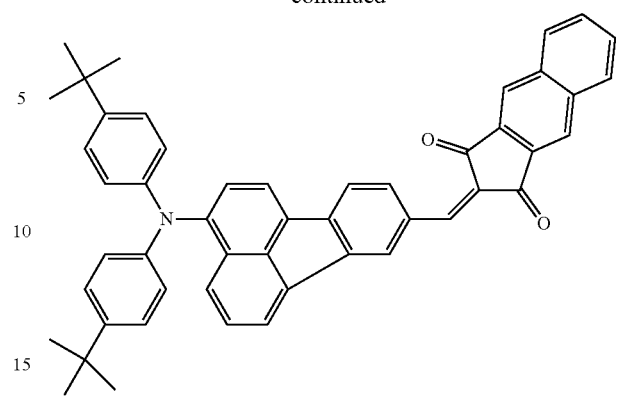
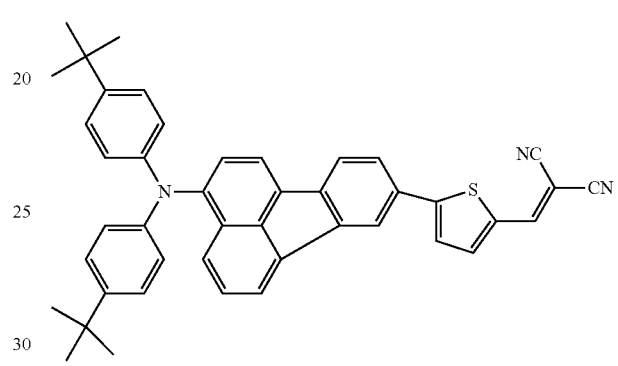
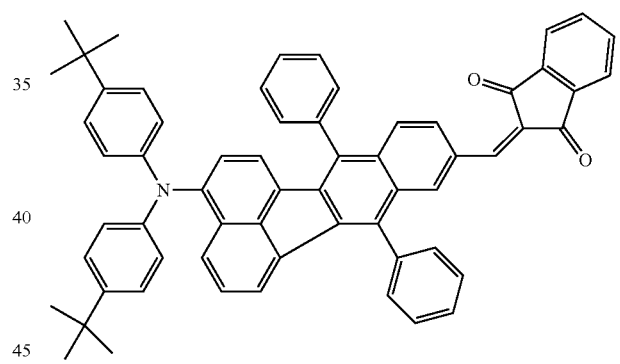
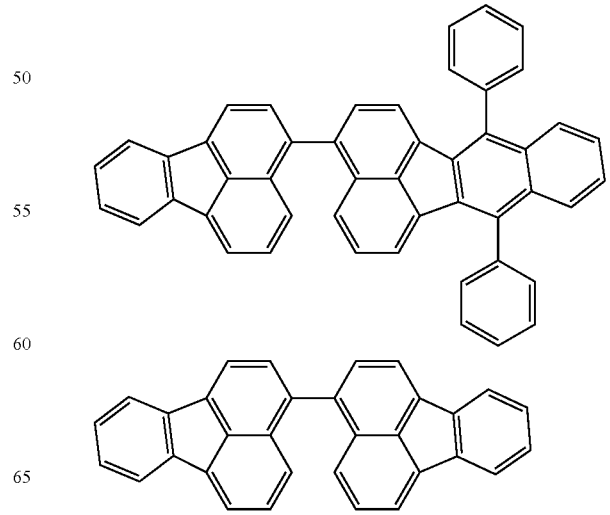

35
-continued
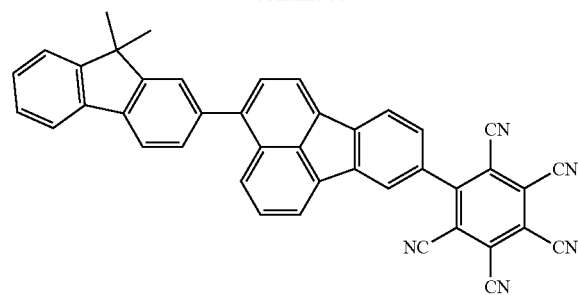
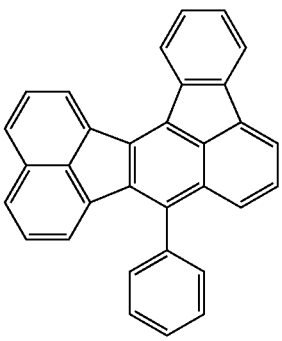
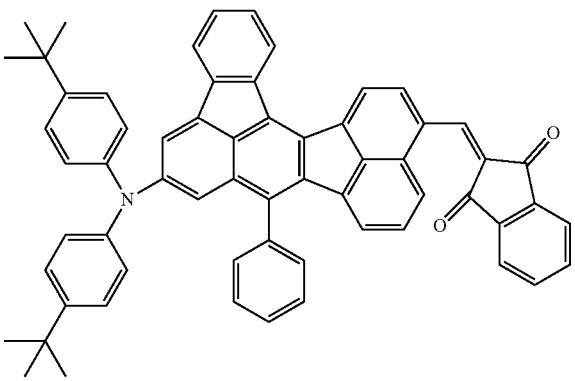
36
-continued
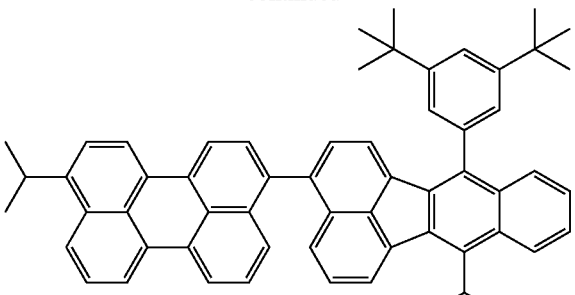
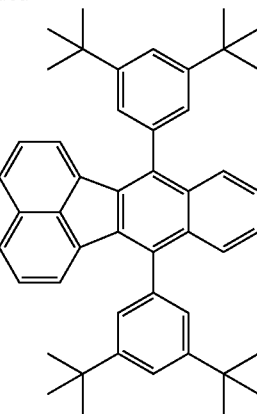
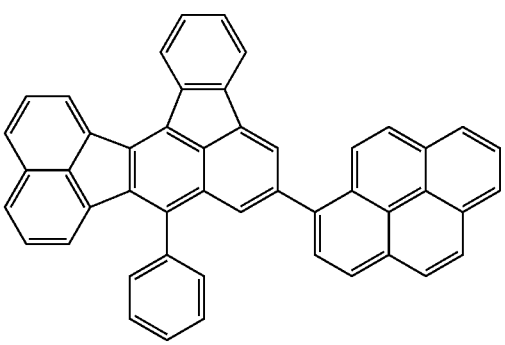

37
-continued
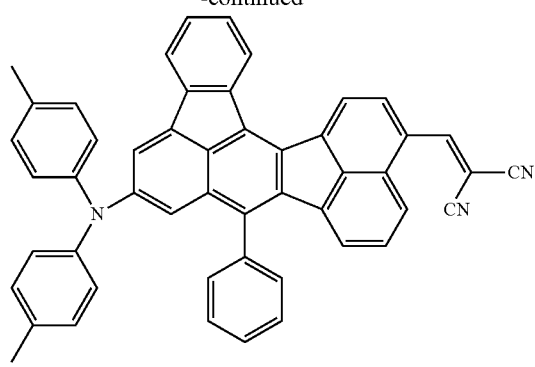
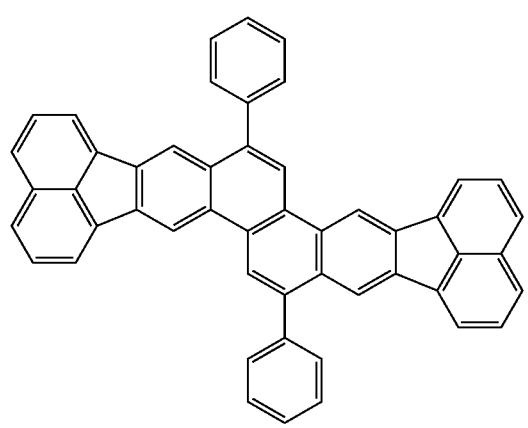
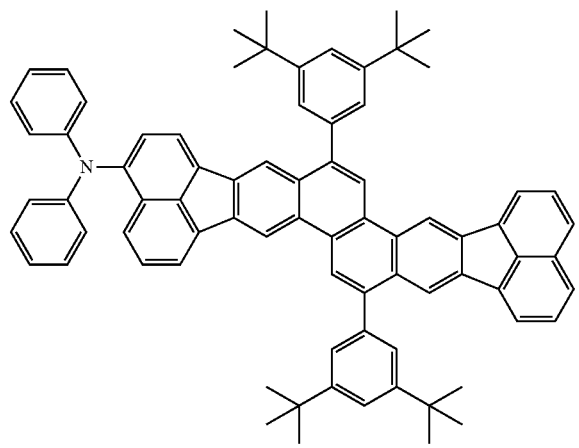
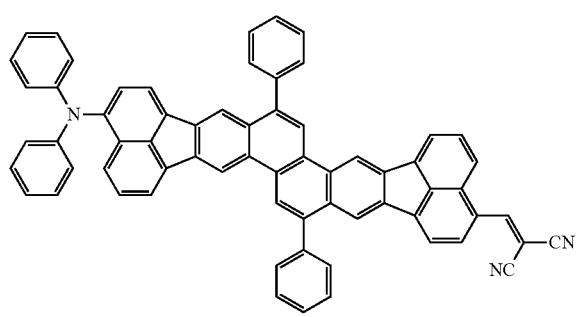
38
-continued
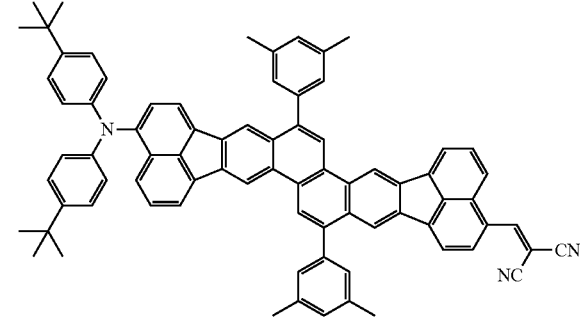
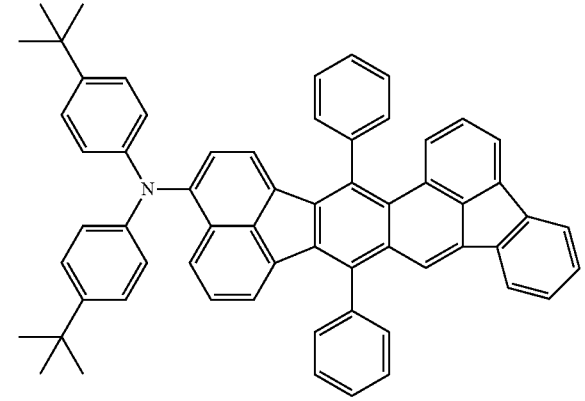
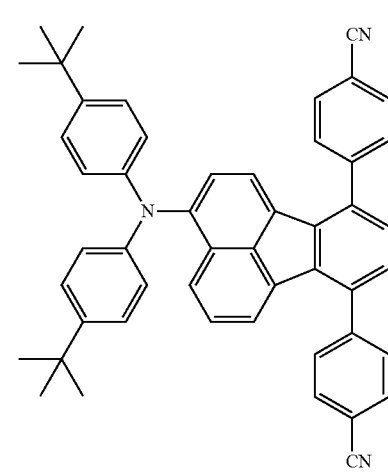

39
-continued
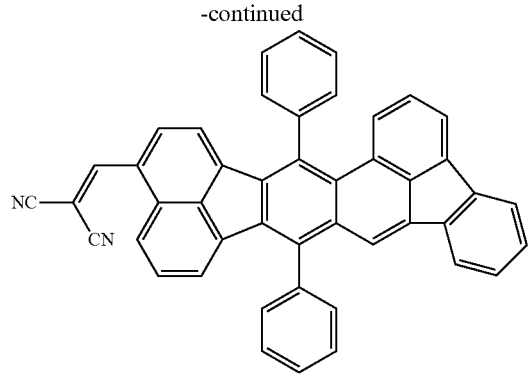
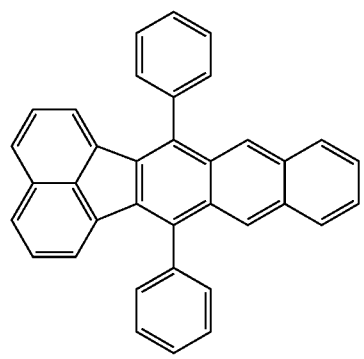
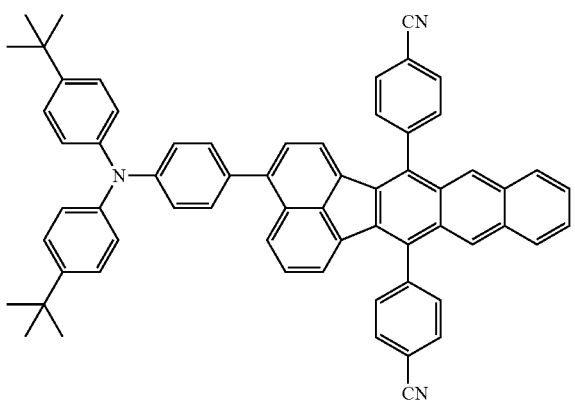
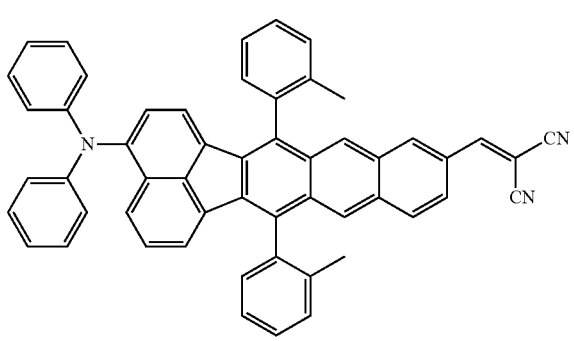
40
-continued
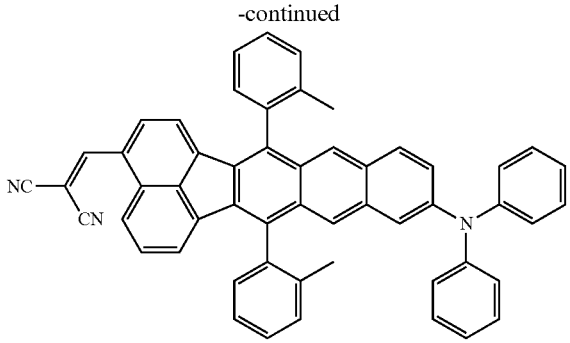
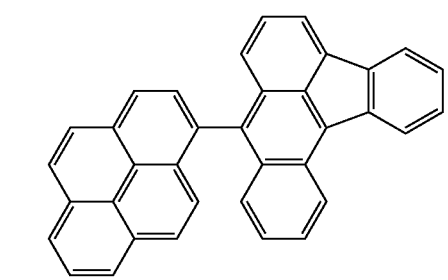
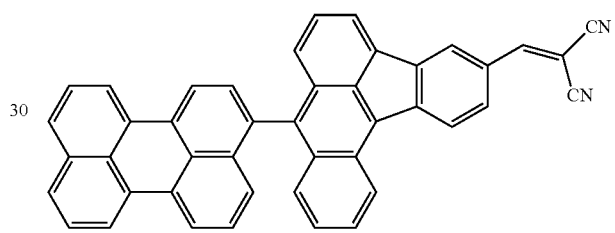
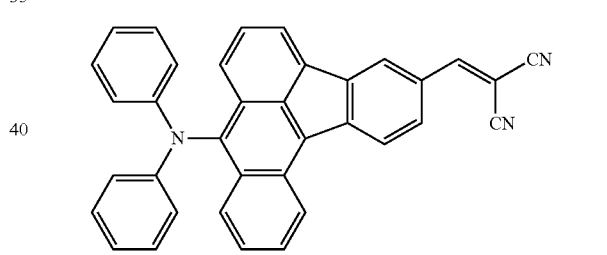
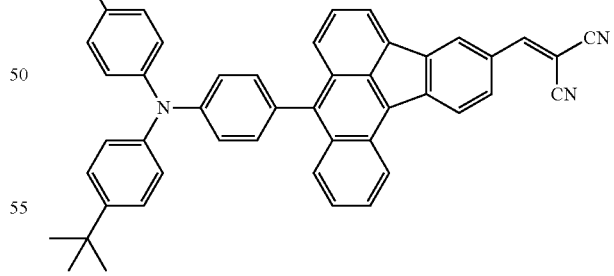

41
-continued
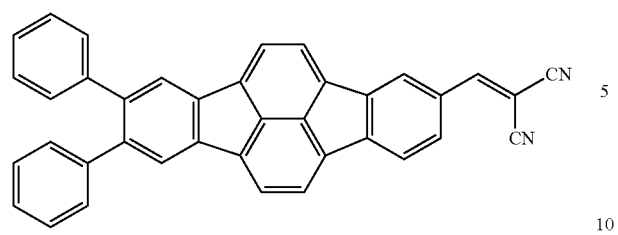
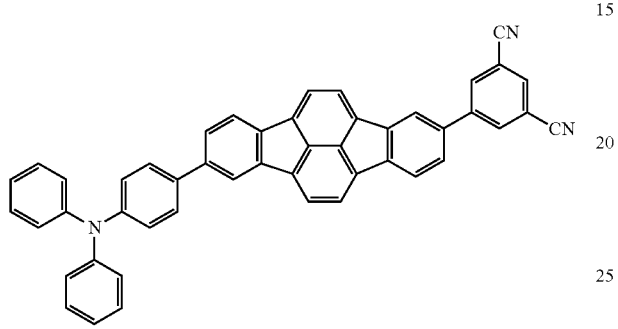
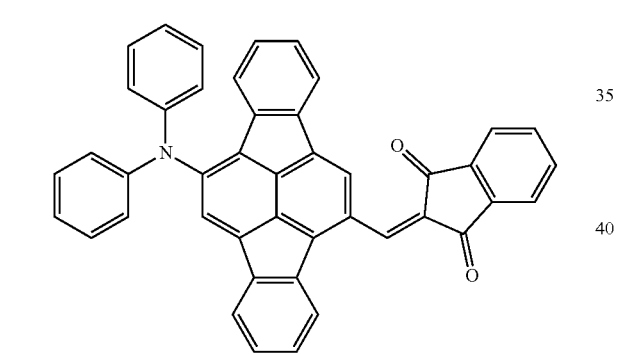
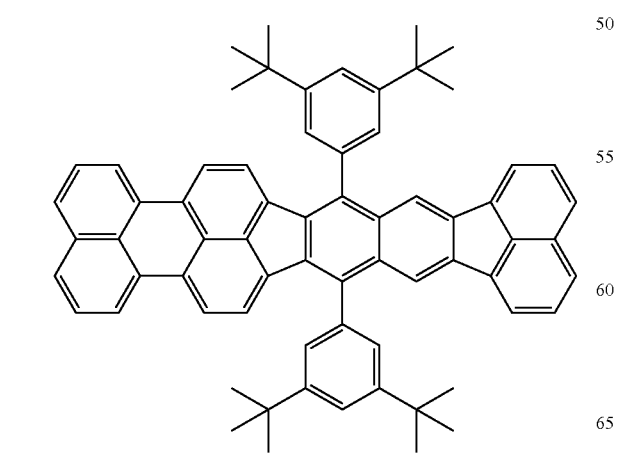
42
-continued
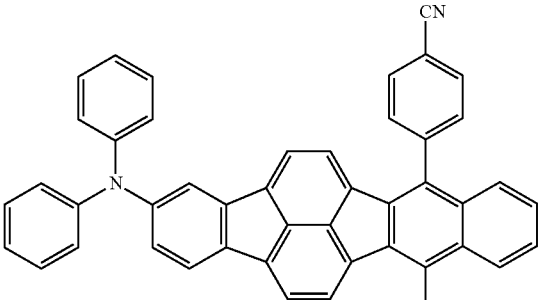
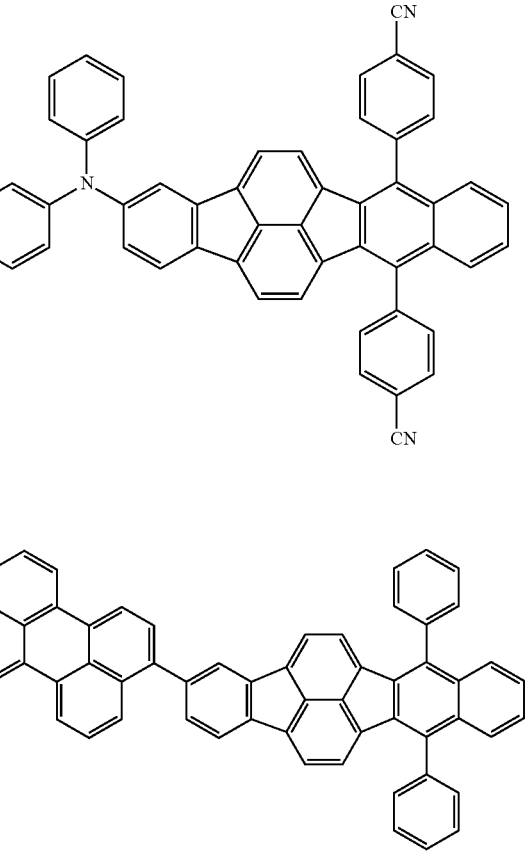
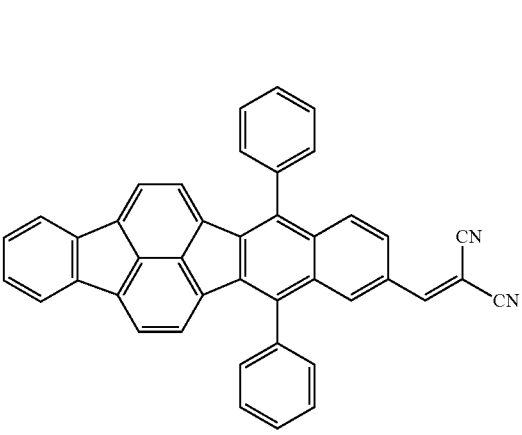
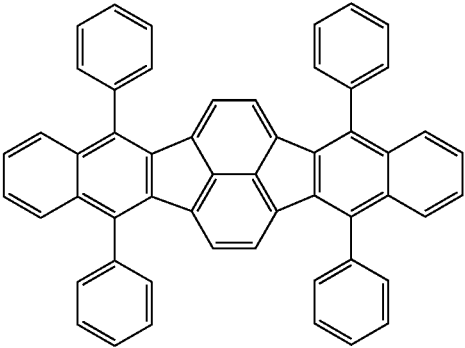

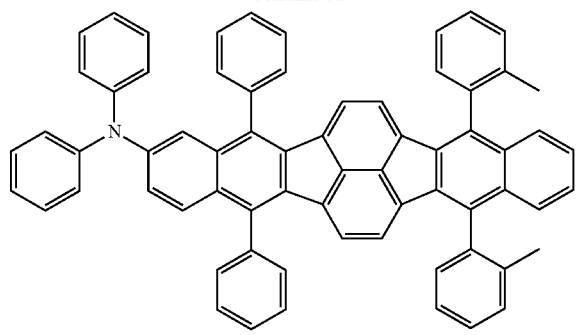
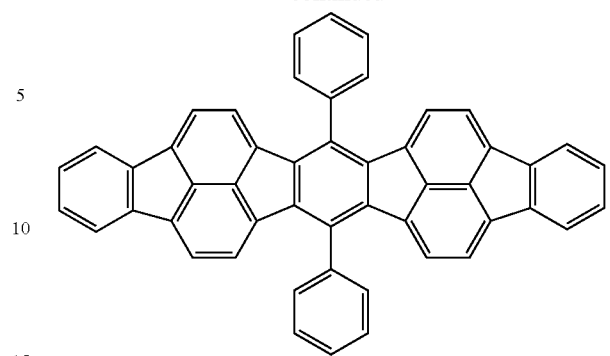
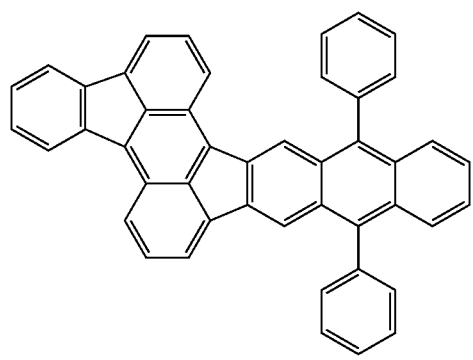
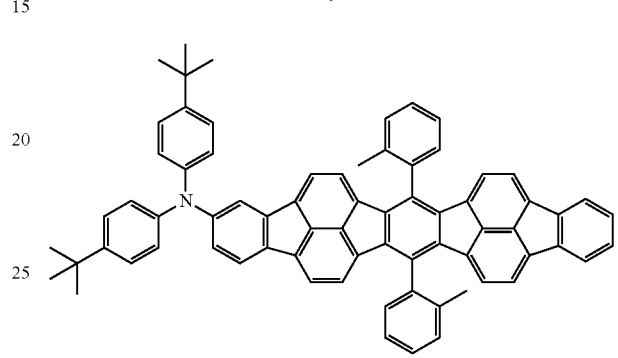
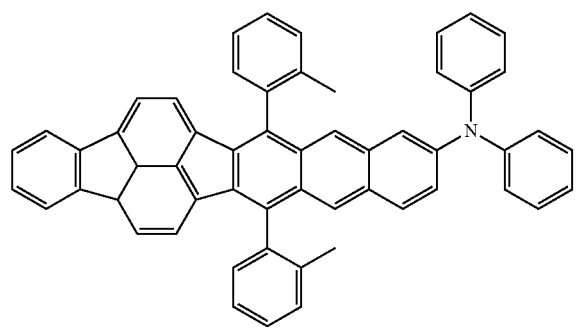
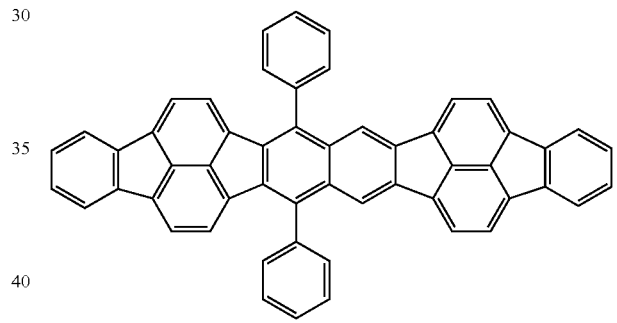
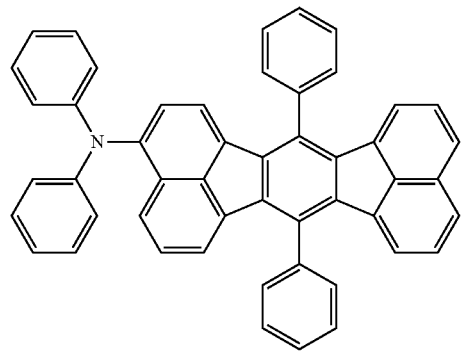
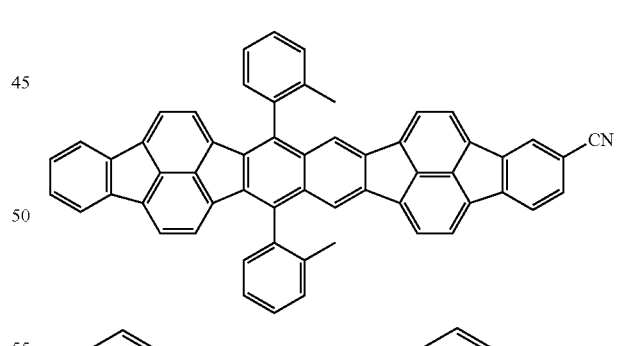
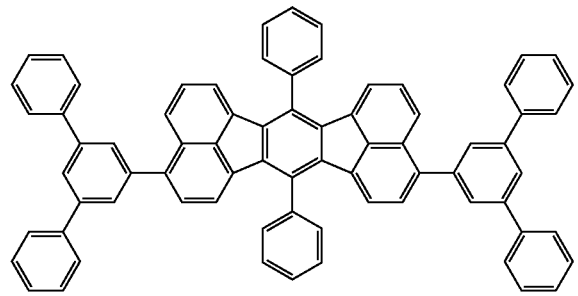
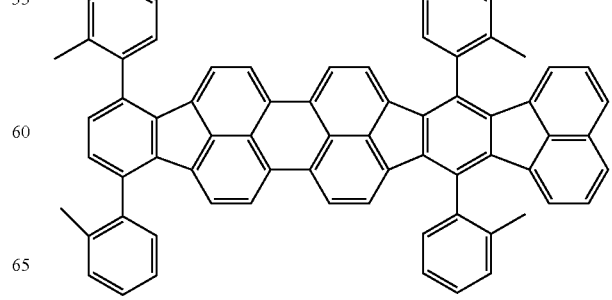

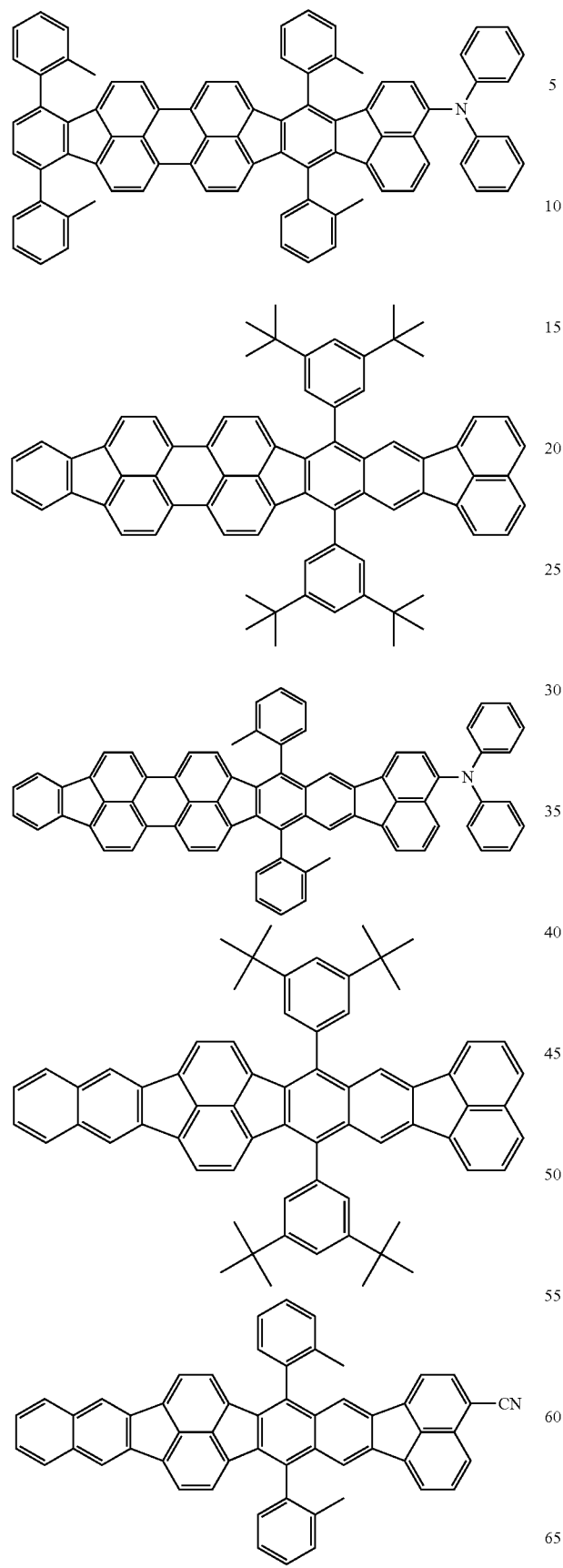

-continued
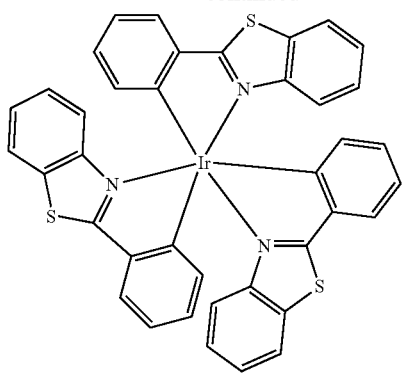
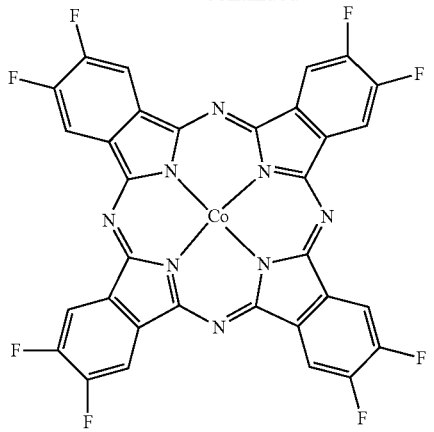
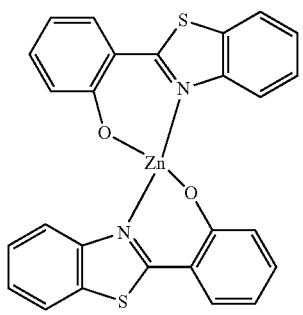
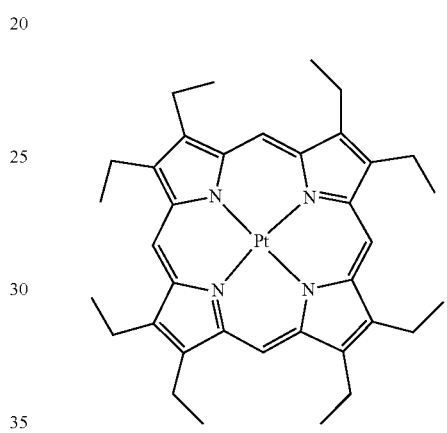
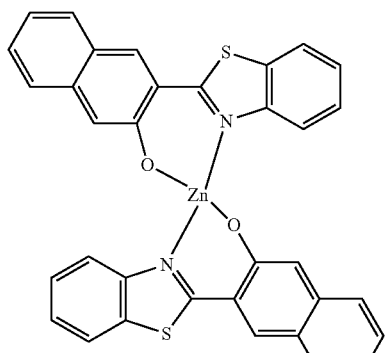
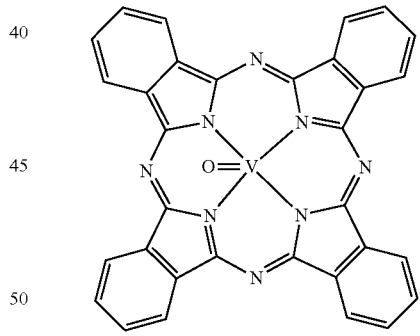
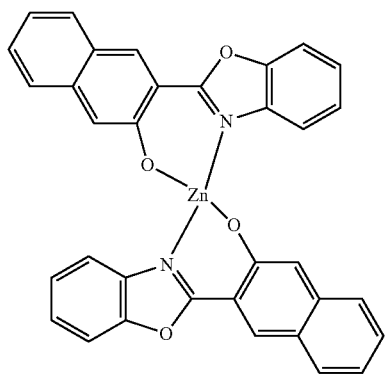
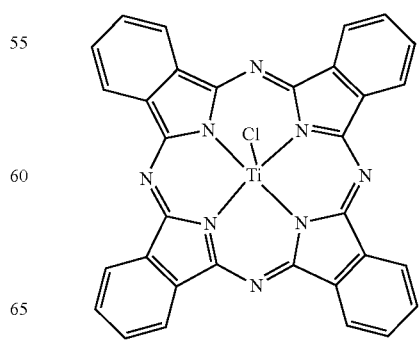

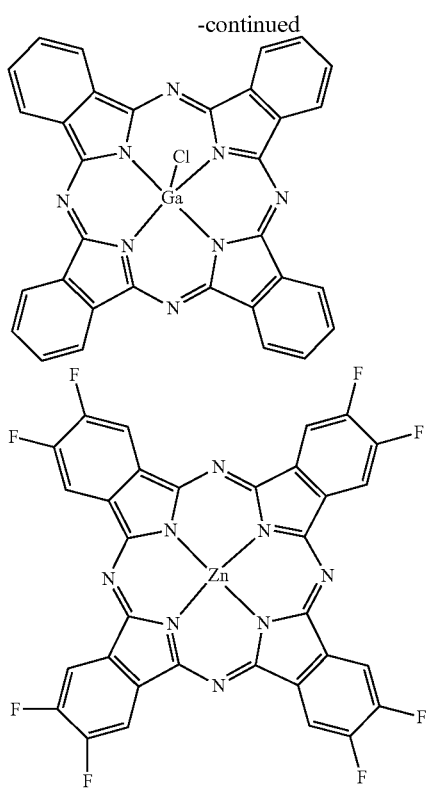

(n-Type Semiconductor)

The n-type semiconductor to be used in the present invention is an electron-accepting organic semiconductor material, and is an organic compound having a property of being likely to accept an electron. Examples of the n-type semiconductor include a fullerene-based compound, a metal complex-based compound, a phthalocyanine-based compound, and a carboxylic acid diimide-based compound, and it is preferred that a fullerene or a fullerene derivative be contained as the n-type semiconductor. When fullerene molecules or fullerene derivative molecules are arranged in a row in the first organic semiconductor layer, an electron transporting path is formed. Therefore, an electron transporting property is improved, and high-speed responsiveness of the photoelectric conversion element is improved. Among the fullerene molecules and the fullerene derivative molecules, fullerene C60 is particularly preferred because fullerene C60 is likely to form an electron transporting path. When the total amount of the photoelectric conversion layer is 100 mass %, it is preferred that the content of the fullerene or the fullerene derivative be 40 mass % or more and 85 mass % of less from the viewpoint of satisfactory photoelectric conversion characteristics.

Examples of the fullerene or the fullerene derivative include fullerene C60, fullerene C70, fullerene C76, fullerene C78, fullerene C80, fullerene C82, fullerene C84, fullerene C90, fullerene C96, fullerene C240, fullerene 540, mixed fullerene, and fullerene nanotubes.

The fullerene derivative has a substituent in a fullerene. Examples of the substituent include an alkyl group, an aryl group, and a heterocyclic group.

(Near-Infrared Absorbing Material)

In a photoelectric conversion element having a ternary configuration, a sensitivity region can be made near-infrared through use of a compound having an absorption band in a near-infrared region. In this case, as any one of the first, second, and third organic semiconductors, a compound having an absorption band in the near-infrared region may be contained. The near-infrared region generally refers to a wavelength band of from 800 nm to 2,500 nm, and the following compounds have been known as absorbing materials using organic materials.

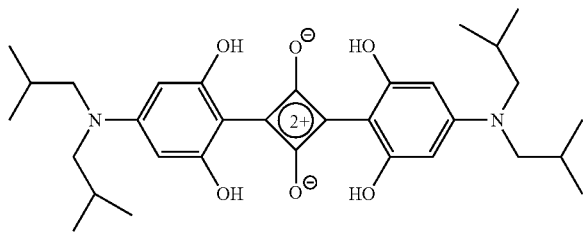

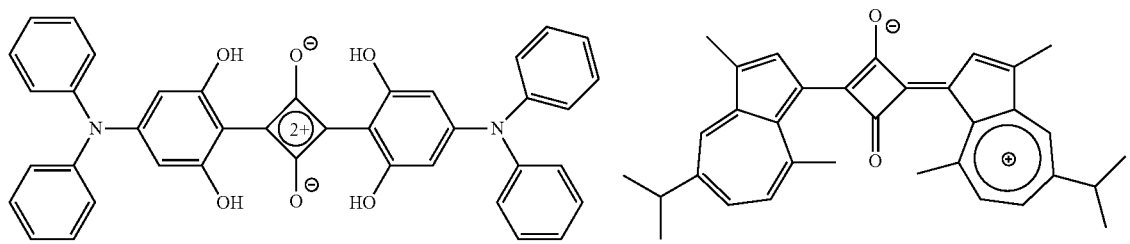

51
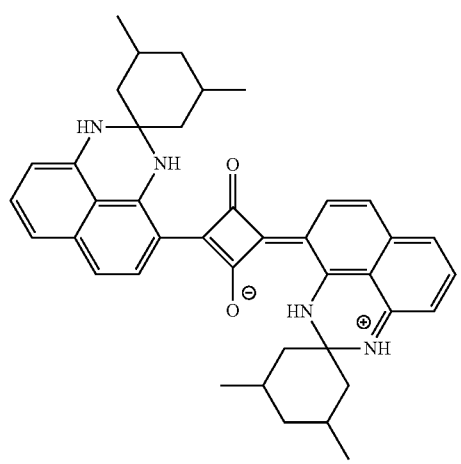
52
-continued
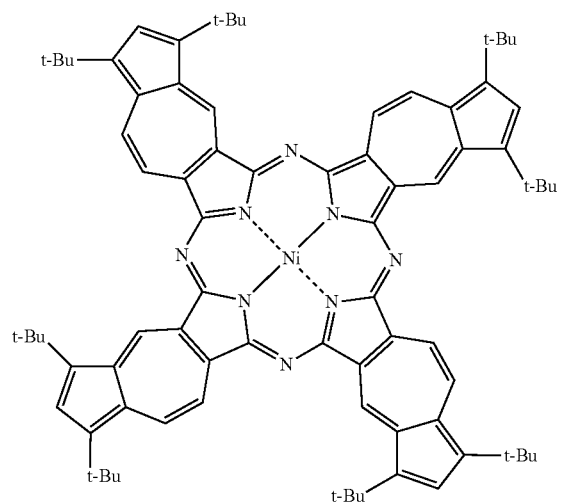
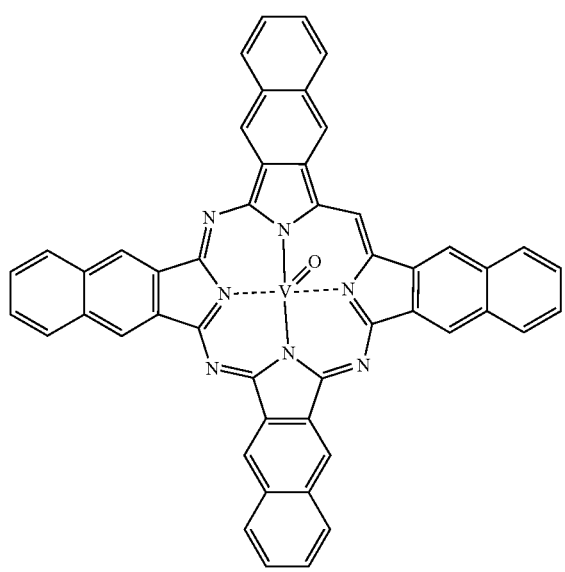
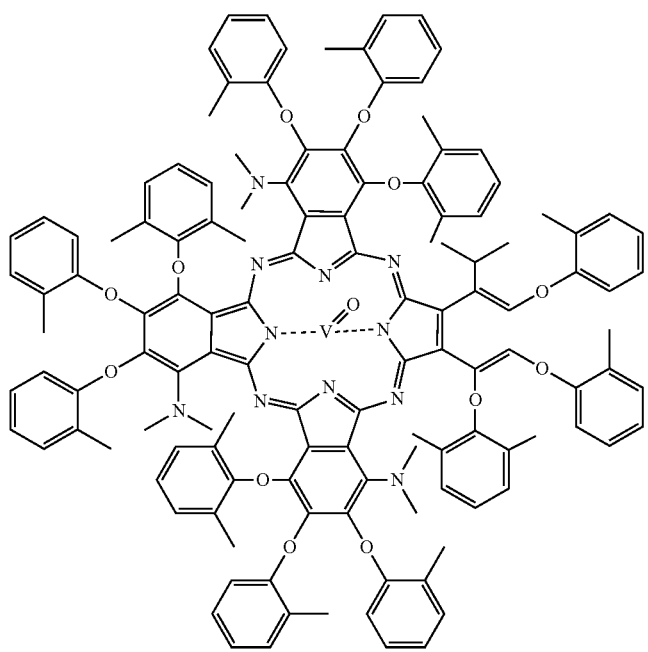

-continued
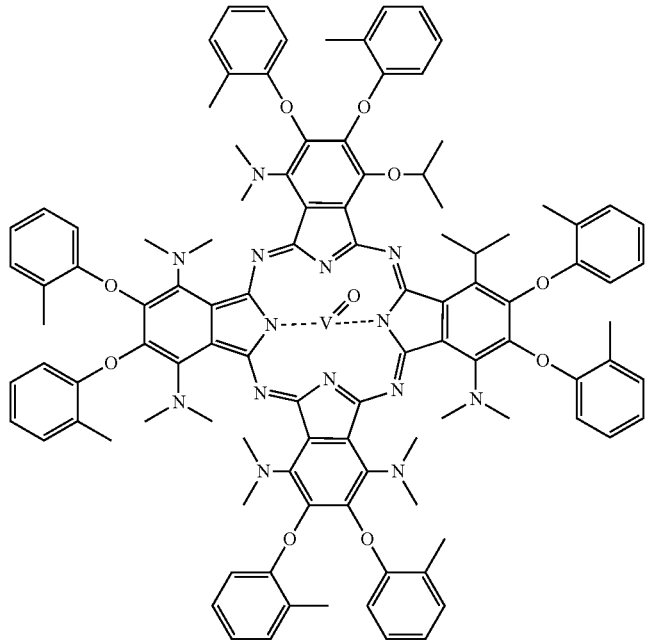
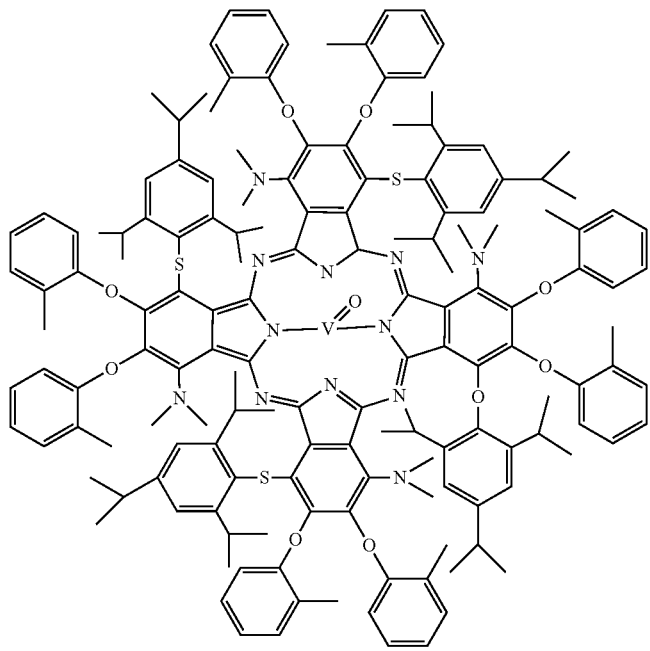
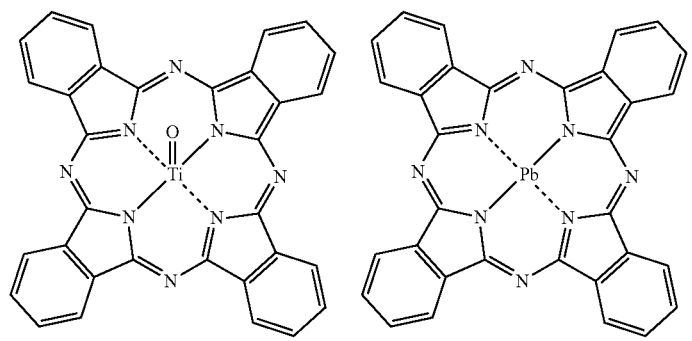

-continued

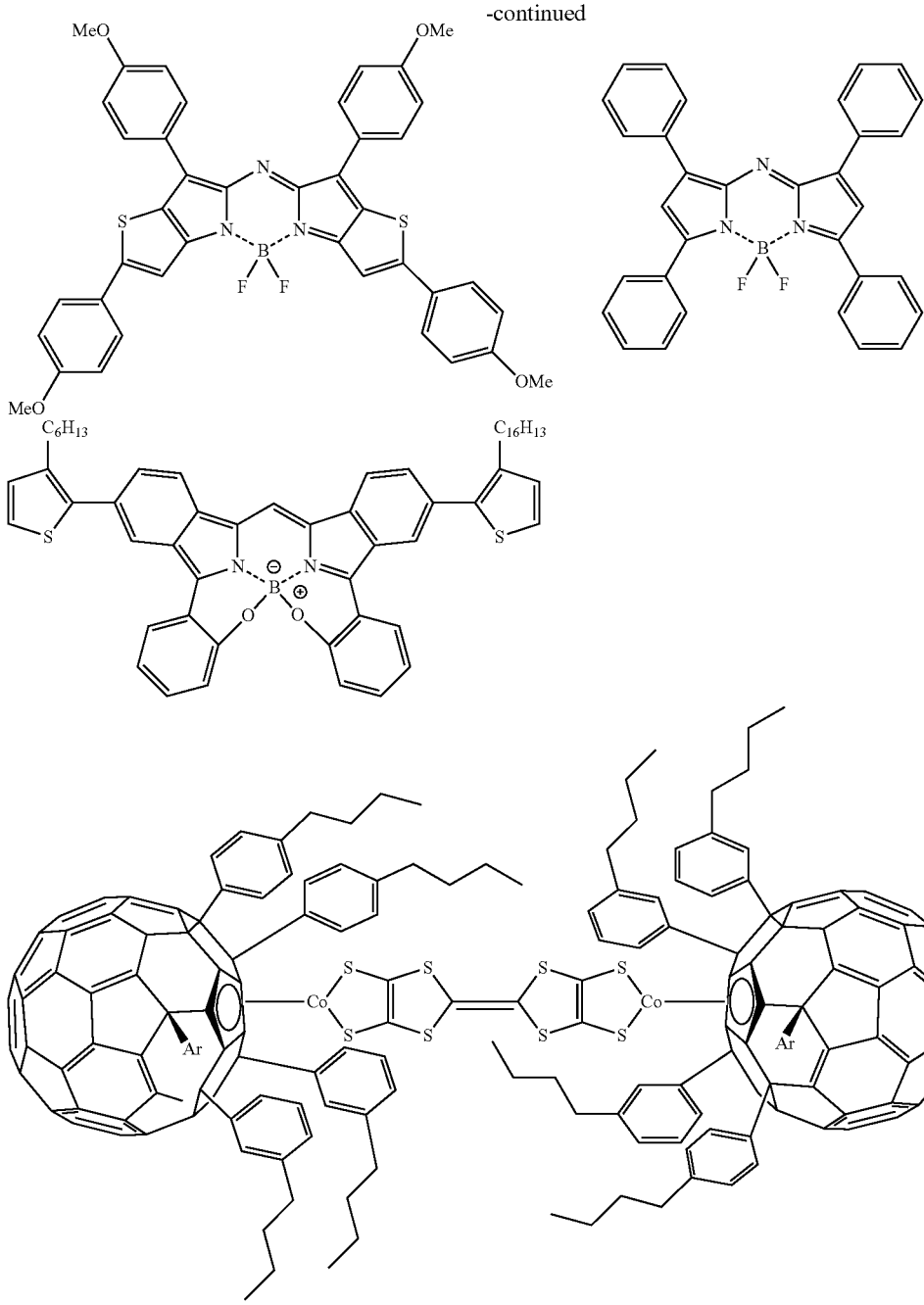

A material having absorption in a near-infrared region has a small bandgap, and hence ΔE illustrated in FIG. 1 is likely to be small, with the result that a dark current tends to increase. Therefore, in a photoelectric conversion element containing a material having absorption in a near-infrared region, it is preferred that the above-mentioned SP value relationship be applied between the organic semiconductors to be used to reduce a dark current.

It is preferred that the photoelectric conversion layer in the present invention be a non-emission type. The non-emission type means that the emission quantum efficiency in a visible light region (wavelength: 400 nm to 730 nm) is 1% or less, preferably 0.5% or less, more preferably 0.1% or less. It is not preferred that the emission quantum efficiency exceed 1% in the photoelectric conversion layer because sensing performance or image pickup performance is influenced when such photoelectric conversion layer is applied to a sensor or an image pickup element. The emission quantum yield refers to a ratio of photons to be released by luminescence with respect to photons to be absorbed. The emission quantum efficiency can be determined by manufacturing a thin film having the same material composition as that of the photoelectric conversion layer as a sample on a substrate such as quartz glass, and measuring the sample through use of an absolute PL quantum efficiency spectrometer designed so as to determine a value of a thin film. For example, as the absolute quantum yield spectrometer, "C9920-02" manufactured by Hamamatsu Photonics K.K. can be used.

(Photoelectric Conversion Element)

Figure 7:
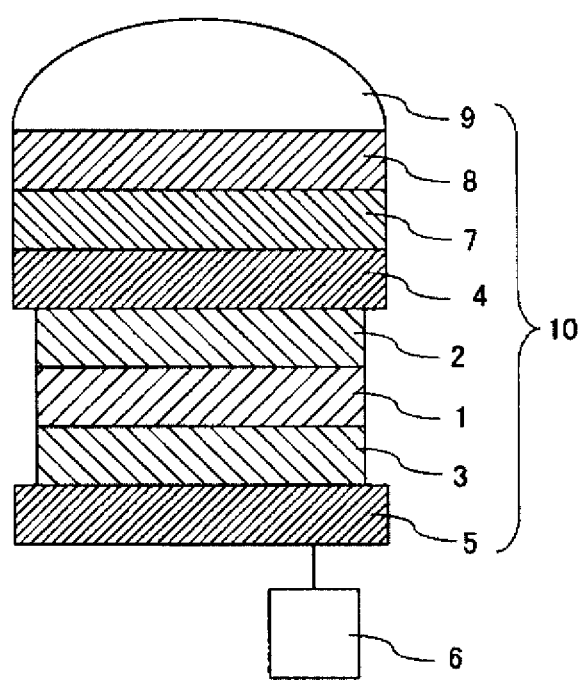
FIG. 7 is a schematic sectional view of a photoelectric conversion element according to one embodiment of the present invention.

FIG. 7 is a sectional view for schematically illustrating a configuration of a photoelectric conversion element according to one embodiment of the present invention. The photoelectric conversion element of the present invention includes at least an anode 5, a cathode 4, and a photoelectric conversion layer 1 serving as a first organic compound layer arranged between the anode 5 and the cathode 4, and the photoelectric conversion layer 1 has the above-mentioned particular organic semiconductor composition. A photoelectric conversion element 10 according to this embodiment is an example including a second organic compound layer 2 and a third organic compound layer 3 with the photoelectric conversion layer 1 interposed therebetween.

The cathode 4 forming the photoelectric conversion element 10 according to this embodiment is an electrode configured to collect holes generated in the photoelectric conversion layer 1 arranged between the anode 5 and the cathode 4. In addition, the anode 5 is an electrode configured to collect electrons generated in the first photoelectric conversion layer 1 arranged between the anode 5 and the cathode 4. The cathode 4 is also called "hole-collecting electrode", and the anode 5 is also called "electron-collecting electrode". Any one of the cathode 4 and the anode 5 may be arranged on the substrate side. The electrode arranged on the substrate side is also called a lower electrode.

The photoelectric conversion element according to this embodiment may be an element to be used by applying a voltage between the cathode 4 and the anode 5.

As a constituent material for the cathode 4, there is no particular limitation on the material as long as the material has high conductivity and transparency. Specific examples thereof include a metal, a metal oxide, a metal nitride, a metal boride, an organic conductive compound, and a mixture obtained by combining two or more kinds thereof. More specific examples thereof include: conductive metal oxides, such as antimony-doped or fluorine-doped tin oxide (ATO or FTO), tin oxide, zinc oxide, indium oxide, indium tin oxide (ITO), and indium zinc oxide; metal materials, such as gold, silver, chromium, nickel, titanium, tungsten, and aluminum; conductive compounds, such as oxides or nitrides of these metal materials (e.g., titanium nitride (TiN)); mixtures or laminates of these metals and the conductive metal oxides; inorganic conductive substances, such as copper iodide and copper sulfide; organic conductive materials, such as polyaniline, polythiophene, and polypyrrole; and laminates of these substances or materials and ITO or titanium nitride. The constituent material for the cathode 4 is particularly preferably a material selected from titanium nitride, molybdenum nitride, tantalum nitride, and tungsten nitride.

As a constituent material for the anode 5, there are specifically given, for example, ITO, indium zinc oxide, $SnO_2$, antimony-doped tin oxide (ATO), ZnO, Al-doped zinc oxide (AZO), gallium-doped zinc oxide (GZO), $TiO_2$, and fluorine-doped tin oxide (FTO).

A method of forming each of the electrodes may be appropriately selected in consideration of its suitability with an electrode material. Specifically, the electrodes can be formed by, for example, a printing system, a wet system, such as a coating system, a physical system, such as a vacuum deposition method, a sputtering method, or an ion plating method, or a chemical system, such as CVD or a plasma CVD method.

When the electrode is made of ITO, the electrode can be formed by an electron beam method, a sputtering method, a resistance heating deposition method, a chemical reaction method (for example, a sol-gel method), application of a dispersed substance of ITO, or the like. Further, the formed ITO can be subjected to UV-ozone treatment, plasma treatment, or the like. When the electrode is made of TiN, various methods, such as a reactive sputtering method, are used, and further annealing treatment, UV-ozone treatment, plasma treatment, or the like can be performed.

In this embodiment, the second organic compound layer 2 may be formed of one layer, a plurality of layers, or a mixed layer containing a plurality of kinds of materials. In the photoelectric conversion element 10 of FIG. 7, the second organic compound layer 2 serves to transport holes transferred from the photoelectric conversion layer 1 to the hole-collecting electrode 4. In addition, the second organic compound layer 2 is configured to suppress transfer of electrons from the hole-collecting electrode 4 to the photoelectric conversion layer 1. Specifically, the second organic compound layer 2 is a preferred constituent member from the viewpoint of functioning as a hole transporting layer or an electron blocking layer to prevent generation of a dark current. Thus, it is preferred that the second organic compound layer 2 have small electron affinity or LUMO energy.

In addition, in this embodiment, the third organic compound layer 3 serves to transport electrons transferred from the photoelectric conversion layer 1 to the anode 5. In addition, the third organic compound layer 3 is a hole blocking layer configured to suppress inflow of holes from the anode 5 to the photoelectric conversion layer 1. Therefore, it is preferred that the third organic compound layer 3 be a layer having a high ionization potential. The third organic compound layer 3 may be formed of one layer, a plurality of layers, or a mixed layer containing a plurality of kinds of materials.

In the present invention, the layers arranged between the anode 5 and the cathode 4 are not limited to the above-mentioned three kinds of layers (photoelectric conversion layer 1, second organic compound layer 2, third organic compound layer 3). An interposition layer can be further formed at least between the second organic compound layer 2 and the cathode 4 or between the third organic compound layer 3 and the anode 5. The interposition layer is configured to improve injection efficiency of generated charge when the charge is injected through the electrode. Alternatively, the interposition layer is formed in order to prevent charge from being injected into the organic compound layer when charge is applied. When the interposition layer is formed, the interposition layer may be an organic compound layer, an inorganic compound layer, or a mixed layer in which an organic compound and an inorganic compound are mixed with each other.

The anode 5 in the photoelectric conversion layer 10 of FIG. 7 is connected to a reading circuit 6, but the reading circuit 6 may be connected to the cathode 4. The reading circuit 6 serves to read information based on charge generated in the photoelectric conversion layer 1, and notify, for example, a signal processing circuit (not shown) arranged in a later stage of the information. The reading circuit 6 includes, for example, a transistor configured to output a signal based on the charge generated in the photoelectric conversion element 10.

In the photoelectric conversion element 10 of FIG. 7, an inorganic protective layer 7 is arranged on the cathode 4. The inorganic protective layer 7 is a layer configured to protect a member in which the anode 5, the third organic compound layer 3, the photoelectric conversion layer 1, the second organic compound layer 2, and the cathode 4 are laminated in the stated order. As a constituent material for the inorganic protective layer 7, there are given silicon oxide, silicon nitride, silicon oxynitride, an aluminum oxide, and the like. Silicon oxide, silicon nitride, and silicon oxynitride can be formed by a sputtering method or a CVD method, and the aluminum oxide can be formed by an atomic layer deposition method (ALD method). As the sealing performance of the inorganic protective layer 7, it is only required that water permeability be $10^{-5}$ g/m$^2$·day or less. In addition, the film thickness of the inorganic protective layer 7 is not particularly limited, but is preferably 0.5 μm or more from the viewpoint of sealing performance. Meanwhile, the inorganic protective layer 7 is preferably thinner as long as the sealing performance can be kept, and it is particularly preferred that the film thickness be 1 μm or less. The reason why the inorganic protective layer 7 is preferably thinner is as follows. When elements are arrayed two-dimensionally and used as an area sensor, the effect of reducing color mixing is exhibited as the distance from the photoelectric conversion layer to a color filter 8 can be shortened.

In the photoelectric conversion element 10 of FIG. 7, the color filter 8 is arranged on the inorganic protective layer 7. As the color filter 8, there is given, for example, a color filter configured to transmit red light in visible light. In addition, in the present invention, one color filter 8 may be provided to each photoelectric conversion element or may be provided to a plurality of photoelectric conversion elements. Further, when the color filter 8 is arrayed, the color filter 8 may form, for example, a Bayer array together with an adjacent photoelectric conversion element.

In the photoelectric conversion element 10 of FIG. 7, an optical member may be arranged on the color filter 8, and a microlens 9 is arranged as the optical member in FIG. 7. The microlens 9 serves to condense incident light to the photoelectric conversion layer 1 that is a photoelectric conversion unit. In addition, in the present invention, one microlens 9 may be provided to one photoelectric conversion element or may be provided to a plurality of photoelectric conversion elements. In the present invention, it is preferred that one microlens 9 be provided to one photoelectric conversion element.

In FIG. 7, the microlens 9 is arranged on the cathode 4 side to define a light incident side. However, the present invention is not limited thereto. The inorganic protective layer 7, the color filter 8, and the microlens 9 may be provided on the anode 5 side. In this case, preferred electrode materials for the cathode 4 and the anode 5 described above are reversed.

In addition, although not shown in FIG. 7, the photoelectric conversion element of the present invention may include a substrate. As the substrate, there are given, for example, a silicon substrate, a glass substrate, and a flexible substrate. There is no limitation regarding which of the anode 5 and the cathode 4 is arranged on the substrate side. The anode 5, the photoelectric conversion layer 1, and the cathode 4 may be arranged in the stated order on the substrate, or the cathode 4, the photoelectric conversion layer 1, and the anode 5 may be arranged in the stated order on the substrate.

The foregoing is the main configuration of the photoelectric conversion element. Actually, it is preferred that the photoelectric conversion element be annealed after being manufactured, but the present invention is not particularly limited by the annealing condition.

The photoelectric conversion element according to the present invention can be configured as a photoelectric conversion element adaptable to light of a different color by selecting an organic semiconductor to be used in the photoelectric conversion layer 1. Being adaptable to a different color means that the wavelength region of light to be subjected to photoelectric conversion by the photoelectric conversion layer 1 is changed.

In addition, when a plurality of photoelectric conversion elements adaptable to different colors are laminated, a photoelectric conversion apparatus that does not require the color filter 8 can also be obtained.

Figure 8:
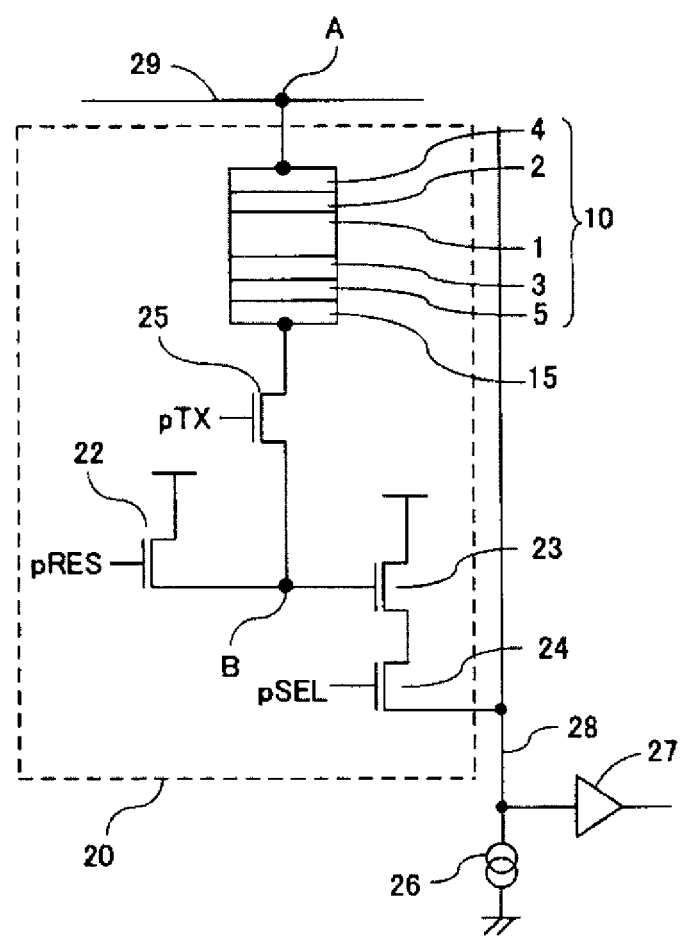
FIG. 8 is an equivalent circuit diagram of one example of a pixel including the photoelectric conversion element illustrated in FIG. 7.

FIG. 8 is an equivalent circuit diagram of one pixel 20 using the photoelectric conversion element 10 of FIG. 7. A lower layer of the anode 5 of the photoelectric conversion element 10 is electrically connected to a charge accumulating unit 15 formed in a semiconductor substrate, and is further connected to an amplification transistor 23. A pixel circuit includes the amplification transistor (SF MOS) 23 configured to amplify a signal from the photoelectric conversion element 10, a selection transistor (SEL MOS) 24 configured to select a pixel, and a reset transistor (RES MOS) 22 configured to reset a node B.

With such configuration, the amplification transistor 23 can output the signal generated in the photoelectric conversion element 10. The photoelectric conversion element 10 and the amplification transistor 23 may be short-circuited to each other. As illustrated in FIG. 8, a transfer transistor 25 may be arranged as a switch in an electric path between the photoelectric conversion element 10 and the amplification transistor 23. The transfer transistor 25 is controlled so as to be switched on or off with a switching control pulse pTX. In the pixel configuration of FIG. 8, there is illustrated the node B representing electric connection between the photoelectric conversion element 10 and the amplification transistor 23. The node B is configured so as to be electrically floated. When the node B is electrically floated, the voltage of the node B may be changed in accordance with the charge generated in the photoelectric conversion element 10. Thus, a signal in accordance with the charge generated in the photoelectric conversion element 10 can be input to the amplification transistor 23.

The pixel configuration of FIG. 8 includes the reset transistor 22 configured to reset the voltage of the node B in the semiconductor substrate. The reset transistor 22 is configured to supply a reset voltage (not shown) to the node B. The reset transistor 22 is controlled to as to be switched on or off with a reset control pulse pRES. When the reset transistor 22 is switched on, the reset voltage is supplied to the node B. The charge accumulating unit 15 is a region in which the charge generated in the photoelectric conversion element 10 is accumulated and is configured by forming a p-type region and an N-type region in the semiconductor substrate.

A drain electrode of the amplification transistor 23 is supplied with a power supply voltage. A source electrode of the amplification transistor 23 is connected to an output line 28 through the selection transistor 24. The output line 28 is connected to a current source 26. The amplification transistor 23 and the current source 26 form a pixel source follower circuit, and are configured to output a signal voltage of the charge accumulating unit 15 in which the signal charge from the photoelectric conversion element 10 is accumulated to the output line 28. The output line 28 is further connected to a column circuit 27. A signal from the pixel 20 output to the output line 28 is input to the column circuit 27. In FIG. 8, there is illustrated wiring 29.

(Photoelectric Conversion Apparatus)

Figure 9:
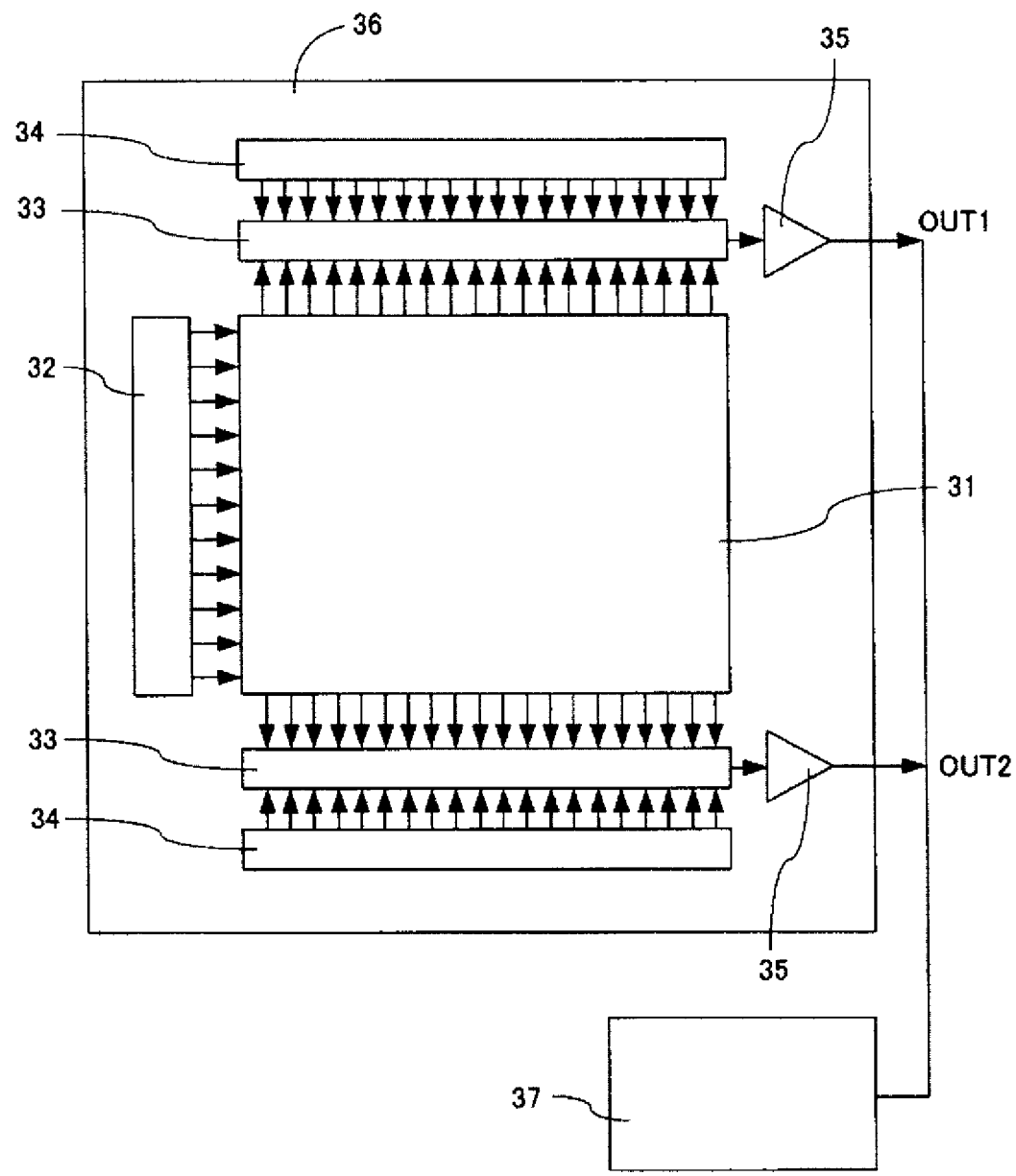
FIG. 9 is a plan view for schematically illustrating a configuration of a photoelectric conversion apparatus using the photoelectric conversion element of the present invention.

FIG. 9 is a plan view for schematically illustrating a configuration of a photoelectric conversion apparatus according to one embodiment using the photoelectric conversion element of the present invention. The photoelectric conversion apparatus according to this embodiment includes an image pickup region 31, a vertical scanning circuit 32, two reading circuits 33, two horizontal scanning circuits 34, and two output amplifiers 35. A region other than the image pickup region 31 corresponds to a circuit region 36.

The image pickup region 31 has a configuration in which a plurality of pixels are arrayed two-dimensionally. As a pixel structure, the structure of the pixel 20 illustrated in FIG. 7 can be appropriately used. In addition, the pixel 20 may be configured by laminating the above-mentioned photoelectric conversion elements 10 of the present invention. Each of the reading circuits 33 includes, for example, a column amplifier, a CDS circuit, and an addition circuit, and performs the amplification, addition, and the like of a signal read out from a pixel in a row selected by the vertical scanning circuit 32 through a vertical signal line (28 of FIG. 8). The column amplifier, the CDS circuit, the addition circuit, and the like are arranged in, for example, each pixel column or each plurality of pixel columns. The horizontal scanning circuits 34 produce signals for reading out the signals of the reading circuits 33 in order. The output amplifiers 35 amplify and output the signals of columns selected by the horizontal scanning circuits 34.

The foregoing configuration is merely a configuration example of the photoelectric conversion apparatus, and this embodiment is not limited thereto. The reading circuits 33, the horizontal scanning circuits 34, and the output amplifiers 35 are vertically arranged one by one across the image pickup region 31 in order that two output paths may be formed. However, three or more output paths may be arranged. Signals output from the respective output amplifiers are synthesized as an image signal in a signal processing portion 37.

(Optical Area Sensor)

The photoelectric conversion elements of the present invention arranged two-dimensionally in an in-plane direction can be used as a constituent member of an optical area sensor. The optical area sensor includes a plurality of photoelectric conversion elements arranged two-dimensionally in an in-plane direction. In such configuration, signals based on the charge generated in the plurality of photoelectric conversion elements are individually output, and thus information indicating a distribution of light intensity in a predetermined light receiving area can be obtained. The photoelectric conversion elements included in the optical area sensor may be replaced by the above-mentioned photoelectric conversion apparatus.

(Image Pickup Element)

Further, the photoelectric conversion element of the present invention can be used as a constituent member of an image pickup element. The image pickup element includes a plurality of pixels (light receiving pixels). The plurality of pixels are arranged in a matrix including a plurality of rows and a plurality of columns. In such configuration, a signal from each of the pixels is output as one pixel signal, and thus an image signal can be obtained. In the image pickup element, the plurality of light receiving pixels each include at least one photoelectric conversion element and a reading circuit connected to the photoelectric conversion element. The reading circuit includes, for example, a transistor configured to output a signal based on the charge generated in the photoelectric conversion element. The information based on the read charge is transmitted to a sensor unit connected to the image pickup element. As the sensor unit, there are given a CMOS sensor and a CCD sensor. In the image pickup element, the information acquired from each of the pixels is collected into the sensor unit, thereby being capable of obtaining an image.

The image pickup element may include, for example, optical filters, such as color filters, so that the optical filters correspond to the light receiving pixels, respectively. When the photoelectric conversion element is adaptable to light having a particular wavelength, it is preferred that the image pickup element include a color filter configured to transmit light in a wavelength region to which the photoelectric conversion element is adaptable. One color filter may be provided to one light receiving pixel or may be provided to a plurality of light receiving pixels. The optical filter included in the image pickup element is not limited to the color filter, and instead of the color filter, a low-pass filter configured to transmit light having a wavelength of infrared light or more, a UV blocking filter configured to transmit light having a wavelength of ultraviolet light or less, a long-pass filter, or the like can be used.

The image pickup element may include optical members, such as microlenses, for example, so that the optical members correspond to the light receiving pixels, respectively. The microlens included in the image pickup element is a lens configured to condense light from outside to the photoelectric conversion layer forming the photoelectric conversion element included in the image pickup element. One microlens may be provided to one light receiving pixel or may be provided to a plurality of light receiving pixels. When a plurality of light receiving pixels are provided, it is preferred that one microlens be provided to the plurality of (predetermined number of two or more) light receiving pixels.

(Image Pickup Apparatus)

The photoelectric conversion element according to the present invention can be used in an image pickup apparatus. The image pickup apparatus includes an image pickup optical unit including a plurality of lenses and an image pickup element configured to receive light having passed through the image pickup optical unit, and uses the photoelectric conversion element of the present invention as the image pickup element. In addition, the image pickup apparatus may be an image pickup apparatus including a joint capable of being joined to the image pickup optical unit and the image pickup element. The image pickup apparatus as used herein more specifically refers to a digital camera, a digital still camera, and the like. The image pickup apparatus may be added to a mobile terminal. The mobile terminal is not particularly limited, and may be a smartphone, a tablet terminal, or the like.

In addition, the image pickup apparatus may further include a receiving unit configured to receive a signal from outside. The signal received by the receiving unit is a signal for controlling at least any one of an image pickup range, a start of image pickup, and an end of image pickup of the image pickup apparatus. In addition, the image pickup apparatus may further include a transmitting unit configured to transmit an image acquired by image pickup to outside. Thus, the image pickup apparatus can be used as a network camera by including the receiving unit and the transmitting unit.

EXAMPLES

Now, Examples of the present invention are described, but the present invention is not limited to the scope of the description in the following Examples.

Compounds used in Examples are illustrated below.

Compound 1
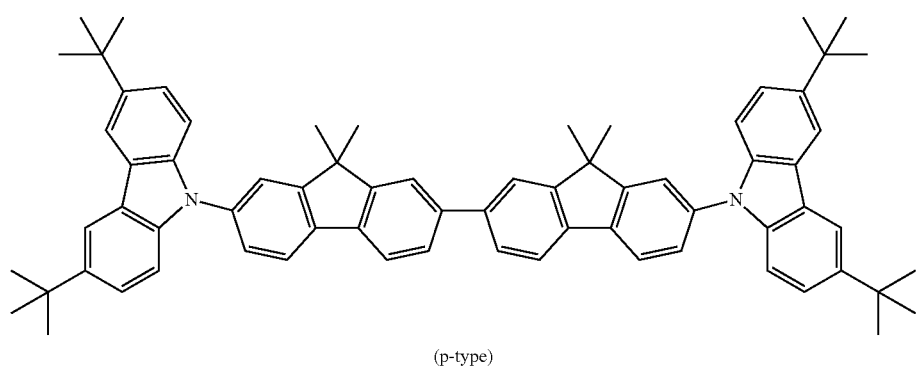
(p-type)
Compound 2
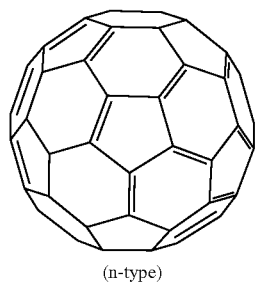
(n-type)
Compound 3
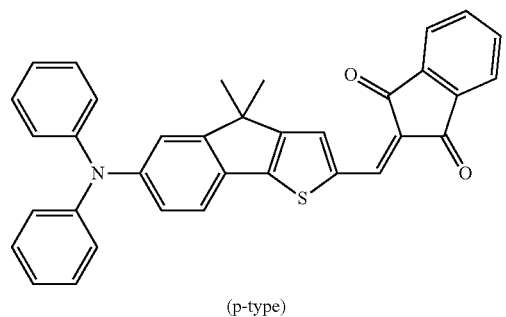
(p-type)
Compound 4
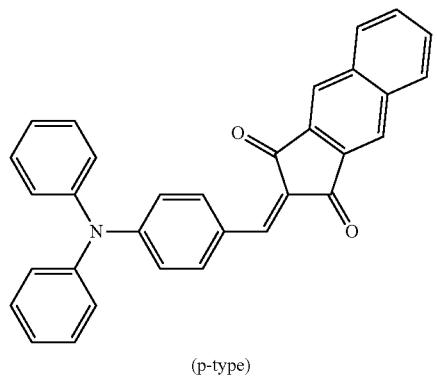
(p-type)
Compound 5
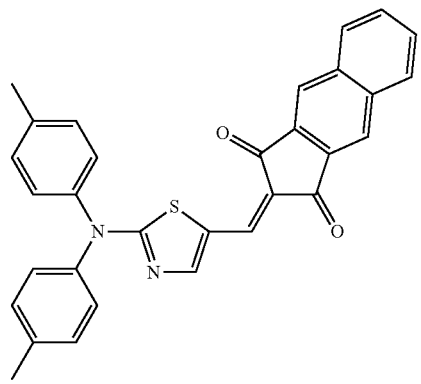
(p-type)
Compound 6
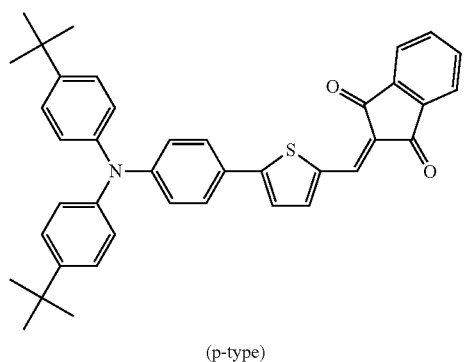
(p-type)
Compound 7
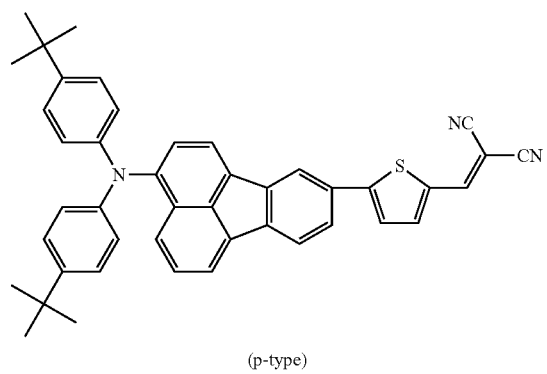
(p-type)

-continued
Compound 8
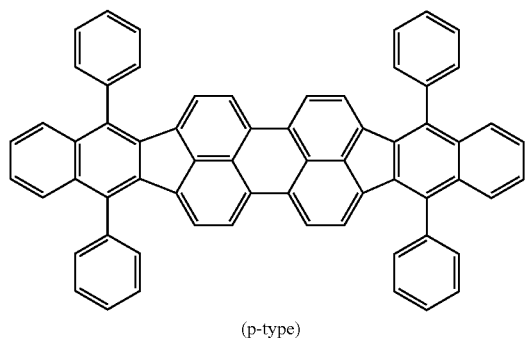
(p-type)
Compound 9
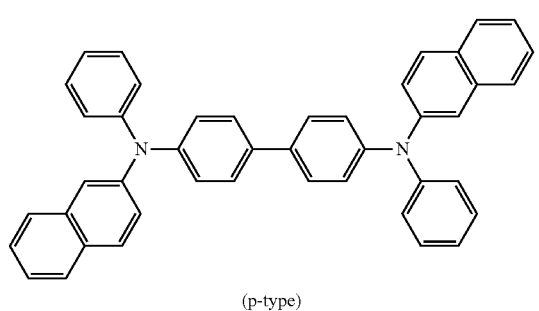
(p-type)
Compound 10
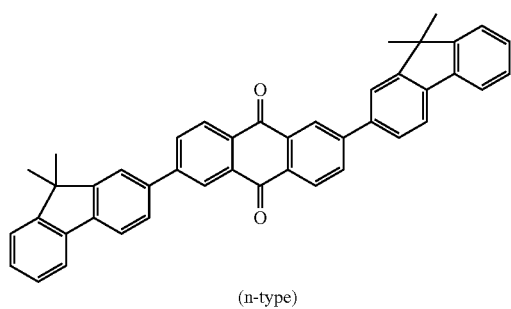
(n-type)
Compound 11
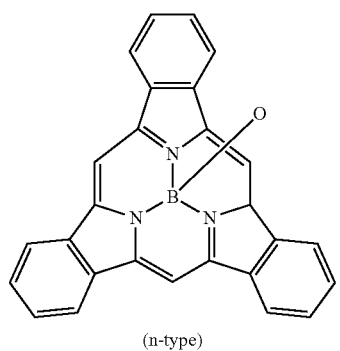
(n-type)
Compound 12
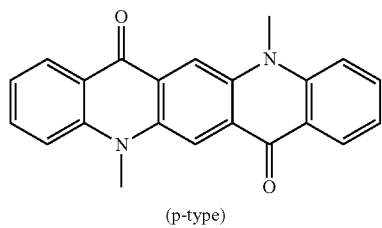
(p-type)
Compound 13
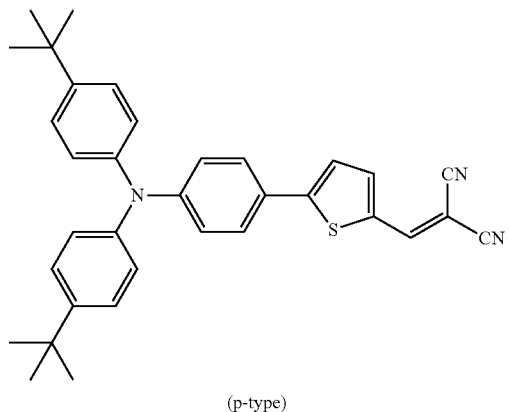
(p-type)
Compound 14
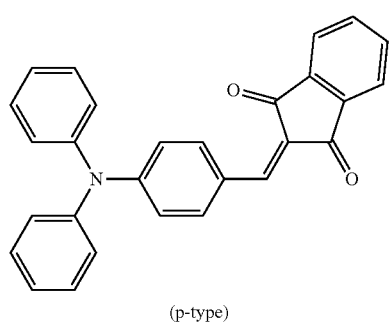
(p-type)
Compound 15
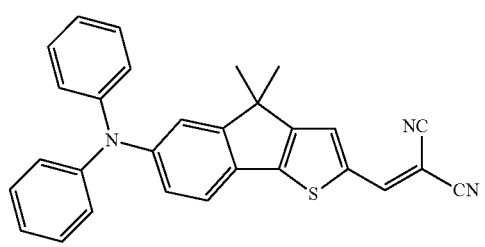

-continued

Compound 16

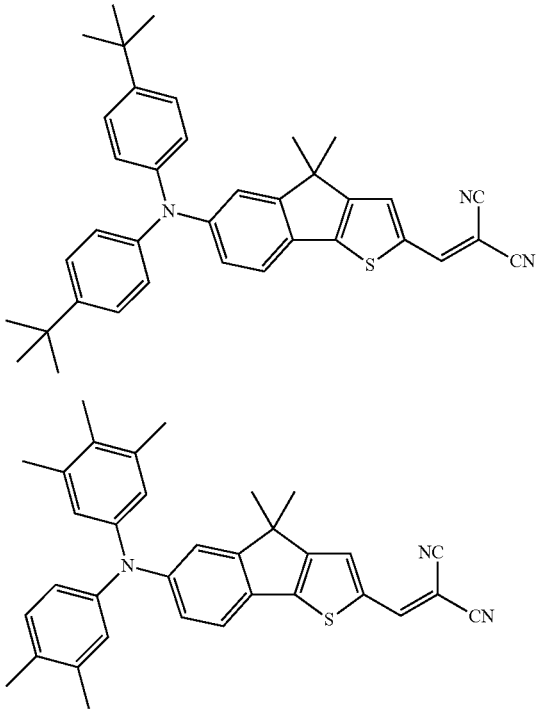

Compound 17

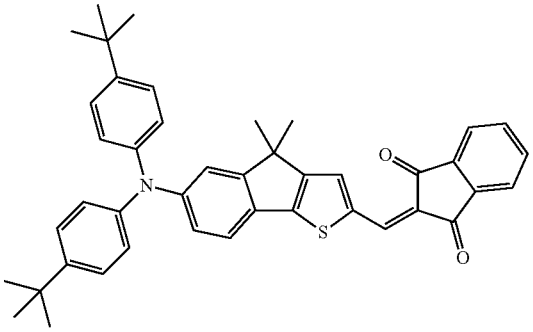

Compound 18

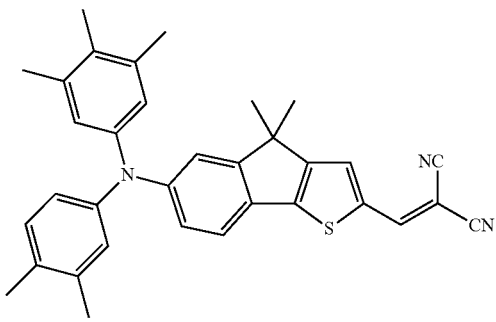

Electrochemical characteristics, such as oxidation potential, of the compounds used in Examples can be evaluated by cyclic voltammetry (CV).

Figure 10:
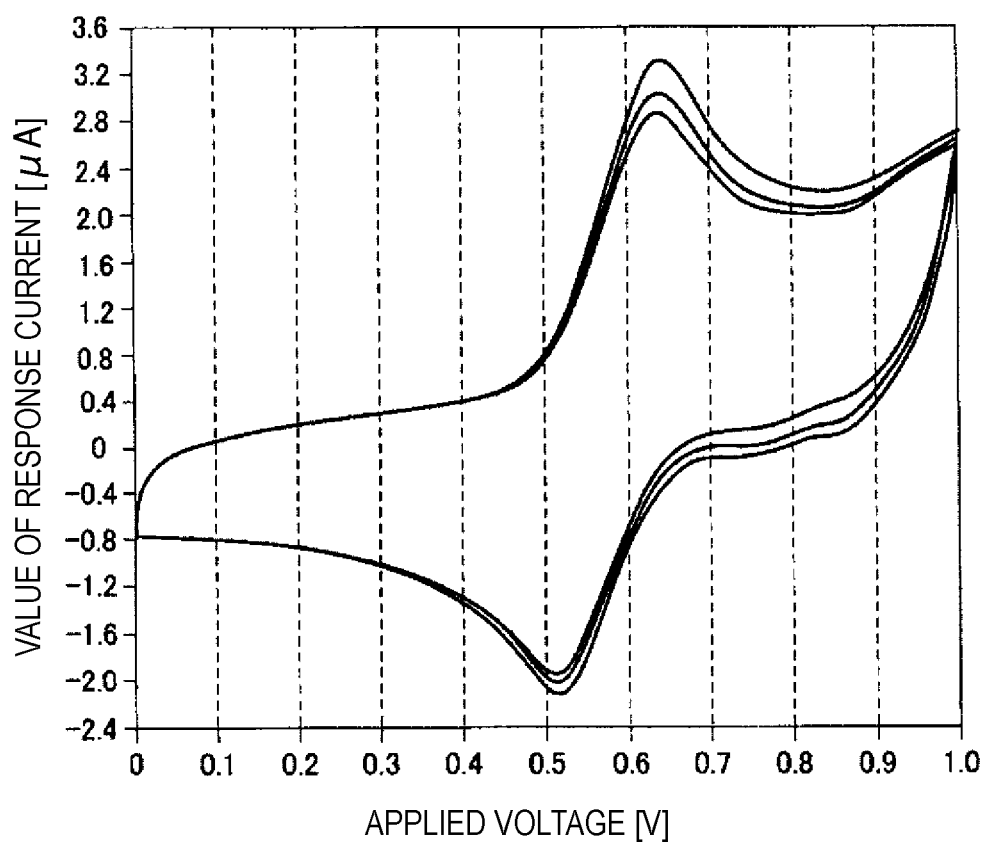
FIG. 10 is a graph for showing a waveform example at a time of determining an oxidation potential and a reduction potential of each of the organic semiconductors used in the present invention by cyclic voltammetry.

Each CV measurement sample was prepared by dissolving about 1 mg of each of the compounds in 10 mL of an orthodichlorobenzene solution of 0.1 M tetrabutylammonium perchlorate and subjecting the resultant to deaeration treatment with nitrogen. For measurement, a three-electrode method was used, and as each electrode, a non-aqueous medium-based Ag/Ag$^+$ reference electrode, a platinum counter electrode having a diameter of 0.5 mm and a length of 5 cm, and a glass-like carbon working electrode having an inner diameter of 3 mm were used (any of those electrodes are manufactured by BAS Inc.). As an apparatus, an electrochemical analyzer Model 660C manufactured by ALS Corporation was used, and a sweep rate of measurement was set to 0.1 V/s. Examples of waveforms in this case are shown in FIG. 10. An oxidation potential (Eox) and a reduction potential (Ered) can be measured by a similar method by changing biased polarity. In Table 2, an oxidation potential and a reduction potential of each material are shown.

TABLE 2

| Compound | Eox [V] | Ered [V] |
|---|---|---|
| Compound2 | — | −0.83 |
| Compound3 | 0.67 | −1.24 |
| Compound4 | 0.92 | −1.24 |
| Compound5 | 1.03 | −1.18 |
| Compound6 | 0.67 | −1.2 |
| Compound7 | 0.78 | −1.22 |
| Compound8 | 0.64 | −1.45 |

A cathode, an electron blocking layer (EBL), a photoelectric conversion layer, a hole blocking layer (HBL), and an anode were successively formed on an Si substrate to manufacture a photoelectric conversion element. In the electron blocking layer, the photoelectric conversion layer, and the hole blocking layer, the above-mentioned compounds 1 to 14 were used in combinations shown in Table 3. The manufacturing procedure is as follows.

First, an Si substrate was prepared. In the Si substrate, a wiring layer and an insulating layer are successively laminated, and a contact hole is formed in a portion corresponding to each pixel from the wiring layer by forming an opening in the insulating layer so as to obtain electric conduction. In the contact hole, a pad portion led to a substrate end through wiring is formed. An IZO electrode was formed so as to overlap with the contact hole portion, and desired patterning was performed to form an IZO electrode (cathode) of 3 mm$^2$. In this case, the film thickness of the IZO electrode was set to 100 nm. The electron blocking layer, the photoelectric conversion layer, and the hole blocking layer of Table 2 were successively formed on the IZO substrate by vacuum deposition with the following configuration, and further, an IZO layer similar to that of the cathode was formed by sputtering to form an anode.

After the anode was formed, hollow sealing was performed through use of a glass cap and a UV-curable resin to obtain a photoelectric conversion element. The photoelectric conversion element thus obtained was annealed for about 1 hour with a sealed surface being placed upward on a hot plate at 170° C. in order to stabilize element characteristics.

A voltage of 5 V was applied to the obtained photoelectric conversion element, and a value of a current flowing in this case was checked. It was confirmed that, in any of the elements, a ratio of (current in light place)/(current in dark place)=10 times or more was obtained, and hence any of the elements functioned as the photoelectric conversion elements. Then, each of the photoelectric conversion elements was kept in a constant-temperature reservoir at 60° C., and a prober wired to a semiconductor parameter analyzer ("4155C" manufactured by Agilent Technologies, Inc.) was brought into contact with electrodes to measure a dark current.

Compounds used in the electron blocking layer, the photoelectric conversion layer, and the hole blocking layer of the photoelectric conversion element, and compositions thereof are shown in Table 3. In the following table, "mass %" refers to a content of each organic semiconductor when a total amount of a first organic semiconductor, a second organic semiconductor, and a third organic semiconductor in a ternary configuration is 100 mass %, and a total amount of the first organic semiconductor and the second organic semiconductor in a binary configuration is 100 mass %. In addition, also in the description of the following table, "content" means a content of each organic semiconductor when the above-mentioned ternary configuration or binary configuration is 100 mass %. In addition, "mass ratio" in the table refers to a content of the third organic semiconductor with respect to the content of the second organic semiconductor.

TABLE 3

| | | Photoelectric conversion layer | | | | | | | |
| | | First organic compound | | Second organic compound | | Third organic compound | | | Mass ratio |
| | EBL | Compound | Mass % | Compound | Mass % | Compound | Mass % | HBL | (third/second) |
|---|---|---|---|---|---|---|---|---|---|
| Example 1 | Compound 1 | Compound 2 | 72 | Compound 3 | 25 | Compound 4 | 3 | Compound 2 | 0.12 |
| Example 2 | Compound 1 | Compound 2 | 69 | Compound 3 | 25 | Compound 4 | 6 | Compound 2 | 0.24 |
| Example 3 | Compound 1 | Compound 2 | 65 | Compound 3 | 25 | Compound 4 | 10 | Compound 2 | 0.40 |
| Example 4 | Compound 1 | Compound 2 | 55 | Compound 3 | 25 | Compound 4 | 20 | Compound 2 | 0.80 |
| Example 5 | Compound 1 | Compound 2 | 80 | Compound 3 | 17 | Compound 4 | 3 | Compound 2 | 0.18 |
| Example 6 | Compound 1 | Compound 2 | 87 | Compound 3 | 10 | Compound 4 | 3 | Compound 2 | 0.33 |
| Example 7 | Compound 1 | Compound 2 | 91 | Compound 3 | 6 | Compound 4 | 3 | Compound 2 | 0.50 |
| Example 8 | Compound 1 | Compound 2 | 65 | Compound 3 | 25 | Compound 5 | 10 | Compound 2 | 0.40 |
| Example 9 | Compound 1 | Compound 2 | 65 | Compound 3 | 25 | Compound 6 | 10 | Compound 2 | 0.40 |
| Example 10 | Compound 1 | Compound 2 | 65 | Compound 3 | 25 | Compound 7 | 10 | Compound 2 | 0.40 |
| Example 11 | Compound 1 | Compound 2 | 65 | Compound 3 | 25 | Compound 8 | 10 | Compound 2 | 0.40 |
| Example 12 | Compound 1 | Compound 2 | 65 | Compound 7 | 25 | Compound 3 | 10 | Compound 2 | 0.40 |
| Example 13 | Compound 1 | Compound 7 | 50 | Compound 2 | 40 | Compound 3 | 10 | Compound 2 | 0.25 |
| Example 14 | Compound 9 | Compound 2 | 65 | Compound 3 | 25 | Compound 4 | 10 | Compound 2 | 0.40 |
| Example 15 | Compound 1 | Compound 2 | 65 | Compound 3 | 25 | Compound 4 | 10 | Compound 10 | 0.40 |
| Example 16 | Compound 1 | Compound 10 | 65 | Compound 3 | 25 | Compound 4 | 10 | Compound 10 | 0.40 |
| Example 17 | Compound 1 | Compound 11 | 65 | Compound 3 | 25 | Compound 4 | 10 | Compound 2 | 0.40 |
| Example 18 | Compound 1 | Compound 11 | 65 | Compound 12 | 25 | Compound 4 | 10 | Compound 2 | 0.40 |
| Example 19 | Compound 1 | Compound 2 | 65 | Compound 13 | 25 | Compound 4 | 10 | Compound 2 | 0.40 |
| Example 20 | Compound 1 | Compound 2 | 65 | Compound 13 | 25 | Compound 14 | 10 | Compound 2 | 0.40 |
| Example 21 | Compound 1 | Compound 2 | 72 | Compound 13 | 25 | Compound 14 | 3 | Compound 2 | 0.12 |
| Example 22 | Compound 1 | Compound 2 | 91 | Compound 13 | 6 | Compound 14 | 3 | Compound 2 | 0.50 |
| Comparative Example 1 | Compound 1 | Compound 2 | 75 | Compound 3 | 25 | — | — | Compound 2 | — |
| Comparative Example 2 | Compound 1 | Compound 2 | 74 | Compound 3 | 25 | Compound 4 | 1 | Compound 2 | 0.04 |
| Comparative Example 3 | Compound 1 | Compound 2 | 73 | Compound 3 | 25 | Compound 4 | 2 | Compound 2 | 0.08 |
| Comparative Example 4 | Compound 1 | Compound 2 | 83 | Compound 3 | 17 | — | — | Compound 2 | — |
| Comparative Example 5 | Compound 1 | Compound 2 | 90 | Compound 3 | 10 | — | — | Compound 2 | — |
| Comparative Example 6 | Compound 1 | Compound 2 | 94 | Compound 3 | 6 | — | — | Compound 2 | — |
| Comparative Example 7 | Compound 1 | Compound 2 | 96 | Compound 3 | 4 | — | — | Compound 2 | — |
| Comparative Example 8 | Compound 1 | Compound 2 | 93 | Compound 3 | 4 | Compound 4 | 3 | Compound 2 | 0.83 |
| Comparative Example 9 | Compound 1 | Compound 2 | 75 | Compound 7 | 25 | — | — | Compound 2 | — |
| Comparative Example 10 | Compound 1 | Compound 7 | 60 | Compound 2 | 40 | — | — | Compound 2 | — |
| Comparative Example 11 | Compound 1 | Compound 2 | 85 | Compound 3 | 15 | — | — | Compound 2 | — |
| Comparative Example 12 | Compound 1 | Compound 2 | 65 | Compound 3 | 35 | — | — | Compound 2 | — |
| Comparative Example 13 | Compound 9 | Compound 2 | 75 | Compound 3 | 25 | — | — | Compound 2 | — |
| Comparative Example 14 | Compound 1 | Compound 2 | 75 | Compound 3 | 25 | — | — | Compound 10 | — |

TABLE 3-continued

| | | Photoelectric conversion layer | | | | | | | |
|---|---|---|---|---|---|---|---|---|---|
| | | First organic compound | | Second organic compound | | Third organic compound | | | Mass ratio |
| | EBL | Compound | Mass % | Compound | Mass % | Compound | Mass % | HBL | (third/second) |
| Comparative Example 15 | Compound 1 | Compound 10 | 75 | Compound 3 | 25 | — | — | Compound 10 | — |
| Comparative Example 16 | Compound 1 | Compound 11 | 75 | Compound 3 | 25 | — | — | Compound 2 | — |
| Comparative Example 17 | Compound 1 | Compound 11 | 75 | Compound 12 | 25 | — | — | Compound 2 | — |
| Comparative Example 18 | Compound 1 | Compound 2 | 75 | Compound 13 | 25 | — | — | Compound 2 | — |
| Comparative Example 19 | Compound 1 | Compound 2 | 73 | Compound 13 | 25 | Compound 14 | 2 | Compound 2 | 0.08 |
| Comparative Example 20 | Compound 1 | Compound 2 | 94 | Compound 13 | 6 | — | — | Compound 2 | — |
| Comparative Example 21 | Compound 1 | Compound 2 | 96 | Compound 13 | 4 | — | — | Compound 2 | — |
| Comparative Example 22 | Compound 1 | Compound 2 | 93 | Compound 13 | 4 | Compound 14 | 3 | Compound 2 | 0.83 |

Now, Examples and Comparative Examples to be compared to each other are described based on an extracted table.

TABLE 4

| | First organic compound | | Second organic compound | | Third organic compound | | Mass ratio | Relative dark current |
|---|---|---|---|---|---|---|---|---|
| | Compound | Mass % | Compound | Mass % | Compound | Mass % | (third/second) | (ternary/binary) |
| Comparative Example 1 | Compound 2 | 75 | Compound 3 | 25 | — | — | — | — |
| Comparative Example 2 | Compound 2 | 74 | Compound 3 | 25 | Compound 4 | 1 | 0.04 | 1 |
| Comparative Example 3 | Compound 2 | 73 | Compound 3 | 25 | Compound 4 | 2 | 0.08 | 1 |
| Example 1 | Compound 2 | 72 | Compound 3 | 25 | Compound 4 | 3 | 0.12 | 0.6 |
| Example 2 | Compound 2 | 69 | Compound 3 | 25 | Compound 4 | 6 | 0.24 | 0.5 |
| Example 3 | Compound 2 | 65 | Compound 3 | 25 | Compound 4 | 10 | 0.40 | 0.4 |
| Example 4 | Compound 2 | 55 | Compound 3 | 25 | Compound 4 | 20 | 0.80 | 0.1 |

In Comparative Example 1 shown in Table 4, the photoelectric conversion layer is made of two materials, that is, the compound 2 serving as the first organic semiconductor and the compound 3 serving as the second organic semiconductor. In Comparative Examples 2 and 3 and Examples 1 to 4, each photoelectric conversion layer is formed so as to contain the compound 4 serving as the third organic semiconductor in addition to the compound 2 serving as the first organic semiconductor and the compound 3 serving as the second organic semiconductor in a content of 25 mass % that is the same as that of Comparative Example 1. Here, each relative dark current in Comparative Examples 2 and 3 and Examples 1 to 4 is a ratio of a dark current with respect to that of Comparative Example 1. It is understood from Table 4 that, in Examples 1 to 4 in which the content of the third organic semiconductor is 3 mass % or more, a dark current is dominantly decreased as compared to that of Comparative Example 1 not containing the third organic semiconductor. Meanwhile, in Comparative Examples 2 and 3 in which the content of the third organic semiconductor is less than 3 mass %, a decrease in dark current was not able to be confirmed with respect to that of Comparative Example 1 not containing the third organic semiconductor. In addition, in a mass ratio of the third organic semiconductor with respect to the second organic semiconductor, a dark current was decreased in Examples 1 to 4 in which the mass ratio was 0.12 or more, as compared to Comparative Example 1 not containing the third organic semiconductor.

TABLE 5

| | First organic compound | | Second organic compound | | Third organic compound | | Mass ratio | Relative dark current |
|---|---|---|---|---|---|---|---|---|
| | Compound | Mass % | Compound | Mass % | Compound | Mass % | (third/second) | (ternary/binary) |
| Comparative Example 1 | Compound 2 | 75 | Compound 3 | 25 | — | — | — | — |
| Example 1 | Compound 2 | 72 | Compound 3 | 25 | Compound 4 | 3 | 0.12 | 0.6 |
| Comparative Example 4 | Compound 2 | 83 | Compound 3 | 17 | — | — | — | — |

TABLE 5-continued

|  | First organic compound | | Second organic compound | | Third organic compound | | Mass ratio | Relative dark current |
|---|---|---|---|---|---|---|---|---|
|  | Compound | Mass % | Compound | Mass % | Compound | Mass % | (third/second) | (ternary/binary) |
| Example 5 | Compound 2 | 80 | Compound 3 | 17 | Compound 4 | 3 | 0.18 | 0.6 |
| Comparative Example 5 | Compound 2 | 90 | Compound 3 | 10 | — | — | — | — |
| Example 6 | Compound 2 | 87 | Compound 3 | 10 | Compound 4 | 3 | 0.33 | 0.7 |
| Comparative Example 6 | Compound 2 | 94 | Compound 3 | 6 | — | — | — | — |
| Example 7 | Compound 2 | 91 | Compound 3 | 6 | Compound 4 | 3 | 0.50 | 0.8 |
| Comparative Example 7 | Compound 2 | 96 | Compound 3 | 4 | — | — | — | — |
| Comparative Example 8 | Compound 2 | 93 | Compound 3 | 4 | Compound 4 | 3 | 0.83 | 1 |

In Comparative Examples 1, 4, 5, 6, and 7 shown in Table 5, the photoelectric conversion layer is made of two materials, that is, the compound 2 serving as the first organic semiconductor and the compound 3 serving as the second organic semiconductor. In Examples 1, 5, 6, and 7, and Comparative Example 8, each photoelectric conversion layer is formed so as to contain 3 mass % of the compound 4 serving as the third organic semiconductor in addition to the compound 2 serving as the first organic semiconductor and the compound 3 serving as the second organic semiconductor having the same content as that of Comparative Examples 1, 4, 5, 6, and 7. Here, each relative dark current in Examples 1, 5, 6, and 7, and Comparative Example 8 is a ratio of a dark current with respect to that of Comparative Examples 1, 4, 5, 6, and 7, respectively. It is understood from Table 5 that, in Examples 1, 5, 6, and 7 in which the content of the second organic semiconductor is more than 6 mass %, a dark current is dominantly decreased as compared to that of Comparative Examples 1, 4, 5, and 6 not containing the third organic semiconductor. Meanwhile, in Comparative Example 8 in which the content of the second organic semiconductor is less than 6 mass %, a decrease in dark current was not able to be confirmed with respect to that of Comparative Example 7 not containing the third organic semiconductor. In addition, it is understood from the relative dark current in Examples 1, 5, and 6 that it is preferred that the content of the second organic semiconductor be 10 mass % or more because the dark current reduction effect brought by mixing the third organic semiconductor is large. In addition, it is understood from the relative dark current in Examples 1 and 5 that it is more preferred that the content of the second organic semiconductor be 17 mass % or more because the dark current reduction effect brought by mixing the third organic semiconductor is large.

TABLE 6

|  | First organic compound | | Second organic compound | | Third organic compound | | Mass ratio | $\Delta$Eox | $\Delta$Ered | Relative dark current |
|---|---|---|---|---|---|---|---|---|---|---|
|  | Compound | Mass % Concentration | Compound | Mass % Concentration | Compound | Mass % Concentration | (third/second) | [V] | [V] | (ternary/binary) |
| Comparative Example 1 | Compound 2 | 75 | Compound 3 | 25 | — | — | — | — | — | — |
| Example 8 | Compound 2 | 65 | Compound 3 | 25 | Compound 5 | 10 | 0.4 | 0.36 | 0.35 | 0.1 |
| Example 3 | Compound 2 | 65 | Compound 3 | 25 | Compound 4 | 10 | 0.4 | 0.25 | 0.41 | 0.4 |
| Example 10 | Compound 2 | 65 | Compound 3 | 25 | Compound 7 | 10 | 0.4 | 0.11 | 0.39 | 0.6 |
| Example 9 | Compound 2 | 65 | Compound 3 | 25 | Compound 6 | 10 | 0.4 | 0 | 0.37 | 0.7 |
| Example 11 | Compound 2 | 65 | Compound 3 | 25 | Compound 8 | 10 | 0.4 | −0.03 | 0.62 | 0.8 |
| Comparative Example 9 | Compound 2 | 75 | Compound 7 | 25 | — | — | — | — | — | — |
| Example 12 | Compound 2 | 65 | Compound 7 | 25 | Compound 3 | 10 | 0.4 | −0.11 | 0.41 | 0.8 |

In Comparative Example 1 shown in Table 6, the photoelectric conversion layer is made of two materials, that is, the compound 2 serving as the first organic semiconductor and the compound 3 serving as the second organic semiconductor. In Examples 3 and 8 to 11, each photoelectric conversion layer is formed so as to contain the compounds each shown in Table 6 serving as the third organic semiconductor in addition to the compound 2 serving as the first organic semiconductor and the compound 3 serving as the second organic semiconductor in a content of 25 mass % that is the same as that of Comparative Example 1. In addition, in the photoelectric conversion elements shown in Table 6, the compound 2 is an n-type semiconductor, and the compounds 3 to 8 are p-type semiconductors. Here, each relative dark current in Examples 3 and 8 to 11 is a ratio of a dark current with respect to that of Comparative Example 1. As is understood from Table 6, in the following expression (15) and expression (16) represented by using an oxidation potential Eox2 of the second organic semiconductor, an oxidation potential Eox3 of the third organic semiconductor, a reduction potential Ered1 of the first organic semiconductor, and a reduction potential Ered3 of the third organic semiconductor, $\Delta$Eox and $\Delta$Ered are 0 or more.

$$\Delta Eox = (Eox3) - (Eox2) \tag{15}$$

$$\Delta Ered = (Ered1) - (Ered3) \tag{16}$$

Specifically, it is understood that, in Examples 3 and 8 to 10 satisfying the following expressions (11) and (12), the dark current reduction effect brought by introduction of the third organic semiconductor is large.

$$Eox2 \leq Eox3 \quad (11)$$

$$Ered1 \geq Ered3 \quad (12)$$

In this case, ΔEox is a negative value in Example 11, and hence it is understood that the dark current reduction effect brought by introduction of the third organic semiconductor in Example 11 is smaller than those of Examples 3 and 8 to 10 in which ΔEox is 0 or more.

Meanwhile, in Comparative Example 9, the photoelectric conversion layer is made of two materials, that is, the compound 2 serving as the first organic semiconductor and the compound 7 serving as the second organic semiconductor. In Example 12, the photoelectric conversion layer is formed so as to contain the compound 3 serving as the third organic semiconductor in addition to the compound 2 serving as the first organic semiconductor and the compound 7 serving as the second organic semiconductor in a content of 25 mass % that is the same as that of Comparative Example 1. Here, the relative dark current in Example 12 is a ratio of a dark current with respect to that of Comparative Example 9.

It is understood from the above-mentioned results that, in each of Examples 11 and 12 in which ΔEox is a negative value, the dark current reduction effect brought by mixing the third organic semiconductor is found, but is smaller than those of Examples 3 and 8 to 10 in which ΔEox is 0 or more.

the compound 7 serving as the first organic semiconductor and the compound 2 serving as the second organic semiconductor. In Example 13, the photoelectric conversion layer is formed so as to contain the compound 3 serving as the third organic semiconductor in addition to the compound 7 serving as the first organic semiconductor and the compound 2 serving as the second organic semiconductor in a content of 40 mass % that is the same as that of Comparative Example 10. In Examples 1 to 12, and Comparative Examples 1 to 9, the first organic semiconductor is an n-type semiconductor, and the second organic semiconductor is a p-type semiconductor. Meanwhile, in Comparative Example 10 and Example 13, the first organic semiconductor is a p-type semiconductor, and the second organic semiconductor is an n-type organic semiconductor. Here, the relative dark current in Example 13 is a ratio of a dark current with respect to that of Comparative Example 10.

From the above-mentioned results, it was revealed that, even when the first organic semiconductor was a p-type semiconductor, and the second organic semiconductor was an n-type semiconductor, the dark current reduction effect

TABLE 7

|  | First organic compound | | Second organic compound | | Third organic compound | | Mass ratio (third/second) | Relative dark current (ternary/binary) |
| --- | --- | --- | --- | --- | --- | --- | --- | --- |
|  | Compound | Mass % Concentration | Compound | Mass % Concentration | Compound | Mass % Concentration | | |
| Comparative Example 10 | Compound 7 | 60 | Compound 2 | 40 | — | — | — | 1 |
| Example 13 | Compound 7 | 50 | Compound 2 | 40 | Compound 3 | 10 | 0.25 | 0.8 |

In Comparative Example 10 shown in Table 7, the photoelectric conversion layer is made of two materials, that is, was exhibited through introduction of the third organic semiconductor.

TABLE 8

|  | Photoelectric conversion layer | | | | | | | | Concentration ratio (third/second) | Relative dark current (ternary/binary) |
| --- | --- | --- | --- | --- | --- | --- | --- | --- | --- | --- |
|  | EBL | First organic compound | | Second organic compound | | Third organic compound | | HBL | | |
|  |  | Compound | Mass % | Compound | Mass % | Compound | Mass % |  |  |  |
| Comparative Example 1 | Compound 1 | Compound 2 | 75 | Compound 3 | 25 | — | — | Compound 2 | — | — |
| Example 3 | Compound 1 | Compound 2 | 65 | Compound 3 | 25 | Compound 4 | 10 | Compound 2 | 0.40 | 0.4 |
| Comparative Example 13 | Compound 9 | Compound 2 | 75 | Compound 3 | 25 | — | — | Compound 2 | — | — |
| Example 14 | Compound 9 | Compound 2 | 65 | Compound 3 | 25 | Compound 4 | 10 | Compound 2 | 0.40 | 0.4 |
| Comparative Example 14 | Compound 1 | Compound 2 | 75 | Compound 3 | 25 | — | — | Compound 10 | — | — |
| Example 15 | Compound 1 | Compound 2 | 65 | Compound 3 | 25 | Compound 4 | 10 | Compound 10 | 0.40 | 0.4 |
| Comparative Example 15 | Compound 1 | Compound 10 | 75 | Compound 3 | 25 | — | — | Compound 10 | — | — |
| Example 16 | Compound 1 | Compound 10 | 65 | Compound 3 | 25 | Compound 4 | 10 | Compound 10 | 0.40 | 0.6 |
| Comparative Example 16 | Compound 1 | Compound 11 | 75 | Compound 3 | 25 | — | — | Compound 2 | — | — |
| Example 17 | Compound 1 | Compound 11 | 65 | Compound 3 | 25 | Compound 4 | 10 | Compound 2 | 0.40 | 0.6 |
| Comparative Example 17 | Compound 1 | Compound 11 | 75 | Compound 12 | 25 | — | — | Compound 2 | — | — |

TABLE 8-continued

| | | First organic compound | | Second organic compound | | Third organic compound | | | Concentration ratio (third/second) | Relative dark current (ternary/binary) |
|---|---|---|---|---|---|---|---|---|---|---|
| | EBL | Compound | Mass % | Compound | Mass % | Compound | Mass % | HBL | | |
| Example 18 | Compound 1 | Compound 11 | 65 | Compound 12 | 25 | Compound 4 | 10 | Compound 2 | 0.40 | 0.7 |
| Comparative Example 18 | Compound 1 | Compound 2 | 75 | Compound 13 | 25 | — | — | Compound 2 | — | — |
| Example 19 | Compound 1 | Compound 2 | 65 | Compound 13 | 25 | Compound 4 | 10 | Compound 2 | 0.40 | 0.4 |
| Example 20 | Compound 1 | Compound 2 | 65 | Compound 13 | 25 | Compound 14 | 10 | Compound 2 | 0.40 | 0.5 |
| Example 21 | Compound 1 | Compound 2 | 72 | Compound 13 | 25 | Compound 14 | 3 | Compound 2 | 0.12 | 0.7 |
| Comparative Example 19 | Compound 1 | Compound 2 | 73 | Compound 13 | 25 | Compound 14 | 2 | Compound 2 | 0.08 | 1 |
| Comparative Example 20 | Compound 1 | Compound 2 | 94 | Compound 13 | 6 | — | — | Compound 2 | — | — |
| Example 22 | Compound 1 | Compound 2 | 91 | Compound 13 | 6 | Compound 14 | 3 | Compound 2 | 0.50 | 0.8 |
| Comparative Example 21 | Compound 1 | Compound 2 | 96 | Compound 13 | 4 | — | — | Compound 2 | — | — |
| Comparative Example 22 | Compound 1 | Compound 2 | 93 | Compound 13 | 4 | Compound 14 | 3 | Compound 2 | 0.83 | 1 |

In Table 8, it is confirmed that, even when the compounds forming the electron blocking layer, the photoelectric conversion layer, and the hole blocking layer are changed to different compounds in the element configuration of Example 3, the dark current reduction effect brought by using the third organic semiconductor is exhibited irrespective of the kinds of the compounds.

Each relative dark current in Examples 3 and 14 to 20 in Table 8 is a ratio of a dark current with respect to those of Comparative Examples 1 and 13 to 18. Each element configuration of Examples 14 to 20 is an element configuration in which any one to two of the electron blocking layer, the hole blocking layer, the first organic semiconductor, the second organic semiconductor, and the third organic semiconductor are changed to different compounds in the element configuration of Example 3. It was able to be confirmed from Table 8 that the dark current reduction effect brought by mixing the third organic semiconductor was exhibited in Examples 14 to 20.

Examples 20, 21, and 22, and Comparative Examples 19 and 22 each have an element configuration in which the content of the compound 13 serving as the second organic semiconductor and the content of the compound 14 serving as the third organic semiconductor are changed. Each relative dark current in Examples 20 and 21 and Comparative Example 19 is a ratio of a dark current with respect to that of Comparative Example 18. In addition, each relative dark current in Example 22 and Comparative Example 22 is a ratio of a dark current with respect to that of Comparative Examples 20 and 21. In Examples 20, 21, and 22 which satisfy the condition that the content of the second organic semiconductor is 6 mass % or more, and the content of the third organic semiconductor is 3 mass % or more, the dark current reduction effect brought by mixing the third organic semiconductor was able to be confirmed. Meanwhile, in Comparative Example 19 which satisfies the condition that the content of the second organic semiconductor is 6 mass % or more, but does not satisfy the condition that the content of the third organic semiconductor is 3 mass % or more, the dark current reduction effect brought by mixing the third organic semiconductor was not able to be confirmed. In addition, in Comparative Example 22 which satisfies the condition that the content of the third organic semiconductor is 3 mass % or more, but does not satisfy the condition that the content of the second organic semiconductor is 6 mass % or more, the dark current reduction effect brought by mixing the third organic semiconductor was not able to be confirmed.

(Verification Experiment)

Figure 11:
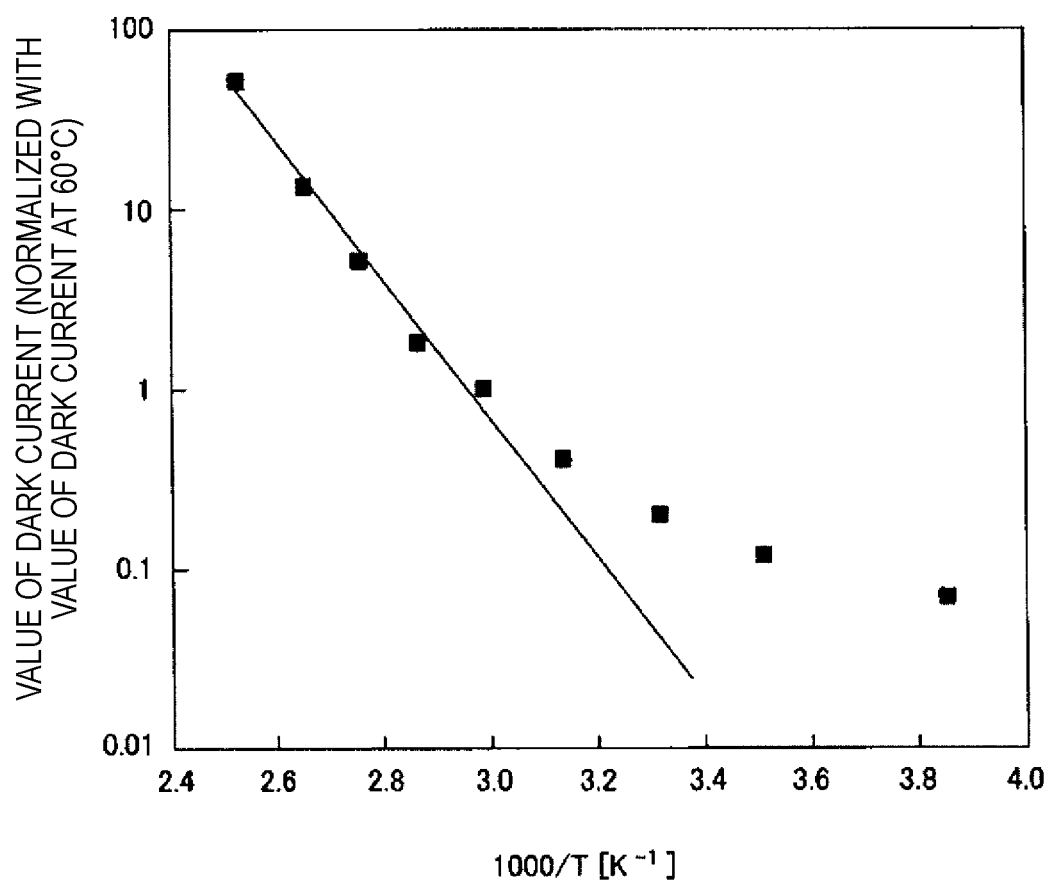
FIG. 11 is a graph for showing Arrhenius plots of a dark current value of a photoelectric conversion element in a Comparative Example of this description.

The results obtained by measuring temperature dependence of a dark current of the photoelectric conversion element of Comparative Example 1 and performing Arrhenius plotting in order to analyze the cause for generation of a dark current are shown in FIG. 11. As shown in FIG. 11, the gradient is increased from about 60° C. (T/1,000=3.0) to a high temperature side (left side of a horizontal axis in FIG. 11). Activation energy was determined based on this gradient in accordance with the following expression (17).

$$\ln J(T) = -\frac{E_a}{k_B}\frac{1}{T} + \ln J_0 \qquad (17)$$

Here, T represents a temperature, $k_B$ represents a Boltzmann constant, Ea represents activation energy, J represents a current value at the temperature T, and $J_0$ represents a frequency factor.

Also in the photoelectric conversion element of Comparative Examples 11 and 12 and Example 8, the activation energy was determined in the same manner as in Comparative Example 1. In Table 9, there are shown a configuration of the photoelectric conversion layer in each of the photoelectric conversion elements, and activation energy and a dark current normalized with the values of the photoelectric conversion element (Comparative Example 1) including the photoelectric conversion layer with a binary configuration in which the content of the compound 3 is 25 mass %.

TABLE 9

| | First organic compound | | Second organic compound | | Third organic compound | | Normalized activation energy | Normalized dark current |
|---|---|---|---|---|---|---|---|---|
| | Compound | Mass % Concentration | Compound | Mass % Concentration | Compound | Mass % Concentration | | |
| Comparative Example 11 | Compound 2 | 85 | Compound 3 | 15 | — | — | 1.1 | 0.4 |
| Comparative Example 1 | Compound 2 | 75 | Compound 3 | 25 | — | — | 1 | 1 |
| Comparative Example 12 | Compound 2 | 65 | Compound 3 | 35 | — | — | 0.9 | 6.1 |
| Example 8 | Compound 2 | 65 | Compound 3 | 25 | Compound 5 | 10 | 1.4 | 0.1 |

It is understood from Table 9 that, in the element including the photoelectric conversion layer with a binary configuration, as the content of the compound 3 serving as the second organic semiconductor is increased, the activation energy is reduced, and the dark current is increased. As the reason for this, the following is considered. When the content of the second organic semiconductor is increased, the second organic semiconductors are associated with each other, and the energy distribution of the state density of the HOMO level is enlarged, with the result that the activation energy is reduced, and the dark current is increased.

Meanwhile, in the photoelectric conversion element of Example 8, despite the fact that the content of the p-type semiconductors (total amount of the second organic semiconductor and the third organic semiconductor) is larger than that in Comparative Example 1 because of the mixing of the third organic semiconductor, the activation energy is increased, and the dark current is decreased. This is considered to be caused by the following. When the third organic semiconductor is mixed in addition to the first organic semiconductor and the second organic semiconductor, the second organic semiconductors are associated with each other, thereby being capable of suppressing the strengthening of the interaction caused by stacking. As a result, the energy spread of the state density of the HOMO level can be suppressed.

p-type semiconductor, and the third organic semiconductor is a p-type semiconductor. In Example 23, the photoelectric conversion layer has a configuration containing the compound 10 serving as the third organic semiconductor in addition to the compound 2 serving as the first organic semiconductor and the compound 3 serving as the second organic semiconductor in a content of 25 mass % that is the same as that of Comparative Example 1. In Example 23, the first organic semiconductor is an n-type semiconductor, the second organic semiconductor is a p-type semiconductor, and the third organic semiconductor is an n-type semiconductor.

The relative dark current that is a ratio of a dark current with respect to that of Comparative Example 1 was smaller in Example 3 than in Example 23. It is understood from this fact that, when the first organic semiconductor is an n-type semiconductor, and the second organic semiconductor is a p-type semiconductor, it is preferred that the third organic semiconductor be a p-type semiconductor.

In Comparative Example 10, the photoelectric conversion layer is made of two materials, that is, the compound 7 serving as the first organic semiconductor and the compound 2 serving as the second organic semiconductor. In Example 13, the photoelectric conversion layer has a configuration containing the compound 3 serving as the third organic semiconductor in addition to the compound 7 serving as the

TABLE 10

| | First organic compound | | Second organic compound | | Third organic compound | | Mass ratio (third/second) | Relative dark current (ternary/binary) |
|---|---|---|---|---|---|---|---|---|
| | Compound | Mass % | Compound | Mass % | Compound | Mass % | | |
| Comparative Example 1 | Compound 2 | 75 | Compound 3 | 25 | — | — | — | — |
| Example 3 | Compound 2 | 65 | Compound 3 | 25 | Compound 4 | 10 | 0.40 | 0.4 |
| Example 23 | Compound 2 | 65 | Compound 3 | 25 | Compound 10 | 10 | 0.40 | 0.6 |
| Comparative Example 10 | Compound 7 | 60 | Compound 2 | 40 | — | — | — | — |
| Example 13 | Compound 7 | 50 | Compound 2 | 40 | Compound 3 | 10 | 0.25 | 0.8 |
| Example 24 | Compound 7 | 50 | Compound 2 | 40 | Compound 10 | 10 | 0.25 | 0.6 |

In Comparative Example 1, the photoelectric conversion layer is made of two materials, that is, the compound 2 serving as the first organic semiconductor and the compound 3 serving as the second organic semiconductor. In Example 3, the photoelectric conversion layer has a configuration containing the compound 4 serving as the third organic semiconductor in addition to the compound 2 serving as the first organic semiconductor and the compound 3 serving as the second organic semiconductor in a content of 25 mass % that is the same as that of Comparative Example 1. In Example 3, the first organic semiconductor is an n-type semiconductor, the second organic semiconductor is a first organic semiconductor and the compound 2 serving as the second organic semiconductor in a content of 40 mass % that is the same as that of Comparative Example 10. In Example 13, the first organic semiconductor is a p-type semiconductor, the second organic semiconductor is an n-type semiconductor, and the third organic semiconductor is a p-type semiconductor. In Example 24, the photoelectric conversion layer has a configuration containing the compound 10 serving as the third organic semiconductor in addition to the compound 2 serving as the first organic semiconductor and the compound 3 serving as the second organic semiconductor in a content of 40 mass % that is the same as that of Comparative Example 10. In Example 24, the first organic semiconductor is a p-type semiconductor, the second organic semiconductor is an n-type semiconductor, and the third organic semiconductor is an n-type semiconductor.

The relative dark current that is a ratio of a dark current with respect to that of Comparative Example 10 was smaller in Example 24 than in Example 13. It is understood from this fact that, when the first organic semiconductor is a p-type semiconductor, and the second organic semiconductor is an n-type semiconductor, it is preferred that the third organic semiconductor be an n-type semiconductor.

(Evaluation Results of Conversion Efficiency)

In order to obtain a high S/N ratio, it is preferred that the photoelectric conversion efficiency be high. Measurement of the photoelectric conversion efficiency and evaluation results thereof are described below. First, in order to evaluate the conversion efficiency for each combination of a p-type and an n-type in advance, photoelectric conversion elements each including a photoelectric conversion layer containing a p-type material in an amount of 25% were manufactured by the same method as those of other Examples except for a photoelectric conversion layer and evaluated. The evaluation results are shown in a table. The conversion efficiency is a value calculated by the following relationship: Conversion efficiency (η)=External quantum efficiency (EQE)/Absorptance of photoelectric conversion layer after external quantum efficiency and an absorptance of the photoelectric conversion layer are separately determined. In the following table, an EQE peak wavelength of the photoelectric conversion element and conversion efficiency in each combination of p-type and n-type organic semiconductors are shown. The EQE peak wavelength was obtained by determining a photocurrent through measurement of a current at a time of irradiation of light having each wavelength and at a time of non-irradiation of light through use of a spectral sensitivity light source and a semiconductor parameter analyzer ("4155C" manufactured by Agilent Technologies, Inc.) with respect to an element arranged in a dark place. The photocurrent was converted into the number of electrons, and the number of electrons was divided by the number of incident photons to obtain EQE. With this, the EQE at each wavelength was measured to acquire spectral sensitivity characteristics and determine a sensitivity peak wavelength on a longest wavelength side. In addition, as an indicator of excitation energy of each material, a bandgap was also shown. The bandgap was calculated by absorption spectrum measurement of a thin film formed by vacuum deposition with each 100% film being a film thickness of about 100 nm.

The conversion efficiency of the photoelectric conversion layer can be estimated based on the efficiency of the photoelectric conversion element including the photoelectric conversion layer.

TABLE 11

| First organic semiconductor | | | Second organic semiconductor | | | EQE peak wavelength (nm) | Conversion efficiency |
|---|---|---|---|---|---|---|---|
| Compound | Mass % | Bandgap (eV) | Compound | Mass % | Bandgap (eV) | | |
| Compound 2 | 75 | 1.61 | Compound 4 | 25 | 2.08 | 510 | C |
| Compound 2 | 75 | 1.61 | Compound 6 | 25 | 1.98 | 550 | A |
| Compound 2 | 75 | 1.61 | Compound 14 | 25 | 2.22 | 475 | C |
| Compound 2 | 75 | 1.61 | Compound 13 | 25 | 2.04 | 540 | A |
| Compound 2 | 75 | 1.61 | Compound 3 | 25 | 1.93 | 560 | B |
| Compound 2 | 75 | 1.61 | Compound 7 | 25 | 2.01 | 563 | B |
| Compound 2 | 75 | 1.61 | Compound 15 | 25 | 2.02 | 545 | A |
| Compound 2 | 75 | 1.61 | Compound 16 | 25 | 1.91 | 575 | B |
| Compound 2 | 75 | 1.61 | Compound 17 | 25 | 1.99 | 575 | B |
| Compound 2 | 75 | 1.61 | Compound 18 | 25 | 1.94 | 570 | A |
| Compound 2 | 75 | 1.61 | Compound 5 | 25 | 2.06 | 495 | C |
| Compound 2 | 75 | 1.61 | Compound 8 | 25 | 1.95 | 600 | B |

The conversion efficiency (η) in Table 11 was evaluated as conversion efficiency of a binary element at a drive voltage of 5 V as described below.

A: η≥80
B: 80>η≥60
C: η<60

In the above-mentioned element configuration, the mass percent concentration of the second organic semiconductor is set to 25%, which serves as an indicator for comparing each combination. The weight ratio of the second organic semiconductor is not limited to 25%. For example, the inventors of the present invention have confirmed that the above-mentioned conversion efficiency is substantially constant when the concentration of the second organic semiconductor is from about 15% to about 50%, and it is only required that the maximum conversion efficiency value be determined based on such concentration range.

In addition, it is understood from the above-mentioned results that, even when fullerene C60 of the compound 2 is used as an n-type organic semiconductor, the conversion efficiency of photoelectric conversion is not influenced. This indicates the following. The absorption transition of C60 in a visible portion is forbidden transition, and the molar absorption coefficient thereof is less than 1,000 mol $L^{-1}$ $cm^{-1}$. Therefore, fullerene C60 does not effectively function as an energy acceptor.

In view of the foregoing, a photoelectric conversion element, in which the first, second, and third organic semiconductors forming the first organic semiconductor layer shown in Table 2 were configured as described below, was manufactured, and the conversion efficiency of the element was evaluated. In Table 12, in order to obtain a photoelectric conversion element having a more excellent S/N ratio, a relationship between the configuration of the photoelectric conversion layer of the photoelectric conversion element of the present invention and the conversion efficiency thereof are shown based on the results of Table 11. In each of the elements of Examples and Comparative Examples in the following table, portions other than the photoelectric conversion layer are manufactured by the same method as those of the other Examples. In addition, a value at 500 nm close to a sensitivity peak in Table 11 was adopted as the conversion efficiency, and the effects of the present invention were verified.

Meanwhile, in the elements each containing a combination of a p-type semiconductor and an n-type semiconductor combined in the organic semiconductor No. 2 and the organic semiconductors 4, 5, and 14, the conversion effi-

TABLE 12

| Example No. | First organic semiconductor Compound | Mass % | Second organic semiconductor Compound | Mass % | Third organic semiconductor Compound | Mass % | Conversion efficiency at 500 nm |
|---|---|---|---|---|---|---|---|
| Example 25 | Compound 2 | 65 | Compound 3 | 25 | Compound 4 | 10 | B |
| Example 26 | Compound 2 | 65 | Compound 3 | 20 | Compound 4 | 15 | B |
| Example 27 | Compound 2 | 60 | Compound 3 | 15.5 | Compound 4 | 14.5 | B |
| Example 28 | Compound 2 | 65 | Compound 4 | 25 | Compound 3 | 10 | B |
| Example 29 | Compound 2 | 74 | Compound 4 | 22 | Compound 3 | 4 | B |
| Example 30 | Compound 2 | 74 | Compound 4 | 22 | Compound 3 | 6 | B |
| Example 31 | Compound 2 | 70 | Compound 6 | 20 | Compound 4 | 10 | A |
| Example 32 | Compound 2 | 70 | Compound 6 | 15.5 | Compound 4 | 14.5 | A |
| Example 33 | Compound 2 | 65 | Compound 4 | 20 | Compound 6 | 15 | A |
| Example 34 | Compound 2 | 65 | Compound 16 | 25 | Compound 4 | 10 | A |
| Example 35 | Compound 2 | 65 | Compound 4 | 25 | Compound 16 | 10 | A |
| Example 36 | Compound 2 | 65 | Compound 17 | 25 | Compound 4 | 10 | B |
| Example 37 | Compound 2 | 65 | Compound 4 | 25 | Compound 17 | 10 | B |
| Example 38 | Compound 2 | 70 | Compound 18 | 20 | Compound 4 | 10 | A |
| Example 39 | Compound 2 | 70 | Compound 18 | 15.5 | Compound 4 | 14.5 | A |
| Example 40 | Compound 2 | 65 | Compound 3 | 25 | Compound 5 | 10 | B |
| Example 41 | Compound 2 | 65 | Compound 6 | 25 | Compound 14 | 10 | A |
| Example 42 | Compound 2 | 65 | Compound 14 | 25 | Compound 6 | 10 | B |
| Example 43 | Compound 2 | 65 | Compound 13 | 25 | Compound 14 | 10 | A |
| Example 44 | Compound 2 | 65 | Compound 14 | 25 | Compound 13 | 10 | A |
| Example 49 | Compound 2 | 65 | Compound 15 | 25 | Compound 14 | 10 | A |
| Example 50 | Compound 2 | 65 | Compound 14 | 25 | Compound 15 | 10 | A |
| Comparative Example 23 | Compound 2 | 73 | Compound 4 | 25 | Compound 3 | 3 | C |
| Comparative Example 24 | Compound 2 | 65 | Compound 14 | 25 | Compound 5 | 10 | C |
| Comparative Example 25 | Compound 2 | 70 | Compound 14 | 17.5 | Compound 5 | 12.5 | C |
| Comparative Example 26 | Compound 2 | 65 | Compound 5 | 20 | Compound 14 | 15 | C |
| Comparative Example 27 | Compound 2 | 65 | Compound 14 | 20 | Compound 4 | 15 | C |
| Comparative Example 28 | Compound 2 | 65 | Compound 4 | 15 | Compound 14 | 20 | C |

The above-mentioned results are discussed. As in Examples 25 to 50, the conversion efficiency was high in the elements each having an EQE peak on a long wavelength side and having a combination of a p-type and an n-type with high conversion efficiency. As compared to the conversion efficiency of the elements each being made of only the organic semiconductors 2 and 3 of Examples 25 to 30, the conversion efficiency of the elements each containing a combination of the organic semiconductors 2 and 4 having an EQE peak with high conversion efficiency on a longer wavelength side was higher. In particular, in the elements each containing a combination of the organic semiconductor 2 and any one of the organic semiconductors 6, 13, 15, 16, and 18, particularly high conversion efficiency was exhibited.

ciency was low as in Comparative Examples 24 to 28 (the organic semiconductors 4, 5, and 14 are indicated by italic letters).

In addition, in Comparative Example 23, among the organic semiconductor 2 and the organic semiconductor 4 to be a combination of a p-type semiconductor and an n-type semiconductor forming the side accepting excitation energy, the concentration of the organic semiconductor 4 was extremely low, and hence excitation energy was not able to be effectively collected, with the result that the conversion efficiency was not improved.

In addition, in Examples 25 to 50 and Comparative Examples 23 to 28, the dark current reduction effect of about 0.1 time to about 0.6 time was observed in association with the introduction of the third organic semiconductor as in the previous Examples. Examples 3 and 25, Examples 8 and 40, and Examples 20 and 43 are the elements, respectively, including the same photoelectric conversion layer.

Thus, when the conversion efficiency ($\eta$) of the photoelectric conversion element having an EQE peak on a long wavelength side is higher than that of the photoelectric conversion element having an EQE peak on a short wavelength side in the elements each including the photoelectric conversion layer capable of being made of each one of a p-type organic semiconductor and an n-type organic semiconductor among the first, second, and third organic semiconductors, the photoelectric conversion element having high sensitivity is obtained. In addition, a dark current is also reduced. With this, the photoelectric conversion element having a high S/N ratio is obtained.

Meanwhile, as the case in which the conversion efficiency of the element having an EQE peak on a short wavelength side is higher than that of the element having an EQE peak on a long wavelength side, there is given the following.

In Table 13, an EQE peak wavelength of each photoelectric conversion element made of a combination of a pair of a p-type semiconductor and an n-type semiconductor and conversion efficiency ($\eta$) thereof are shown. The EQE peak wavelength and the conversion efficiency are shown as characteristics of the binary element configuration made of a combination of a p-type semiconductor and an n-type semiconductor contained as components in the photoelectric conversion layer having a ternary configuration. The EQE peak wavelength was obtained by determining a photocurrent through measurement of a current at a time of irradiation of light having each wavelength and at a time of non-irradiation of light through use of a spectral sensitivity light source and a semiconductor parameter analyzer ("4155C" manufactured by Agilent Technologies, Inc.) with respect to the photoelectric conversion element arranged in a dark place. The photocurrent was converted into the number of electrons, and the number of electrons was divided by the number of incident photons to obtain EQE. With this, the EQE at each wavelength was measured to acquire spectral sensitivity characteristics and determine a sensitivity peak wavelength on a longest wavelength side. In addition, as an indicator of excitation energy of each material, a bandgap was also shown. The bandgap was calculated by absorption spectrum measurement of a thin film formed by vacuum deposition with each 100% film being a film thickness of about 100 nm.

The conversion efficiency of the photoelectric conversion layer can be estimated based on the conversion efficiency ($\eta$) of the photoelectric conversion element including the photoelectric conversion layer.

TABLE 13

| First organic semiconductor | | | Second organic semiconductor | | | EQE peak | |
| --- | --- | --- | --- | --- | --- | --- | --- |
| Compound | Mass % | Bandgap (eV) | Compound | Mass % | Bandgap (eV) | wavelength (nm) | Conversion efficiency $\eta$ |
| Compound 2 | 75 | 1.61 | Compound 3 | 25 | 1.93 | 560 | B |
| Compound 2 | 75 | 1.61 | Compound 4 | 25 | 1.98 | 550 | A |
| Compound 2 | 75 | 1.61 | Compound 5 | 25 | 2.01 | 563 | B |
| Compound 2 | 75 | 1.61 | Compound 6 | 25 | 2.04 | 540 | A |
| Compound 2 | 75 | 1.61 | Compound 7 | 25 | 2.02 | 545 | A |
| Compound 2 | 75 | 1.61 | Compound 8 | 25 | 1.91 | 575 | A |
| Compound 2 | 75 | 1.61 | Compound 9 | 25 | 1.99 | 575 | B |
| Compound 2 | 75 | 1.61 | Compound 10 | 25 | 1.94 | 570 | A |

The conversion efficiency ($\eta$) in Table 13 was evaluated as conversion efficiency of a binary element at a drive voltage of 5 V as described below.

A: $\eta \geq 80\%$

B: $\eta < 80\%$

In the above-mentioned photoelectric conversion element configuration, the content of the second organic semiconductor is set to 25 mass %, which serves as an indicator for comparing each combination. The content of the second organic semiconductor is not limited to 25 mass % in order to evaluate the conversion efficiency ($\eta$). For example, the inventors of the present invention have confirmed that the above-mentioned conversion efficiency ($\eta$) is substantially constant when the content of the second organic semiconductor is from about 15 mass % to about 50 mass %, and it is only required that the maximum conversion efficiency value be determined based on such content range.

Next, an energy difference ($|\Delta Eg|$) determined based on a difference in EQE peak wavelength of a binary configuration element using organic semiconductors included in materials forming a ternary element and results obtained by evaluation through use of an increase ratio of conversion efficiency at 550 nm in the ternary element as an indicator are shown. The "increase ratio of conversion efficiency at 550 nm" in Table 14 serving as an indicator of an effect is a value obtained by dividing the conversion efficiency of the ternary element of the present invention by the conversion efficiency in a combination of a p-type semiconductor and an n-type semiconductor capable of forming a binary element. OSC shown in the table is an abbreviation of organic semiconductor, and described for convenience so as to be simplified in the table. The reason why the contents of the second and third organic semiconductors are set to be as close as possible is to determine an effect.

TABLE 14

| | Composition of photoelectric conversion layer | | | | | | | |
|---|---|---|---|---|---|---|---|---|
| | First organic semiconductor [OSC1] | | Second organic semiconductor [OSC2] | | Third organic semiconductor [OSC3] | | Concentration ratio | Relative dark current |
| | Compound | Mass % | Compound | Mass % | Compound | Mass % | (third/second) | (ternary/binary) |
| Comparative Example 23 | 2 | 82.5 | 6 | 17.5 | — | — | — | — |
| Comparative Example 24 | 2 | 65.5 | 6 | 17.5 | 10 | 17 | 0.97 | 0.35 |
| Comparative Example 25 | 2 | 65.5 | 6 | 17.5 | 3 | 17 | 0.97 | 0.45 |
| Comparative Example 26 | 2 | 82.5 | 4 | 17.5 | — | — | — | — |
| Example 51 | 2 | 65.5 | 4 | 17.5 | 5 | 17 | 0.97 | 0.15 |
| Example 52 | 2 | 65.5 | 4 | 17.5 | 3 | 17 | 0.97 | 0.2 |
| Comparative Example 27 | 2 | 82.5 | 10 | 17.5 | — | — | — | — |
| Example 53 | 2 | 65.5 | 10 | 17.5 | 9 | 17 | 0.97 | 0.3 |
| Comparative Example 28 | 2 | 82.5 | 9 | 17.5 | — | — | — | — |
| Example 54 | 2 | 65.5 | 9 | 17.5 | 10 | 17 | 0.97 | 0.4 |
| Comparative Example 29 | 2 | 82.5 | 8 | 17.5 | — | — | — | — |
| Example 55 | 2 | 65.5 | 8 | 17.5 | 9 | 17 | 0.97 | 0.24 |

| | Characteristics of binary element that can be configured | | | | Characteristics of ternary element Increase ratio of conversion efficiency at 550 nm |
|---|---|---|---|---|---|
| | Combination | EQE peak wavelength (nm) | Combination with low conversion efficiency | $|\Delta Eg|$ (eV) | |
| Comparative Example 23 | OSC1 + OSC2 | 540 | — | — | — |
| Comparative Example 24 | OSC1 + OSC2 | 540 | — | 0.12 | |
| | OSC1 + OSC3 | 570 | ○ | | 100% |
| Comparative Example 25 | OSC1 + OSC2 | 545 | — | 0.061 | — |
| | OSC1 + OSC3 | 560 | ○ | | 101% |
| Comparative Example 26 | OSC1 + OSC2 | 550 | — | — | — |
| Example 51 | OSC1 + OSC2 | 550 | — | 0.052 | |
| | OSC1 + OSC3 | 563 | ○ | | 102% |
| Example 52 | OSC1 + OSC2 | 550 | — | 0.04 | — |
| | OSC1 + OSC3 | 560 | ○ | | 105% |
| Comparative Example 27 | OSC1 + OSC2 | 570 | — | — | — |
| Example 53 | OSC1 + OSC2 | 570 | — | 0.019 | |
| | OSC1 + OSC3 | 575 | ○ | | 108% |
| Comparative Example 28 | OSC1 + OSC2 | 575 | — | — | — |
| Example 54 | OSC1 + OSC2 | 575 | ○ | 0.019 | — |
| | OSC1 + OSC3 | 570 | — | | 109% |
| Comparative Example 29 | OSC1 + OSC2 | 575 | — | — | — |
| Example 55 | OSC1 + OSC2 | 575 | — | 0 | — |
| | OSC1 + OSC3 | 575 | ○ | | 110% |

In Table 14, Comparative Example 23 and Comparative Examples 24 and 25 have a relationship of a binary configuration and a ternary configuration. As similar relationships, Examples 51 and 52 correspond to Comparative Example 26, Example 53 corresponds to Comparative Example 27, Example 54 corresponds to Comparative Example 28, and Example 55 corresponds to Comparative Example 29. From the results of Table 14, as $|\Delta Eg|$ of the binary element that can be configured is closer to 0, the increase ratio of the conversion efficiency tends to be higher. The data on the binary element that can be configured is based on the contents shown in Table 4.

Figure 12:
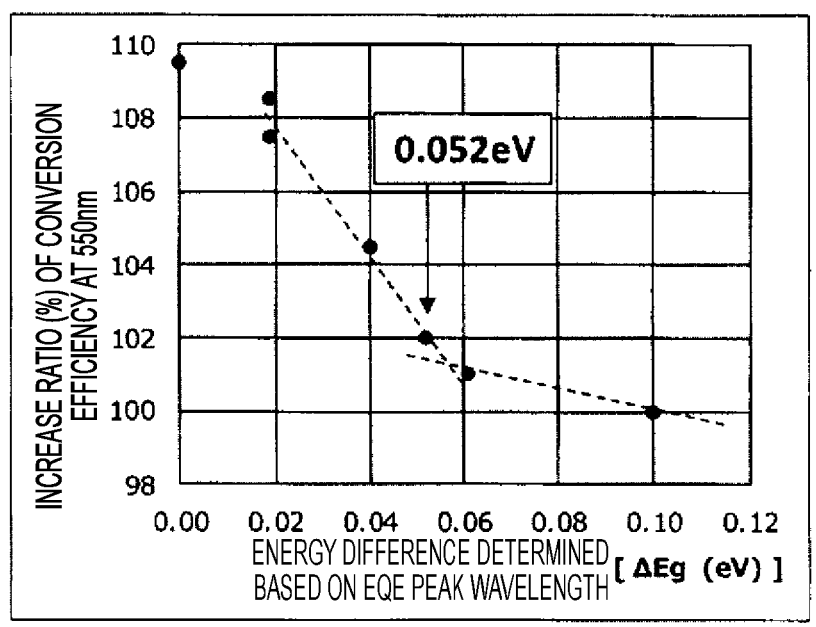
FIG. 12 is a graph for plotting an increase ratio of conversion efficiency of each of the photoelectric conversion elements in Examples of this description with respect to ΔEg.

A relationship between $|\Delta Eg|$ and the increase ratio of the conversion efficiency at 550 nm in Table 14 is shown in FIG. 12. As shown in FIG. 12, there was a folding point in the vicinity of 0.052 eV. In this case, it was determined that the increase ratio of the conversion efficiency was 102% or more in this evaluation in consideration of the accuracy of the EQE measurement. As a result, it was revealed that it was preferred that $|\Delta Eg|$ be 0.052 eV or less. This result shows that, in the case of a barrier of about 0.052 eV or less, excitons alleviated to a low energy level can be subjected to charge separation with high efficiency through use of another combination of a p-type semiconductor and an n-type semiconductor. Regarding the increase ratio of the conversion efficiency, as the difference between the conversion efficiency $\eta_1$ and the conversion efficiency $\eta_2$ of the binary element 1 and the binary element 2 to be combined is larger, the effect is inevitably larger. In these Examples, any of the binary elements were selected so as to have a difference between $\eta_1$ and $\eta_2$ of 10% or more. However, in the present invention, the binary elements are not limited to those having the above-mentioned difference of 10% or more, and as described above, the relationship between energy levels of a p-type semiconductor and an n-type semiconductor forming the binary element 1 and the binary element 2 is important.

Next, the preferred contents of the first organic semiconductor, the second organic semiconductor, and third organic semiconductor were verified. In this verification, it was verified which of the concentration of the second organic semiconductor and the concentration of the third organic semiconductor was preferably higher.

second organic semiconductor is the compound 5 as in Examples 62 to 68, the conversion efficiency at 550 nm of the ternary element is increased, but the effect thereof is not large. Thus, it was revealed that the first and second organic semiconductors were preferred as a combination having high conversion efficiency. In addition, although not described, in any of the combinations in Tables 14 and 15, the dark current reduction effect in the ternary element was observed.

(Calculation Results of Solubility Parameter)

When the second organic semiconductor and the third organic semiconductor are likely to be mixed selectively, the phenomenon, in which the energy spread of each state density of the HOMO level and the LUMO level is formed through association of the second organic semiconductors, is suppressed. Calculation was performed with respect to some of the organic semiconductors in Examples to verify whether the above-mentioned relationship was obtained. In

TABLE 15

| | Composition of photoelectric conversion layer | | | | | | Characteristics of binary element that can be configured | | | Characteristics of ternary element |
|---|---|---|---|---|---|---|---|---|---|---|
| | First organic semiconductor [OSC1] | | Second organic semiconductor [OSC2] | | Third organic semiconductor [OSC3] | | | EQE peak wavelength (nm) | Combination with low conversion efficiency | $|\Delta Eg|$ (eV) | Increase ratio of conversion efficiency at 550 nm |
| | Compound | Mass % | Compound | Mass % | Compound | Mass % | Combination | | | | |
| Example 51 | 2 | 65.5 | 4 | 17.5 | 5 | 17 | OSC1 + OSC2 | 550 | — | 0.052 | — |
| | | | | | | | OSC1 + OSC3 | 563 | ○ | | 102% |
| Example 56 | 2 | 70.5 | 4 | 17.5 | 5 | 12 | OSC1 + OSC2 | 550 | — | | — |
| | | | | | | | OSC1 + OSC3 | 563 | ○ | | 104% |
| Example 57 | 2 | 75.5 | 4 | 17.5 | 5 | 7 | OSC1 + OSC2 | 550 | — | | — |
| | | | | | | | OSC1 + OSC3 | 563 | ○ | | 106% |
| Example 58 | 2 | 77.5 | 4 | 17.5 | 5 | 5 | OSC1 + OSC2 | 550 | — | | — |
| | | | | | | | OSC1 + OSC3 | 563 | ○ | | 106% |
| Example 59 | 2 | 83 | 4 | 12 | 5 | 5 | OSC1 + OSC2 | 550 | — | | — |
| | | | | | | | OSC1 + OSC3 | 563 | ○ | | 106% |
| Example 60 | 2 | 85 | 4 | 10 | 5 | 5 | OSC1 + OSC2 | 550 | — | | — |
| | | | | | | | OSC1 + OSC3 | 563 | ○ | | 106% |
| Example 61 | 2 | 91 | 4 | 6 | 5 | 3 | OSC1 + OSC2 | 550 | — | | — |
| | | | | | | | OSC1 + OSC3 | 563 | ○ | | 106% |
| Example 62 | 2 | 70.5 | 5 | 17.5 | 4 | 12 | OSC1 + OSC2 | 563 | ○ | | 102% |
| | | | | | | | OSC1 + OSC3 | 550 | — | | — |
| Example 63 | 2 | 75.5 | 5 | 17.5 | 4 | 7 | OSC1 + OSC2 | 563 | ○ | | 102% |
| | | | | | | | OSC1 + OSC3 | 550 | — | | — |
| Example 64 | 2 | 77.5 | 5 | 17.5 | 4 | 5 | OSC1 + OSC2 | 563 | ○ | | 102% |
| | | | | | | | OSC1 + OSC3 | 550 | — | | — |
| Example 65 | 2 | 73 | 5 | 15 | 4 | 12 | OSC1 + OSC2 | 563 | ○ | | 102% |
| | | | | | | | OSC1 + OSC3 | 550 | — | | — |
| Example 66 | 2 | 81 | 5 | 12 | 4 | 7 | OSC1 + OSC2 | 563 | ○ | | 102% |
| | | | | | | | OSC1 + OSC3 | 550 | — | | — |
| Example 67 | 2 | 85 | 5 | 10 | 4 | 5 | OSC1 + OSC2 | 563 | ○ | | 102% |
| | | | | | | | OSC1 + OSC3 | 550 | — | | — |
| Example 68 | 2 | 91 | 5 | 6 | 4 | 3 | OSC1 + OSC2 | 563 | ○ | | 102% |
| | | | | | | | OSC1 + OSC3 | 550 | — | | — |

It is understood from Table 15 that, when the second organic semiconductor is the compound 4 as in Examples 51 and 56 to 61, the conversion efficiency is high in the ternary element. This is ascribed to the following. As the content of the organic semiconductor forming the binary element 1 having high conversion efficiency is higher, the ratio of direct photoelectric conversion is increased, and the ratio in which the probability for accepting energy from the organic semiconductor forming the binary element 2 to cause charge separation is increased is increased. Meanwhile, when the the following table, the relationship of SP values of the respective organic semiconductors is shown. The compound 2 that is the first organic semiconductor is C60, and hence, in the SP values, the values described in R. S. Ruoff, Doris S. Tse, Ripudaman Malhotra, and Donald C. Lorents, J. Phys. Chem. 1993, 97, p. 3379-3383 were used. The SP values of the second organic semiconductor and the third organic semiconductor were determined by calculation based on R. F. Fedors, Eng. Sci., 1974, 14(2), p. 147-154.

TABLE 16

| Verification example | First organic semiconductor | SP1 | Second organic semiconductor | SP2 | Third organic semiconductor | SP3 | \|SP1 − SP2\| | \|SP1 − SP3\| | \|SP2 − SP3\| | Corresponding Example |
|---|---|---|---|---|---|---|---|---|---|---|
| A | Compound 2 | 20.0 | Compound 14 | 24.9 | Compound 6 | 23.3 | 4.9 | 3.3 | 1.6 | 42 |
| B | Compound 2 | 20.0 | Compound 6 | 23.3 | Compound 14 | 24.9 | 3.3 | 4.9 | 1.6 | 41 |
| C | Compound 2 | 20.0 | Compound 13 | 23.6 | Compound 14 | 24.9 | 3.6 | 4.9 | 1.3 | 20 to 22 and 43 |
| D | Compound 2 | 20.0 | Compound 14 | 24.9 | Compound 13 | 23.6 | 4.9 | 3.6 | 1.3 | 44 |
| E | Compound 2 | 20.0 | Compound 3 | 25.3 | Compound 6 | 23.3 | 5.3 | 3.3 | 2.0 | 9 |
| F | Compound 2 | 20.0 | Compound 3 | 25.3 | Compound 4 | 25.2 | 5.3 | 5.2 | 0.1 | 1 to 7, 14, and 15 |
| G | Compound 2 | 20.0 | Compound 3 | 25.3 | Compound 5 | 26.2 | 5.3 | 6.2 | 0.9 | 8 |
| H | Compound 2 | 20.0 | Compound 14 | 24.9 | Compound 15 | 26.0 | 4.9 | 6.0 | 1.1 | 46 |
| I | Compound 2 | 20.0 | Compound 15 | 26.0 | Compound 14 | 24.9 | 6 | 4.9 | 1.1 | 45 |
| J | Compound 2 | 20.0 | Compound 17 | 23.2 | Compound 4 | 25.2 | 3.2 | 5.2 | 2.0 | 36 |
| K | Compound 2 | 20.0 | Compound 4 | 25.2 | Compound 17 | 23.2 | 5.2 | 3.2 | 2.0 | 37 |

The same element was manufactured except that the compound 6 contained in the verification example E of Table 13 was replaced by dimethylanthracene (SP3=20.2). When a dark current of the element was evaluated, a relative dark current (ternary/binary) was about 0.9, and a decrease in dark current was confirmed. However, a decrease amount of the dark current was small as compared to those of the other elements.

As described above, in the photoelectric conversion element having the ternary configuration according to the present invention, when the mass of the third organic semiconductor is set to 3 mass % or more, low dark current characteristics are obtained.

As described above, the organic photoelectric conversion element of the present invention is the element excellent in characteristics such as a low dark current. Thus, in an optical area sensor, an image pickup element, and an image pickup apparatus using the organic photoelectric conversion element of the present invention, dark current noise derived from the photoelectric conversion element can be reduced.

According to the present invention, the photoelectric conversion element capable of performing photoelectric conversion with a low dark current can be provided by configuring the photoelectric conversion layer through use of three kinds of low-molecular weight organic semiconductors.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion element comprising in this order:
    an anode;
    a photoelectric conversion layer; and
    a cathode,
    the photoelectric conversion layer containing a first organic semiconductor, a second organic semiconductor, and a third organic semiconductor,
    wherein the first organic semiconductor, the second organic semiconductor, and the third organic semiconductor each comprise a low-molecular weight organic semiconductor,
    wherein one of the first organic semiconductor and the second organic semiconductor is a p-type semiconductor, and another is a n-type semiconductor,
    wherein the first organic semiconductor, the second organic semiconductor, and the third organic semiconductor have mass ratios that satisfy the following relationship:
    the first organic semiconductor≥the second organic semiconductor≥the third organic semiconductor, and
    wherein, when a total amount of the first organic semiconductor, the second organic semiconductor, and the third organic semiconductor is 100 mass %, a content of the second organic semiconductor is 6 mass % or more, and a content of the third organic semiconductor is 3 mass % or more, and
    wherein, when a solubility parameter of the first organic semiconductor is represented by SP1, a solubility parameter of the second organic semiconductor is represented by SP2, and a solubility parameter of the third organic semiconductor is represented by SP3, the SP1, the SP2, and the SP3 satisfy the following expression (2) and expression (3)

$$|SP1-SP2|>|SP2-SP3| \tag{2}$$

$$|SP1-SP3|>|SP2-SP3| \tag{3}.$$

2. The photoelectric conversion element according to claim 1, wherein a ratio of a mass ratio of the third organic semiconductor with respect to a mass ratio of the second organic semiconductor is 0.12 or more.

3. The photoelectric conversion element according to claim 1, wherein, when the total amount of the first organic semiconductor, the second organic semiconductor, and the third organic semiconductor is 100 mass %, the content of the second organic semiconductor is 10 mass % or more.

4. The photoelectric conversion element according to claim 1, wherein the first organic semiconductor comprises the n-type semiconductor, and the second organic semiconductor comprises the p-type semiconductor.

5. The photoelectric conversion element according to claim 4, wherein the third organic semiconductor comprises the p-type semiconductor.

6. The photoelectric conversion element according to claim 1, wherein the SP1, the SP2, and the SP3 satisfy the following expression (4) to expression (6)

$$|SP1-SP2|≥2.5 \tag{4}$$

$$|SP1-SP3|≥2.5 \tag{5}$$

$$|SP2-SP3|≤2.5 \tag{6}.$$

7. The photoelectric conversion element according to claim 1, wherein the SP2 and the SP3 satisfy the following expression (7)

$$|SP2-SP3|≤1.0 \tag{7}.$$

8. The photoelectric conversion element according to claim 4, wherein, when an oxidation potential of the second organic semiconductor is represented by Eox2, an oxidation potential of the third organic semiconductor is represented by Eox3, a reduction potential of the first organic semiconductor is represented by Ered1, and a reduction potential of the third organic semiconductor is represented by Ered3, a relationship of each of the potentials satisfies the following expression (11) and expression (12)

$$Eox2 \leq Eox3 \quad (11)$$

$$Ered1 \geq Ered3 \quad (12).$$

9. The photoelectric conversion element according to claim 1, wherein, among the first organic semiconductor, the second organic semiconductor, and the third organic semiconductor, the organic semiconductor comprising the p-type semiconductor comprises any one of compounds represented by the following general formulae [1] to [5], a quinacridone derivative, and a 3H-phenoxazin-3-one derivative:

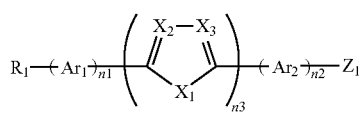

[1]

in the general formula [1]:
$R_1$ represents a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, or a cyano group;
"$n_1$", "$n_2$", and "$n_3$" each independently represent an integer of from 0 to 4;
$X_1$ to $X_3$ each represent any one of a nitrogen atom, a sulfur atom, an oxygen atom, and a carbon atom that may have a substituent;
$Ar_1$ and $Ar_2$ are each independently selected from a substituted or unsubstituted aryl group or a substituted or unsubstituted heterocyclic group, when $Ar_1$ and $Ar_2$ are present in a plural number, each of $Ar_1$ and $Ar_2$ may be identical or different, and when $X_2$ or $X_3$ represents a carbon atom, $Ar_1$ and $Ar_2$ may be bonded to each other to form a ring; and
$Z_1$ represents any one of a halogen atom, a cyano group, a vinyl group substituted with a cyano group, a substituted or unsubstituted heteroaryl group, or substituents represented by the following general formulae [1-1] to [1-9]:

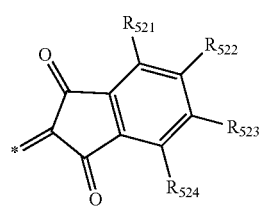

[1-1]

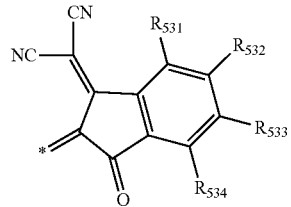

[1-2]

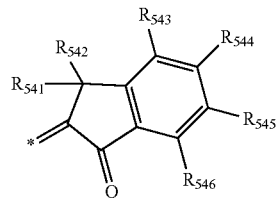

[1-3]

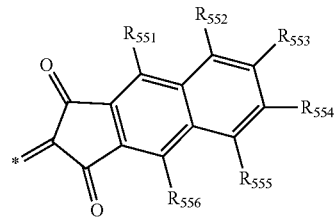

[1-4]

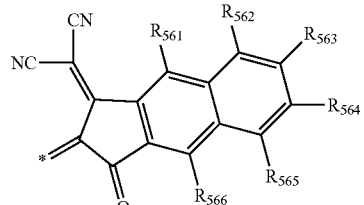

[1-5]

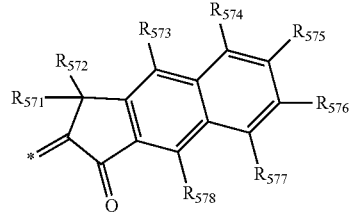

[1-6]

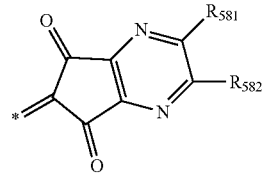

[1-7]

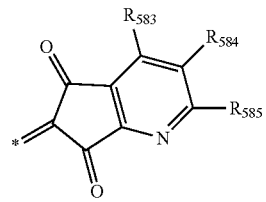

[1-8]

-continued

[1-9]

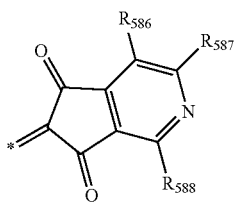

in the general formulae [1-1] to [1-9], $R_{521}$ to $R_{588}$ are each independently selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group, and a symbol "*" represents a bonding position with respect to a carbon atom;

[2]

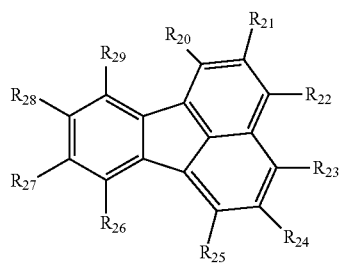

in the general formula [2], $R_{20}$ to $R_{29}$ are each independently selected from a hydrogen atom, a halogen atom, a substituted or unsubstituted alkyl group, a substituted or unsubstituted alkoxy group, a substituted or unsubstituted aryl group, a substituted or unsubstituted heterocyclic group, a substituted or unsubstituted vinyl group, a substituted or unsubstituted amino group, and a cyano group, and among $R_{20}$ to $R_{29}$, two adjacent groups may be bonded to each other to form a ring;

[3]
[4]
[5]

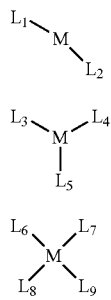

in the general formulae [3] to [5]:
M represents a metal atom, and the metal atom may have an oxygen atom or a halogen atom as a substituent; and $L_1$ to $L_9$ each represent a ligand that is coordinated with the metal M, and are each formed of a substituted or unsubstituted aryl group or a substituted or unsubstituted heterocyclic group, and among $L_1$ to $L_9$, two adjacent ligands may be bonded to each other to form a ring.

10. The photoelectric conversion element according to claim 1, wherein, of the first organic semiconductor and the second organic semiconductor, the organic semiconductor comprising the n-type semiconductor comprises a fullerene or a fullerene derivative.

11. The photoelectric conversion element according to claim 10, wherein the fullerene derivative comprises fullerene C60.

12. The photoelectric conversion element according to claim 1, wherein the first organic semiconductor, the second organic semiconductor, and the third organic semiconductor satisfy the following condition:
when two different photoelectric conversion layers are formed through use of only the first organic semiconductor, the second organic semiconductor, and the third organic semiconductor,
of the two different photoelectric conversion layers, the photoelectric conversion layer having an EQE peak on a long wavelength side has conversion efficiency equal to or larger than conversion efficiency of the photoelectric conversion layer having an EQE peak on a short wavelength side of the two different photoelectric conversion layers.

13. The photoelectric conversion element according to claim 1, wherein the first organic semiconductor, the second organic semiconductor, and the third organic semiconductor satisfy the following condition:
when two different photoelectric conversion layers are formed through use of only the first organic semiconductor, the second organic semiconductor, and the third organic semiconductor, the following expression (8) and expression (9) are satisfied:

$$\eta_1 > \eta_2 \quad (8)$$

$$|\Delta Eg| \leq 0.052 \text{ eV} \quad (9)$$

where $\eta_1$ represents conversion efficiency of an element having an EQE peak on a long wavelength side, $\eta_2$ represents conversion efficiency of an element having an EQE peak on a short wavelength side, and conversion efficiency of the photoelectric conversion element containing the first organic semiconductor to the third organic semiconductor is represented by $\eta_3$; and where $\Delta Eg$ represents an energy difference determined based on an EQE peak wavelength difference of a binary element including the photoelectric conversion layer made of each one of p-type and n-type organic semiconductors among the first organic semiconductor, the second organic semiconductor, and the third organic semiconductor.

14. An optical area sensor comprising a plurality of pixels each including a photoelectric conversion element, the plurality of pixels being arranged two-dimensionally,
wherein the photoelectric conversion element comprises the photoelectric conversion element of claim 1.

15. An image pickup element comprising:
a plurality of pixels each including a photoelectric conversion element and a reading circuit connected to the photoelectric conversion element; and
a signal processing circuit connected to the pixels,
wherein the photoelectric conversion element comprises the photoelectric conversion element of claim 1.

* * * * *